(12) United States Patent
Youtsey et al.

(10) Patent No.: US 10,522,363 B2
(45) Date of Patent: Dec. 31, 2019

(54) SYSTEMS AND METHODS FOR PERFORATION AND OHMIC CONTACT FORMATION FOR GAN EPITAXIAL LIFT-OFF USING AN ETCH STOP LAYER

(71) Applicant: MICROLINK DEVICES, INC., Niles, IL (US)

(72) Inventors: Christopher Youtsey, Libertyville, IL (US); Robert McCarthy, Chicago, IL (US); Rekha Reddy, Chicago, IL (US)

(73) Assignee: MICROLINK DEVICES, INC., Niles, IL (US)

(*) Notice: Subject to any disclaimer, the term of this patent is extended or adjusted under 35 U.S.C. 154(b) by 0 days.

(21) Appl. No.: 16/044,479

(22) Filed: Jul. 24, 2018

(65) Prior Publication Data

US 2019/0088495 A1 Mar. 21, 2019

Related U.S. Application Data

(60) Provisional application No. 62/536,224, filed on Jul. 24, 2017.

(51) Int. Cl.

| | |
|---|---|
| *H01L 21/306* | (2006.01) |
| *H01L 21/78* | (2006.01) |
| *H01L 21/3063* | (2006.01) |
| *H01L 33/00* | (2010.01) |
| *H01L 21/02* | (2006.01) |
| *H01L 31/0236* | (2006.01) |
| *H01L 21/67* | (2006.01) |

(Continued)

(52) U.S. Cl.
CPC .... *H01L 21/30612* (2013.01); *H01L 21/0254* (2013.01); *H01L 21/02389* (2013.01); *H01L 21/02458* (2013.01); *H01L 21/02664* (2013.01); *H01L 21/30635* (2013.01); *H01L 21/67075* (2013.01); *H01L 21/67086* (2013.01); *H01L 21/78* (2013.01); *H01L 21/7813* (2013.01); *H01L 29/2003* (2013.01); *H01L 31/02363* (2013.01); *H01L 33/0075* (2013.01); *H01L 33/22* (2013.01)

(58) Field of Classification Search
CPC combination set(s) only.
See application file for complete search history.

(56) References Cited

U.S. PATENT DOCUMENTS

| | | |
|---|---|---|
| 5,773,369 A | 6/1998 | Hu et al. |
| 9,666,677 B1 | 5/2017 | Raring et al. |

(Continued)

OTHER PUBLICATIONS

Bardwell, et al., A Simple Wet Etch for GaN. J Electron Mater. Oct. 28, 1999(10):L24-L26.

(Continued)

*Primary Examiner* — Mamadou L Diallo
(74) *Attorney, Agent, or Firm* — McCarter & English, LLP; David R. Burns

(57) ABSTRACT

Methods and systems for forming a device structure free of a substrate are described. Exemplary embodiments include a device structure comprising of device layers, a release layer, an etch stop layer, and a substrate. The device structure is exposed to photoenhanced wet etch environments to vertically and laterally etch the release layer to separate the device layers from the substrate. The device structure can include a contact layer, an etch stop layer, or both in some embodiments.

30 Claims, 40 Drawing Sheets

(51) Int. Cl.
 H01L 29/20 (2006.01)
 H01L 33/22 (2010.01)

(56) References Cited

U.S. PATENT DOCUMENTS

| | | | |
|---|---|---|---|
| 2003/0045120 A1 | 3/2003 | Hu et al. | |
| 2005/0252282 A1 | 11/2005 | Chand et al. | |
| 2006/0202223 A1 | 9/2006 | Sackrison et al. | |
| 2010/0078672 A1 | 4/2010 | Moriyama et al. | |
| 2011/0294281 A1* | 12/2011 | Zang | H01L 21/0237 438/478 |
| 2013/0011656 A1* | 1/2013 | Zhang | C30B 29/406 428/312.8 |
| 2014/0003458 A1* | 1/2014 | Han | H01L 21/30612 372/45.01 |
| 2016/0053984 A1 | 2/2016 | Callaghan et al. | |
| 2016/0307924 A1 | 10/2016 | Forrest et al. | |
| 2017/0133362 A1* | 5/2017 | Barlow | H01L 29/66681 |
| 2017/0317228 A1 | 11/2017 | Sung | |
| 2019/0088494 A1* | 3/2019 | Youtsey | H01L 21/0254 |

OTHER PUBLICATIONS

Buttari et al., Selective Dry Etching of GaN Over AlGaN in BCL3/SF6 Mixtures. International Journal of High Speed Electronics and Systems. Sep. 14, 2004(3)756-761.

Holz et al., High-Power 365 nm UV LED Mercury Arc Lamp Replacement for Photochemistry and Chemical Photolithography. ACS Sustain Chem Eng. Oct. 25, 2016;5(1):828-834.

Hsieh et al., Sacrificial Structure for Effective Sapphire Substrate Liftoff Based on Photoelectrochemical Etching. IEEE Photonics Technology Letters. Apr. 1, 2015;27(7):770-773.

Stonas et al., Development of gallium nitride-based MEMS structures. Transducers '03. 12th International Conference on Solid-State Sensors, Actuators and Microsystems. Digest of Technical Papers. pp. 1156-1159, Jun. 8, 2003.

Wang et al., Demonstration of thin-film GaN Schottky diodes fabricated with epitaxial lift-off. 2016 74th Annual Device Research Conference (DRC). pp. 181-182, Jun. 19-22, 2016.

Yang, Micromachining of GaN Using Photoelectrochemical Etching. A Dissertation Submitted to the Graduate School of the University of Notre Dame in Partial Fulfillment of the Requirements for the Degree of Doctor of Philosophy. 168 pages, Apr. 2005.

Youtsey et al., Dopant-Selective Photoenhanced Wet Etching of GaN. Journal of Electronic Materials. Apr. 27, 1998 (4):282-287.

Youtsey et al., Highly anisotropic photoenhanced wet etching of n-type GaN. Applied Physics Letters. Oct. 13, 1997;71(15):2151-3.

Youtsey et al., Rapid evaluation of dislocation densities in n-type GaN films using photoenhanced wet etching. Applied Physics Letters. Jun. 7, 1999;74(23):3537-9.

Youtsey et al., Wafer-scale epitaxial lift-off of GaN using bandgap-selective photoenhanced wet etching. Physica Status Solidi (b). Aug. 2017;254(8):1600774. 6 pages.

International Search Report and Written Opinion for Application No. PCT/US2018/043564, dated Jan. 11, 2019, 19 pages.

International Search Report and Written Opinion for Application No. PCT/US2018/043571, dated Jan. 11, 2019, 21 pages.

* cited by examiner

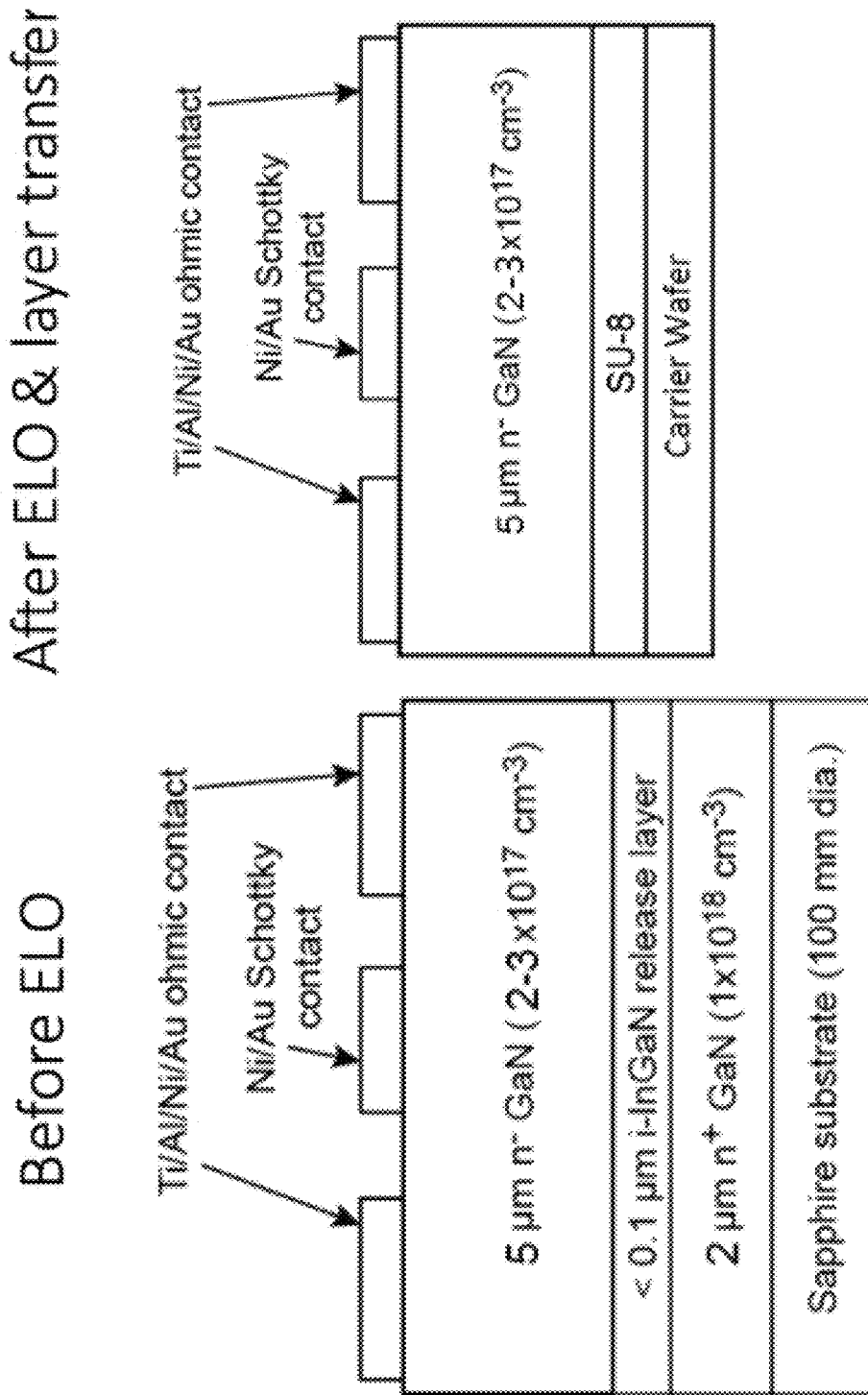

FIG. 39C
FIG. 39B
FIG. 39A
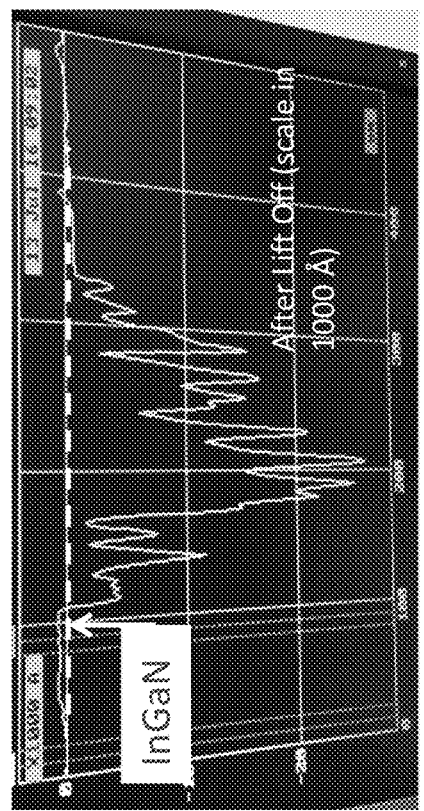
FIG. 39D

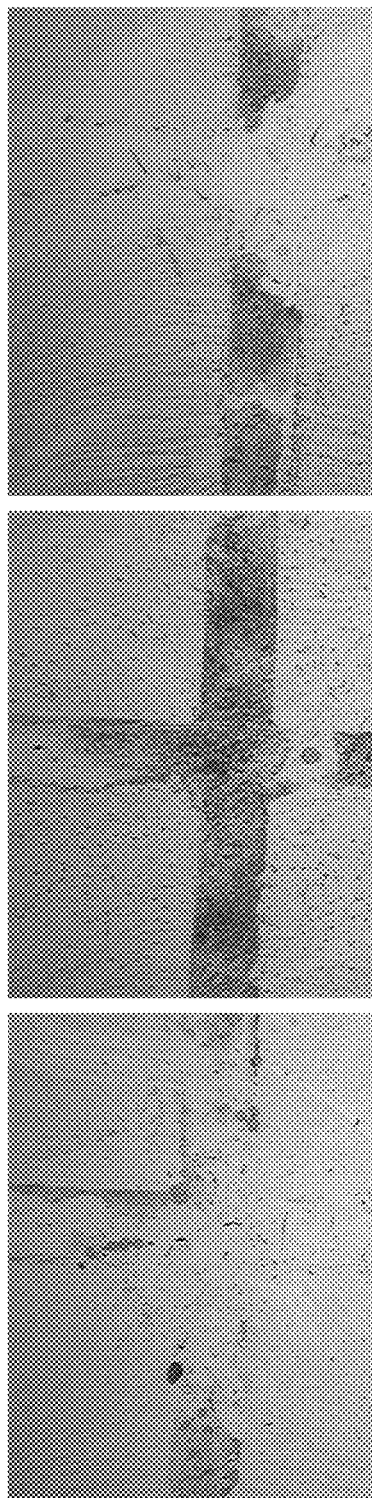
FIG. 40A
FIG. 40B
FIG. 40C
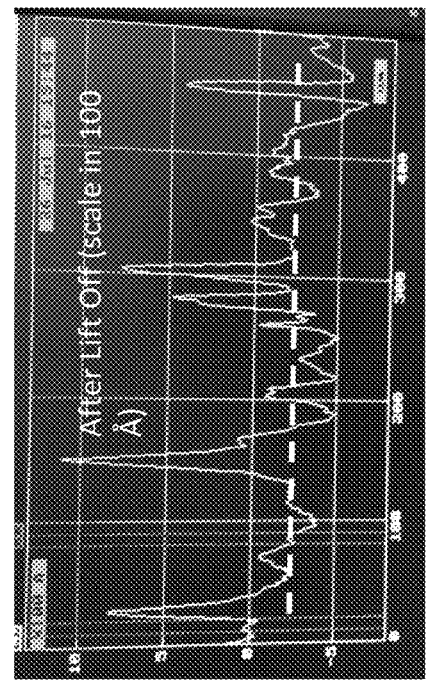
FIG. 40C
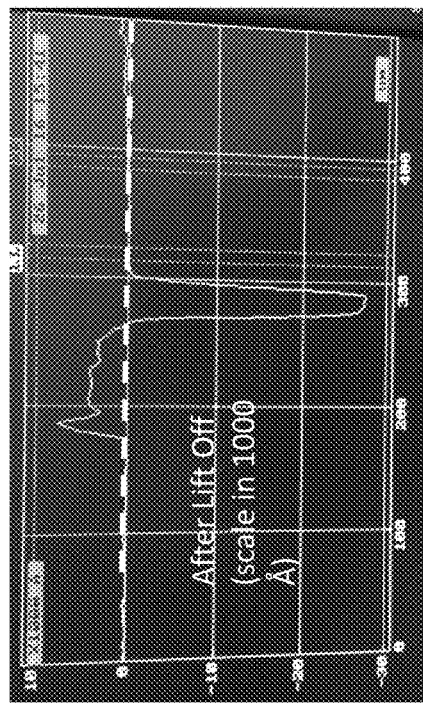
FIG. 40D
FIG. 40E

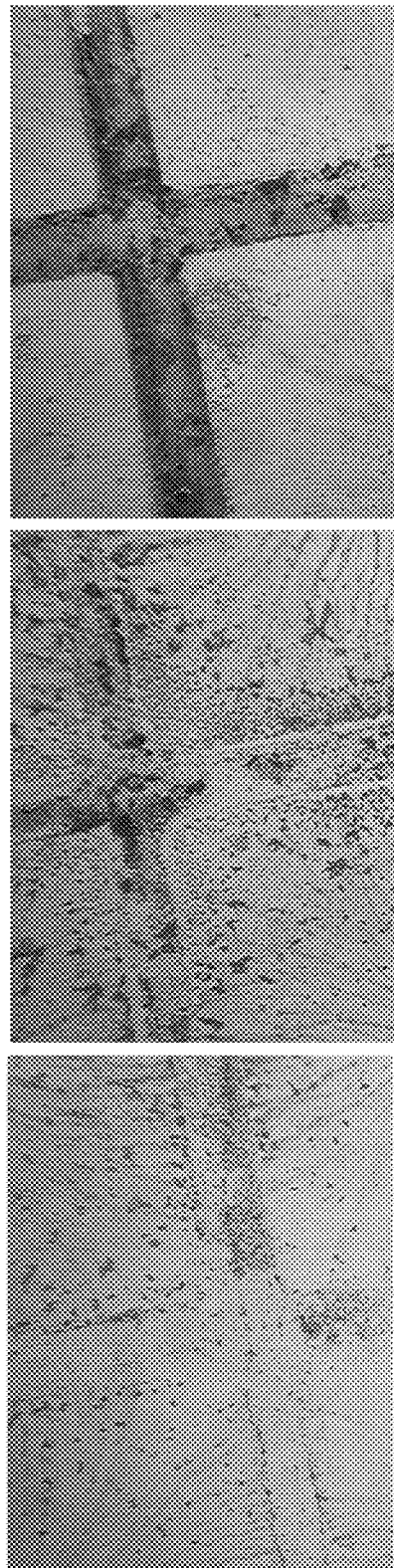
FIG. 41A
FIG. 41B
FIG. 41C
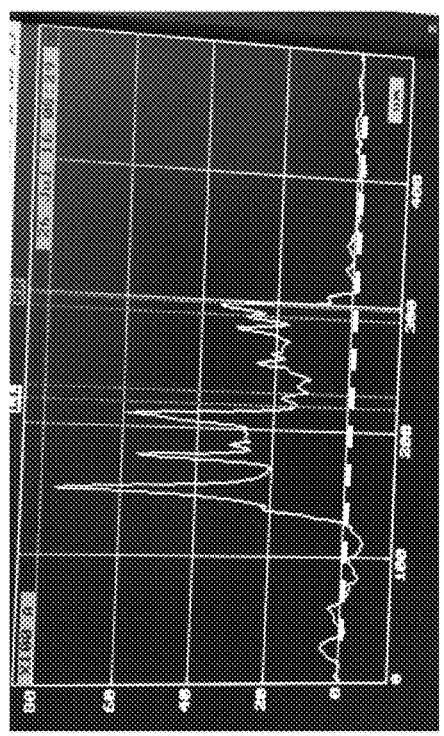
FIG. 41D
After Lift Off (scale in 100 Å). About 1 micron of GaN left on top in this case.

SYSTEMS AND METHODS FOR PERFORATION AND OHMIC CONTACT FORMATION FOR GAN EPITAXIAL LIFT-OFF USING AN ETCH STOP LAYER

RELATED APPLICATIONS

This application claims priority to U.S. Provisional Application No. 62/536,224, filed Jul. 24, 2017, the entire contents of which is incorporated herein by reference. This application is also related to a U.S. patent application titled "DEEP PHOTOENHANCED WET MATERIAL ETCHING USING HIGH-POWER ULTRAVIOLET LIGHT EMITTING DIODES," filed Jul. 24, 2018, by inventors Christopher Youtsey and Robert McCarthy with Applicant MicroLink Devices, Inc. 16044448, the entire contents of which is incorporated herein by reference.

STATEMENT OF GOVERNMENT INTEREST

This invention was made with government support under Contract No. DE-AR0000446 awarded by the United States Department of Energy's Advanced Research Projects Agency-Energy (ARPA-E). The government has certain rights in the invention.

BACKGROUND

Gallium nitride materials have enabled a diverse range of new device technologies spanning solid state lighting, short-wavelength lasers, and high-frequency/power electronics. It is one of many remarkable characteristics of GaN that light emitting diodes (LEDs) and high electron mobility transistors (HEMTs) can achieve excellent performance in spite of high defect densities, which are generally above $10^8$ cm$^{-2}$ on non-native substrates such as SiC, Si, and sapphire. Nonetheless, high material quality is clearly essential for devices such as blue laser diodes. New GaN device applications are emerging that will require low dislocation densities, including high-voltage p-n diodes and vertical junction field-effect transistors (VJFETs) for high-power switches as well as high-frequency III-N heterojunction bipolar transistors (HBTs). The performance of GaN LEDs and HEMTs can also be improved with the use of native GaN substrates.

Gallium nitride materials are difficult to wet etch using conventional wet etchants. Laser lift-off (LLO) is widely used to separate LED devices from sapphire substrates using a raster high-powered laser beam to vaporize the interface between GaN and sapphire. This process can, however, reduce yield due to cracking of the epitaxial material and is not presently compatible with native GaN substrates due to absorption of the laser wavelengths in the substrate.

SUMMARY

A method for forming a GaN-based device free of a substrate is provided. The method includes providing a substrate having a first surface and a second surface facing away from the first surface. The substrate comprises GaN or a layer comprising GaN is disposed on the first surface of the substrate. The method includes forming an etch stop layer over the first surface of the substrate. The etch stop layer has a first bandgap energy level. The method includes forming a release layer on the etch stop layer. The release layer has a second bandgap energy level lower than the first bandgap energy level. The method includes forming one or more device layers on the release layer to form the GaN-based device. The method includes forming a perforated support layer on one of the one or more device layers to form an outermost layer of a stackup. The method includes removing portions of the release layer and of the one or more device layers underlying perforations in the perforated support layer. The removing comprising exposing the substrate, the etch stop layer, the release layer, the one or more layers of the device and the perforated support layer to a photoenhanced vertical wet etch environment to vertically etch portions of the release layer and of at least one of the one or more device layers underlying the perforations in the support layer. The method includes exposing the substrate, the etch stop layer, the release layer, the one or more layers of the device and the perforated support layer to a photoenhanced lateral wet etch environment to laterally etch the release layer, the photoenhanced lateral wet etch environment impinging photons on the release layer having an energy level greater than or equal to that of the second bandgap energy level of the release layer and lower than that of the first bandgap energy level of the etch stop layer.

A method for forming a GaN-based device free of a substrate is provided. The method includes providing a device structure. The device structure includes a substrate having a first surface and a second surface facing away from the first surface. The substrate comprises GaN or a layer comprising GaN is disposed on the first surface of the substrate. The device structure includes an etch stop layer formed over the first surface of the substrate. The etch stop layer has a first bandgap energy level. The device structure includes a release layer formed on the etch stop layer. The release layer has a second bandgap energy level lower than the first bandgap energy level. The device structure includes one or more device layer formed on the release layer to form the GaN-based device. The device structure includes a perforated support layer formed on one of the one or more device layers forming an outermost layer of the structure. The method includes removing portions of the release layer and of the one or more device layers underlying perforations in the perforated support layer. The removing comprises exposing the device structure to a photoenhanced vertical etch environment to vertically etch portions of the release layer and of at least one of the one or more device layers underlying the perforations in the support layer. The method includes exposing the device structure to a photoenhanced lateral wet etch environment to laterally etch the release layer, the photoenhanced lateral wet etch environment impinging photons having an energy level greater than or equal to that of the second bandgap energy level of the release layer and lower than that of the first bandgap energy level of the etch stop layer, thereby removing the release layer from between the etch stop layer and the one or more device layers and separating the substrate from the one or more device layers and the perforated support layer.

A structure for forming a GaN-based device using epitaxial lift-off is provided. The structure includes a substrate having a first surface and a second surface facing away from the first surface. The substrate comprises GaN or a layer comprising GaN is disposed on the first surface of the substrate. The structure includes an etch stop layer formed over the first surface of the substrate. The etch stop layer has a first bandgap energy. The structure includes a release layer formed on the etch stop layer. The release layer has a second bandgap energy lower than the first bandgap energy. The structure includes one or more device layers formed over the release layer to form the GaN-based device. The structure includes a perforated support layer formed on one of the one or more device layers to form an outermost layer of the structure.

A method for fabricating a GaN-based III-nitride compound device free of a substrate is provided. The method includes forming a release layer on a first surface of a substrate. The substrate comprises GaN or a layer comprising GaN is disposed on the first surface of the substrate. The method includes forming a contact layer having a doping concentration of between $1\times10^{18}$ cm$^{-3}$ and $5\times10^{20}$ cm$^{-3}$ over the release layer. The method includes forming a device structure having one or more layers over the contact layer. The method includes etching the release layer to separate the contact layer and the device structure from the substrate.

A III-nitride compound material stack for forming a GaN-based device using epitaxial lift-off is provided. The III-nitride compound material stack includes a substrate having a first surface and a second surface facing away from the first surface. The substrate comprises GaN or a layer comprising GaN is disposed on the first surface of the substrate. The III-nitride compound material stack includes a release layer formed over the first surface of a substrate. The III-nitride compound material stack includes a contact layer formed over the release layer, the contact layer having a doping concentration of between $1\times10^{18}$ cm$^{-3}$ and $5\times10^{20}$ cm$^{-3}$. The III-nitride compound material stack includes a device structure having one or more layers formed over the contact layer. The release layer is configured to be etched to separate the device structure and the contact layer from the substrate.

BRIEF DESCRIPTION OF THE DRAWINGS

The foregoing and other objects, features, and advantages of the invention will be apparent from the following description, and from the accompanying drawings, in which like reference characters refer to the same parts throughout the different views. The drawings illustrate principles of the invention and are not to scale (e.g., relative thicknesses of material layers are not to scale).

FIG. 16A schematically depicts a stackup including an example Schottky device structure on-substrate in accordance with some embodiments.

FIG. 16B schematically depicts the example Schottky device structure after ELO and attachment to a carrier wafer in accordance with some embodiments.

FIGS. 39A-C are images from etching of a stackup including an etch stop layer where the etch stop layer was etched completely through most areas corresponding to perforations.

FIG. 39D is an image of a profilometry scan within the perforated region of the layers on the substrate of FIGS. 39A-C after epitaxial lift-off.

FIGS. 40A-C are images from etching of a stackup including an etch stop layer where the etch stop layer was etched completely through only at some spots corresponding to perforations.

FIG. 40D is an image of a profilometry scan within the perforated region of the layers on the substrate of FIGS. 40A-C after epitaxial lift-off.

FIG. 40E is an image of a profilometry scan within the perforated region of the layers on the substrate of FIGS. 40A-C after epitaxial lift-off.

FIGS. 41A-C are images from etching of a stackup including an etch stop layer where the etch stop layer successfully protected the underlying layers and substrate.

FIG. 41D is an image of a profilometry scan within the perforated region of the layers on the substrate of FIGS. 41A-C after epitaxial lift-off.

DETAILED DESCRIPTION

Figure 1:
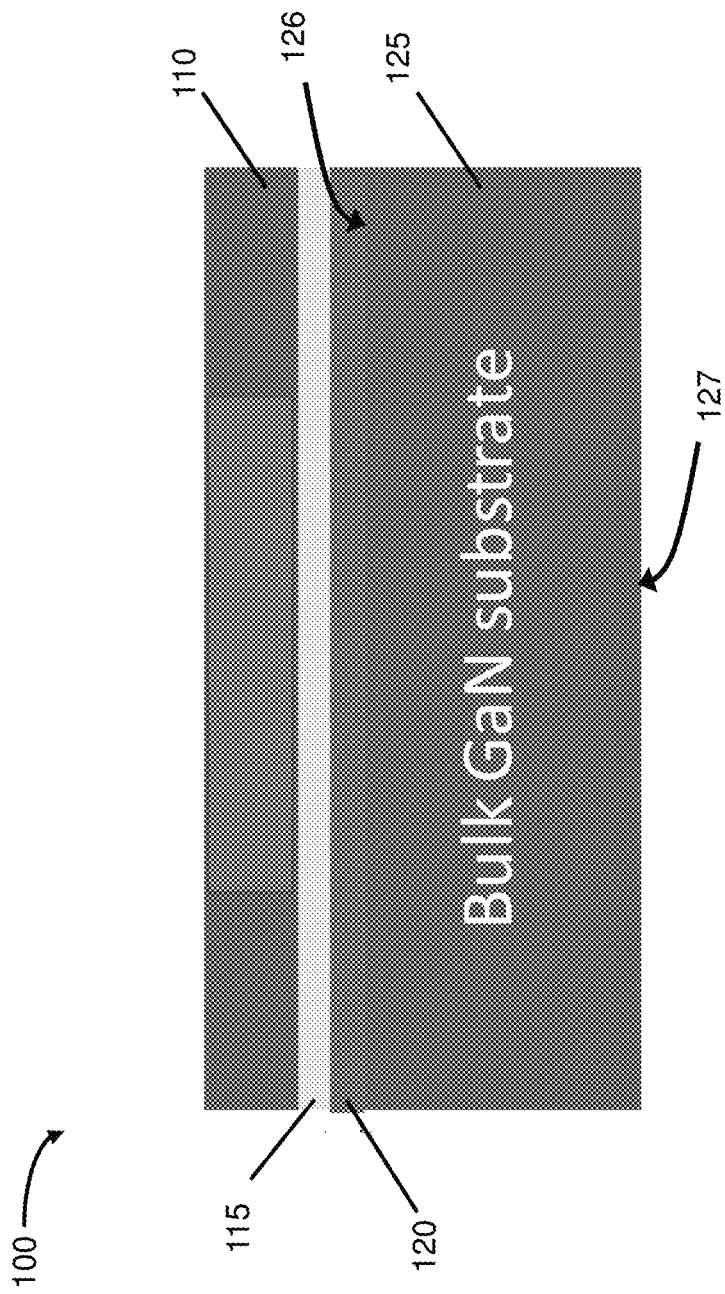
FIG. 1 schematically illustrates a stackup for a device structure before formation of a support layer, according to an example embodiment.

The present disclosure describes systems and methods to carry out wafer-scale ELO of GaN-based films and/or GaN-based device structures from bulk GaN substrates. To reduce the time to lift off large, wafer-sized films, some embodiments employ perforations in the epitaxial GaN-based layers that enable the wet etching of the release layer to be carried out simultaneously at many locations laterally across the substrate and not just at the edges of the substrate.

Photoenhanced methods can improve wet etching results. With photoenhanced methods, the material is illuminated with ultraviolet light during the wet etching process. The incident light generates electron-hole pairs which facilitate the oxidative dissolution of the semiconductor. In conventional systems, UV light sources that have typically been used for photoenhanced wet etching of GaN include UV lasers and high-pressure arc lamps. These sources are relatively expensive and large. Epitaxial lift-off (ELO) is a process technology that enables thin semiconductor epitaxial layers to be separated from the host substrate after crystal growth and transferred to a new carrier. The ELO process is non-destructive and can enable cost reduction through reuse of the native GaN substrate after ELO.

In order for the substrate to be reused for subsequent epitaxial growths after ELO it is necessary to restore a high-quality, "epiready" surface on the substrate. This is usually performed using chemical-mechanical polishing (CMP), which produces a smooth surface on the substrate that is free of contaminants and defects. Ideally the bulk GaN surface has minimal defects after ELO and requires only a short polishing step to restore the surface quality. However, the perforations that are etched into the bulk GaN substrate during the ELO process described herein present a challenge and need to be completely polished away during the CMP process. Polishing of GaN materials can be very slow, and, depending on the depth of the perforations, a significant amount of surface material may need to be removed to achieve an epiready surface. In order for a GaN repolishing process to be economical, it is useful to minimize or eliminate etching of the substrate.

The present disclosure describes the use of an "etch stop" layer disposed between the release layer and the substrate. In an example embodiment, the etch stop layer is designed to have a relatively slow etch rate during the vertical etching of perforations through the epilayer structure. By slowing down the vertical etch using the etch stop layer, the extent of etching into the substrate can be substantially reduced or eliminated.

As used herein, a vertical etch refers to an etch that progresses primarily vertically with respect to the substrate through portions of one or more layers over the substrate towards the substrate.

As used herein, a lateral etch refers to an etch that proceeds primarily laterally with respect to the first surface of the substrate to remove a release layer from between overlying layers and a substrate.

In an example embodiment, an ELO process for GaN materials has been demonstrated using bandgap-selective photoenhanced wet etching of an InGaN release layer. This process can be applied to epitaxial layers grown on a GaN layer, which is, in turn grown on sapphire as well as to epitaxial layers grown on native GaN substrates using a perforation technique to scale up the process to larger size wafers. In some embodiments, the process has the advantage of leveraging conventional metal organic chemical vapor deposition (MOCVD) growth to form the release layer, with minimal degradation of films grown on top of the release layer.

Example GaN-based films have been characterized before and after ELO using AFM, SEM, XRD, and TEM and by fabricating Schottky barrier diodes. The performance of Schottky diodes fabricated on GaN-on-sapphire structures can improve after ELO. Potential applications for this technology include GaN power and optoelectronic devices as well as flexible electronics.

In some embodiments, etching systems employing LED-based light sources as described herein provide low cost and scalability. For example, the low cost and compactness of the light source can provide etching of large batches of many wafers in parallel.

Some systems and methods of the present disclosure effectively use low-cost, high-power UV light emitting diodes (LEDs) to enable deep photoenhanced wet etching of microstructures in gallium nitride (GaN) materials. Some embodiments described herein employ low-cost, high-power UV LED light sources for ultra-deep etching of structures in bulk GaN substrates.

Gallium nitride materials have enabled a diverse range of new device technologies spanning solid state lighting, short-wavelength lasers, and high-frequency/power electronics. It is one of many remarkable characteristics of GaN that light emitting diodes (LEDs) and high electron mobility transistors (HEMTs) can achieve excellent performance in spite of high defect densities, which are generally above $10^8$ cm$^{-2}$ on non-native substrates such as SiC, Si, and sapphire. Nonetheless, high material quality is clearly essential for devices such as blue laser diodes. New GaN device applications are emerging that will require low dislocation densities, including high-voltage p-n diodes and vertical junction field-effect transistors (VJFETs) for high-power switches as well as high-frequency III-N heterojunction bipolar transistors (HBTs). The performance of GaN LEDs and HEMTs can also be improved with the use of native GaN substrates.

Epitaxial lift-off (ELO) is a process technology that enables epitaxial layers to be separated from the original host substrate after crystal growth and transferred to a new carrier. There are important economic as well as device performance benefits to lifting off epitaxial GaN-based films from native GaN substrates. Using a non-destructive ELO process, the expensive bulk GaN substrate can be reused multiple times to substantially lower the effective substrate cost. Light extraction from LED devices can be improved by removing the substrate. For power GaN applications, transferring devices to substrates with better thermal conductivity can enable higher power density and reduced cost through die-size reduction. In some embodiments, non-destructive ELO based processes can be used to produce GaN-based flexible electronics.

Various approaches have been attempted to carry out lift-off of GaN-based films. For example, laser lift-off (LLO) is widely used to separate LED devices from sapphire substrates using a rastered, high-powered laser beam to vaporize the interface between GaN and sapphire. This process can, however, reduce yield due to cracking of the epitaxial material and is not presently compatible with native GaN substrates due to absorption of the laser wavelengths in the substrate.

In an example embodiment, an ELO process described herein employs an indium gallium nitride (InGaN) release layer that can be selectively etched using photoenhanced wet etching. Although the group-III nitrides are notoriously difficult to etch using conventional wet etchants, they can be effectively etched using photoelectrochemical (PEC) methods. PEC etching utilizes above-bandgap illumination to form electron-hole pairs in the semiconductor material. The photogenerated holes facilitate the oxidation and subsequent dissolution of the semiconductor surface, while the electrons are transported to an external cathode to participate in a reduction reaction. Bandgap-selective etching of specific layers within an epitaxial structure can be accomplished by illuminating with wavelengths that absorb only within the layers of interest.

Bandgap-selective GaN ELO offers several advantages over alternative ELO methods. The full layer structure including release layer can be grown by MOCVD using conventional nitride alloys. Because the main objective of growing on bulk GaN substrates is to achieve high material quality, it is essential to ensure that the introduction of a release layer does not degrade the quality of nitride device layers grown on top.

An example embodiment provides a method for forming a GaN-based device free of a substrate. The method includes providing a substrate having a first surface and a second surface facing away from the first surface and forming an etch stop layer over the first surface of the substrate. In some embodiments, the substrate comprises GaN or is a GaN substrate. In some embodiments, the substrate does not comprise GaN (e.g., is a sapphire substrate), but a layer comprising GaN is disposed on or over the first surface of the substrate. The etch stop layer has a first bandgap energy level. The method further includes forming a release layer on the etch stop layer, where the release layer has a second bandgap energy level that is lower than the first bandgap energy level. One or more layers of the device, which are also referred to as device layers, are formed on or over the release layer to form the GaN-based device. The device layers could include any layers in the nitride material system. For example, the device layers could include one or more of GaN, AlGaN, InGaN, AlInGaN, and AlN. A perforated support layer is formed on one of the device layers to form an outermost layer of a stackup. Portions of the release layer at of the one or more device layers underlying perforations in the perforated support layer are removed. The removal includes exposing the substrate, the etch stop layer, the release layer, the one or more device layers and the perforated support layer to a photoenhanced vertical wet etch environment to vertically etch portions of the release layer at of at least one of the one or more device layers underlying the perforations in the support layer.

In some embodiments, the vertical wet etch environment is used to etch through portions of all of the one or more device layers underlying perforations of the perforated support layer. In some embodiments, the vertical wet etch environment is used to etch through portions of at least one but not all of the one or more device layers. For example, if some of the one or more device layers are more resistant to wet etching (e.g., p-GaN), removal of portions of these more resistant layers underlying the support layer perforations may be accomplished through other techniques such as dry etching or laser ablation. For example, in some embodiments, a dry etch is used to remove portions of p-type layers underlying the perforations, and then a photoenhanced vertical wet etch is used to etch through the remaining device layers to the release layer underlying the perforations.

The method also includes exposing the substrate, the etch stop layer, the release layer, the one or more layers of the device and the perforated support layer to a photoenhanced lateral wet etch environment to laterally etch the release layer. After the portions of the one or more device layers underlying the perforations in the support layer have been removed, the perforations in the support layer extend through the one or more device layers to the release layer, enabling the etchant in the subsequent lateral etch to access multiple locations of the release layer away from the edge of the substrate simultaneously. The photoenhanced lateral wet etch environment impinges photons on the release layer having an energy level greater than or equal to that of the second bandgap energy level of the release layer and lower than that of the first bandgap energy level of the etch stop layer. Removal of the release layer by the photoenhanced lateral wet etch separates the substrate from the device layers and the support layer.

In some embodiments, a contact layer having a doping concentration of between $1\times10^{18}$ cm$^{-3}$ and $5\times10^{20}$ cm$^{-3}$ is formed over the release layer and disposed between the release layer and the one or more device layers. During the method, portions of the contact layer underlying the perforations in the support layer are removed such that the perforations extend through to the release layer prior to lateral etching of the release layer. After removal of the release layer and separation of the support layer, the one or more device layers, and the contact layer from the substrate, the contact layer provides the device with a low resistance. In some embodiments, a metal ohmic contact applied to the contact layer has a specific contact resistance of between $1\times10^{-6}$ ohm-cm$^2$ and $5\times10^{-3}$ ohm-cm$^2$.

Another example embodiment provides a method for forming a GaN-based device free of a substrate that includes providing a device structure comprising a substrate having a first surface and a second surface facing away from the first surface, and an etch stop layer formed on the first surface of the substrate, and a release layer formed on the etch stop layer. The substrate comprises GaN or a layer comprising GaN is disposed on the first surface of the substrate. The etch stop layer has a first bandgap energy level and the release layer has a second bandgap energy level that is lower than the first bandgap energy. One or more layers of the device are formed on the release layer to form the GaN-based device, and a perforated support layer is formed on one of the device layers to form an outermost layer of the structure. As explained above, in some embodiments, the device structure also includes a contact layer having a doping concentration of between $1\times10^{18}$ cm$^{-3}$ and $5\times10^{20}$ cm$^{-3}$ formed over the release layer and disposed between the release layer and the one or more device layers.

The method further includes removing portions of the release layer and of the one or more device layers underlying perforations in the perforated support layer. The removing includes exposing the device structure to a photoenhanced vertical etch environment to vertically etch portions of the release layer and of at least one of the one or more device layers underlying the perforations in the support layer. The method also includes and exposing the device structure to a photoenhanced lateral wet etch environment to laterally etch the release layer. The photoenhanced lateral wet etch environment impinges photons having an energy level greater than or equal to that of the second bandgap energy level of the release layer and lower than that of the first bandgap energy level of the etch stop layer. The lateral wet etch removes the release layer to separate the support layer and the one or more device layers from the substrate.

An example embodiment provides a structure for forming a GaN-based device using epitaxial lift-off. The structure includes a substrate having a first surface and a second surface facing away from the first surface, and an etch stop layer formed over the first surface of the substrate, where the etch stop layer has a first bandgap energy. In some embodiments, the substrate comprises GaN or is a GaN substrate. In some embodiments, the substrate does not comprise GaN (e.g., the substrate is a sapphire substrate), but a layer comprising GaN is disposed on or over the first surface of the substrate. The structure also includes a release layer formed on the etch stop layer, where the release layer has a second bandgap energy that is lower than the first bandgap energy. One or more layers of the device, which are also referred to as device layers, are formed on or over the release layer to form the GaN-based device. As noted above, the device layers could include any compounds in the nitride material system. For example, the device layers could include one or more of GaN, AlGaN, InGaN, AlInGaN, and AlN. A perforated support layer is formed on the device layers to form an outermost layer of the structure. The GaN substrate, the etch stop layer, the release layer, the one or more layers of the device and the perforated support layer are configured to be exposed to a photoenhanced vertical wet etch environment to vertically etch portions of the release layer and of at least one of the one or more layers of the device underlying perforations of the support layer. The GaN substrate, the etch stop layer, the release layer, the one or more layers of the device and the perforated support layer are also configured to be exposed to a photoenhanced lateral wet etch environment to laterally etch the release layer. The photoenhanced lateral wet etch environment impinges photons having energy level greater than or equal to that of the second bandgap energy level of the release layer and lower than the first bandgap energy of the etch stop layer.

In some embodiments, a contact layer having a doping concentration of between $1\times10^{18}$ cm$^{-3}$ and $5\times10^{20}$ cm$^{-3}$ is formed over the release layer and disposed between the release layer and the one or more device layers. After removal of the release layer and separation from the substrate, the contact layer provides the resulting device with a low resistance. In some embodiments, a metal ohmic contact applied to the contact layer has a specific contact resistance of between $1\times10^{-6}$ ohm-cm$^2$ and $5\times10^{-3}$ ohm-cm$^2$.

Photoenhanced Etching and Perforation Process

FIGS. 1-5 schematically illustrate an example stackup for a GaN-based device structure and an example epitaxial lift-off (ELO) process. FIG. 1 schematically illustrates a stackup 100 for a GaN-based device structure. In some embodiments, the stackup 100 for the device structure includes one or more device layers 110, a release layer 115, an etch stop layer 120 and a substrate 125. A method for forming the GaN-based device includes providing a substrate 125 (e.g., a bulk GaN substrate), and forming an etch stop layer 120 on or over a first surface 126 of the substrate 125. As depicted in FIG. 1, the substrate is a bulk GaN substrate; however, in some embodiments, the substrate is not a bulk GaN substrate and a layer including GaN is deposited or formed over a first surface 126 of the substrate (e.g., a GaN layer over a sapphire substrate). The etch stop layer 120 has a first bandgap energy level. A release layer 115 is formed on or over the etch stop layer 120. The release layer has a second bandgap energy level that is lower than the first bandgap energy level. One or more layers of the device (e.g., device layers 110) are formed on or over the release layer 115 to form the GaN-based device. In some embodiments, the etch stop layer 120, the release layer 115, and the device layers 110 are formed epitaxially.

The substrate 125 can include a variety of semiconducting or other materials. In particular, the substrate 125 can include one or more III-nitride materials. In some embodiments, the substrate 125 includes gallium nitride (GaN). In some embodiments, the substrate 125 includes aluminum nitride (AlN). In some embodiments, the substrate 125 includes aluminum gallium nitride (AlGaN) or indium gallium nitride (InGaN). In some embodiments, the substrate 125 includes materials that can be expressed stoichiometrically as $In_xAl_yGa_zN$ where x, y, and z are in a range from 0 to 1. In embodiments where the substrate 125 includes GaN, the crystallographic structure of the GaN can be oriented as C-plane, M-plane, or A-plane. The GaN can be semipolar or nonpolar in some embodiments. In embodiments in which one or more layers disposed on the substrate 125 are selectively etched, the one or more layers can include one or more III-nitride materials as described above. In embodiments in which one or more layers disposed on the substrate 125 are selectively etched, the one or more layers can include GaN.

In some embodiments, the release layer is relatively thin. In some embodiments, the release layer has a thickness between approximately 10 nm and 200 nm. In some embodiments, the release layer has a thickness between approximately 40 nm and 110 nm. In some embodiments, the release layer has a thickness between approximately 60 nm and 100 nm. In an example embodiment, the thickness of the release layer is less than 110 nm. Because of its thinness, it is difficult to prevent etching past the release layer and into the underlying bulk GaN substrate during the vertical etching.

In some embodiments, the release layer 115 includes or is made of indium gallium nitride (InGaN). In some embodiments, the release layer includes InGaN having a composition of In in a range of 1% to 12%. In some embodiments, the InGaN has a composition of In in a range of approximately 2% to 7%. In some embodiments, the InGaN has a composition of In in a range of approximately 2.5% to 6.5%. One of ordinary skill in the art in view of the present disclosure will appreciate that the release layer can include InGaN with a different composition, or the release layer may not include InGaN in some embodiments.

In some embodiments, one or more of the device layers 110 include GaN. In some embodiments, at least one of the one or more device layers includes GaN or InGaN. In some embodiments, one or more of the device layers include one or more compounds in the III-V semiconductor nitride material system (e.g., GaN, AlGaN, InGaN, AlInGaN, or AlN). In some embodiments, each of the one or more device layers includes one or more compounds in the III-V semiconductor nitride material system.

In some embodiments, the etch stop layer 120 has a thickness in a range from 20 nm to 50 nm. In some embodiments, the etch stop layer 120 has a thickness in a range from 30 nm to 35 nm.

In some embodiments, the etch stop layer 120 includes aluminum gallium nitride (AlGaN). In some embodiments, the etch stop layer 120 includes AlGaN with an Al composition falling in a range of 15% to 35%. In some embodiments, the etch stop layer 120 includes AlGaN with an Al composition falling in a range of 20% to 35%. In some embodiments, the etch stop layer 120 includes AlGaN with an Al composition falling in a range of 25% to 35%. In some embodiments, the etch stop layer 120 includes AlGaN with an Al composition of 30% and the etch stop layer 120 has a thickness of 30 nm.

Increasing the Al concentration in the AlGaN increases the resistance of the etch stop material to the etchant, however, increasing the Al concentration may require decreasing the thickness of the etch stop layer because increasing the Al concentration decreases the critical thickness beyond which strain due in the etch stop layer due to lattice mismatch will result in dislocation or defect creation and resulting degradation of crystal quality.

In some embodiments, the etch stop layer 120 includes aluminum indium gallium nitride (AlInGaN). In other embodiments, the etch stop layer 120 includes AlGaN with an Al composition as high as 100%. In such an embodiment, the etch stop layer 120 will be thinner. One skilled in the art in view of the present disclosure will appreciate that other materials can be used that are resistant to the photoenhanced vertical wet etch environment.

Figure 2:
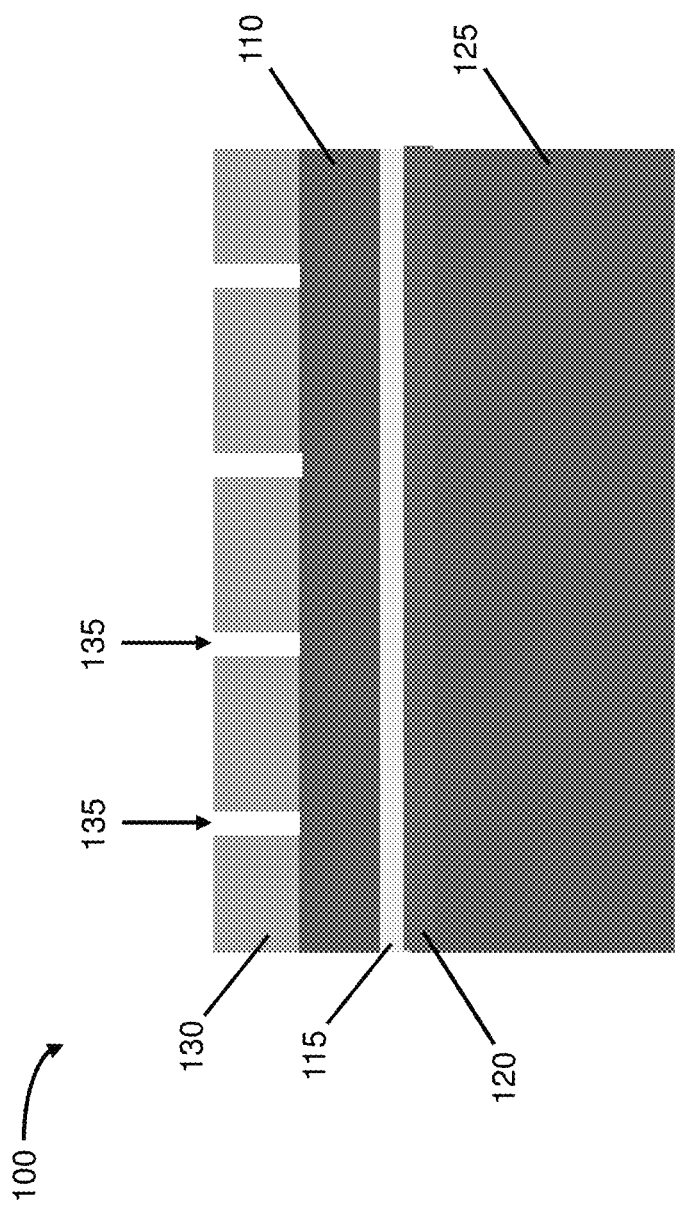
FIG. 2 schematically illustrates a stackup for the device structure after formation of a perforated support layer, according to an example embodiment.

Although not shown in FIGS. 1 and 2, in some embodiments, a contact layer having a doping concentration of between $1\times10^{18}$ cm$^{-3}$ and $5\times10^{20}$ cm$^{-3}$ is formed over the release layer 115 and is disposed between the release layer 115 and the one or more device layers 110. In some embodiments, a metal ohmic contact applied to the contact layer has a specific contact resistance of between $1\times10^{-6}$ ohm-cm$^2$ and $5\times10^{-3}$ ohm-cm$^2$. Further description of the contact layer is provided below with respect to FIGS. 32-34.

FIG. 2 schematically illustrates the stackup 100 for the GaN-based epitaxial device structure with a support layer 130, according to some embodiments. The support layer 130 is formed over or applied to the top surface of the device layers 110 to form an outermost layer of the material stackup 100. In some embodiments, the support layer 130 is a metal support layer. In some embodiments, a metal support layer is deposited or formed, as shown in FIG. 2, by electroplating on the top surface of the device layers 110. In some embodiments, the support layer 130 includes multiple perforations 135. In various embodiments, these perforations may be a cross-shaped feature or have a different shape. In some embodiments, the perforations are provided at regular intervals on the support layer 130. In other embodiments, spacing between the perforations varies. In some embodiments, the perforated support layer 130 is formed by patterning the support layer to form perforations in the support layer 130. In some embodiments, the support layer 130 can be deposited first without patterned perforations and the perforations can be selectively removed at the intended locations with an etching or ablation process. In some embodiments, a photoresist mold may be formed over a device layer, and then metal is deposited on, in or over the photoresist mold. In some embodiments, photolithography can be used to form a patterned seed metal layer. Then, electroplating can be used to grow the seed metal layer onto the patterned support layer 130. In an example embodiment, the support layer 130 is patterned with cross-shaped perforations 250-μm wide and on a pitch of at least 1 mm. In some embodiments, the pitch of the perforations can be in a range from 1 mm to 50 mm. In some embodiments, the pitch of the perforations can be in a range from 1 mm to 10 mm. In some embodiments, the pitch of the perforations is in a range from 0.5 mm to 5 mm.

In an example embodiment, a thickness of the support layer is between approximately 10 1 µm and 50 µm. In another example embodiment, a thickness of the support layer is between approximately 10 µm and 30 µm. In another example embodiment, a thickness of the support layer is between approximately 10 µm and 20 µm. In another example embodiment, a thickness of the support layer is between 15 µm and 30 µm.

Figure 3:
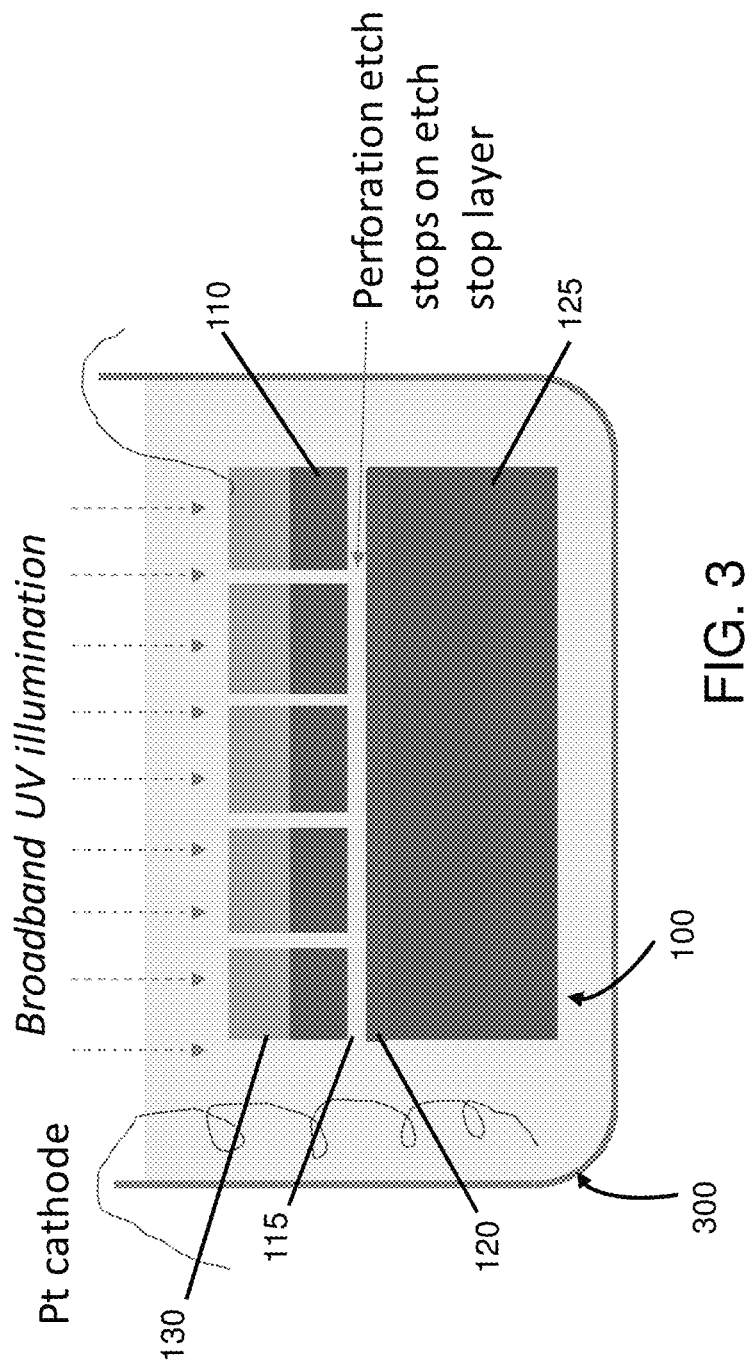
FIG. 3 schematically illustrates the device structure with the support layer in a photoenhanced vertical wet etch environment, according to an example embodiment.

FIG. 3 schematically illustrates the stackup 100 for the epitaxial device structure with the perforated support layer 130 in a photoenhanced vertical wet etch environment 300, according to an example embodiment. In some embodiments, the photoenhanced vertical wet etch environment is provided by a photoenhanced wet etch system. The device structure 100 is exposed to the photoenhanced vertical wet etch environment comprising an etchant (e.g., a KOH solution) to vertically etch portions of the release layer 115 and one or more of the device layers 110 underlying the perforations, in accordance with some embodiments. The release layer 115 and the device layers 110 are etched with the same or similar pattern of the perforations on the support layer 130 as shown in FIG. 3. One or more perforations are formed in one or more of the device layers 110 by etching through the perforated support layer 130 for vertical etching of the release layer 115. In some embodiments in which at least some of the device layers are resistant to the photoenhanced wet etch, portions of the wet etch resistant device layer or layers underlying the perforations may be removed by dry etching, by laser ablation, or by both. After the portions of the wet etch resistant device layer or layers are removed, a photoenhanced vertical wet etch is used to remove the remaining portions of the device layers underlying the perforations in the support layer down to, and in some embodiments, through portions of the release layer. In embodiments employing a contact layer (not shown) between the release layer and the device layers, portions of the contact layer underlying the perforations are also removed. The resulting perforations extending through the device layers to the release layer enable the etchant in the subsequent lateral etch to access the release layer and etch the release layer 115 at multiple locations away from the edge of the substrate simultaneously.

In some embodiments, the photoenhanced vertical wet etch environment 300 includes an ultraviolet (UV) source for electromagnetic radiation. The stackup 100 for the device structure is illuminated with broadband UV rays to vertically etch portions of the release layer 115 and at least some of the one or more device layers 110. In some embodiments, the stackup 100 is illuminated such that the light strikes the perforated support layer 130 and passes through the perforations in the support layer 130 to illuminate the portions of the device layers 110 and the release layer 115 underlying the perforations. The vertical etch stops at the etch stop layer 120. The etch stop layer 120 has a slow etch rate relative to an etch rate of the release layer 115 for the photoenhanced vertical wet etching, and the etch stop layer 115 is configured to reduce etching of the substrate 125 during the photoenhanced vertical wet etching. Further explanation of the etch stop layer is provided below in the section entitled "Etch Stop Layer." The photoenhanced vertical wet etch environment 300 includes impinging photons on the release layer 115 having an energy level greater than or equal to that of the second bandgap energy level of the release layer 115 and lower than that of the first bandgap energy level of the etch stop layer 120. In an example embodiment, broadband UV illumination is supplied by an unfiltered Hg arc lamp to drive the nonselective vertical wet etch process. In some embodiments, UV illumination for the photoenhanced vertical etch is supplied by one or more LED light sources, as explained below with respect to FIG. 6B.

Figure 4:
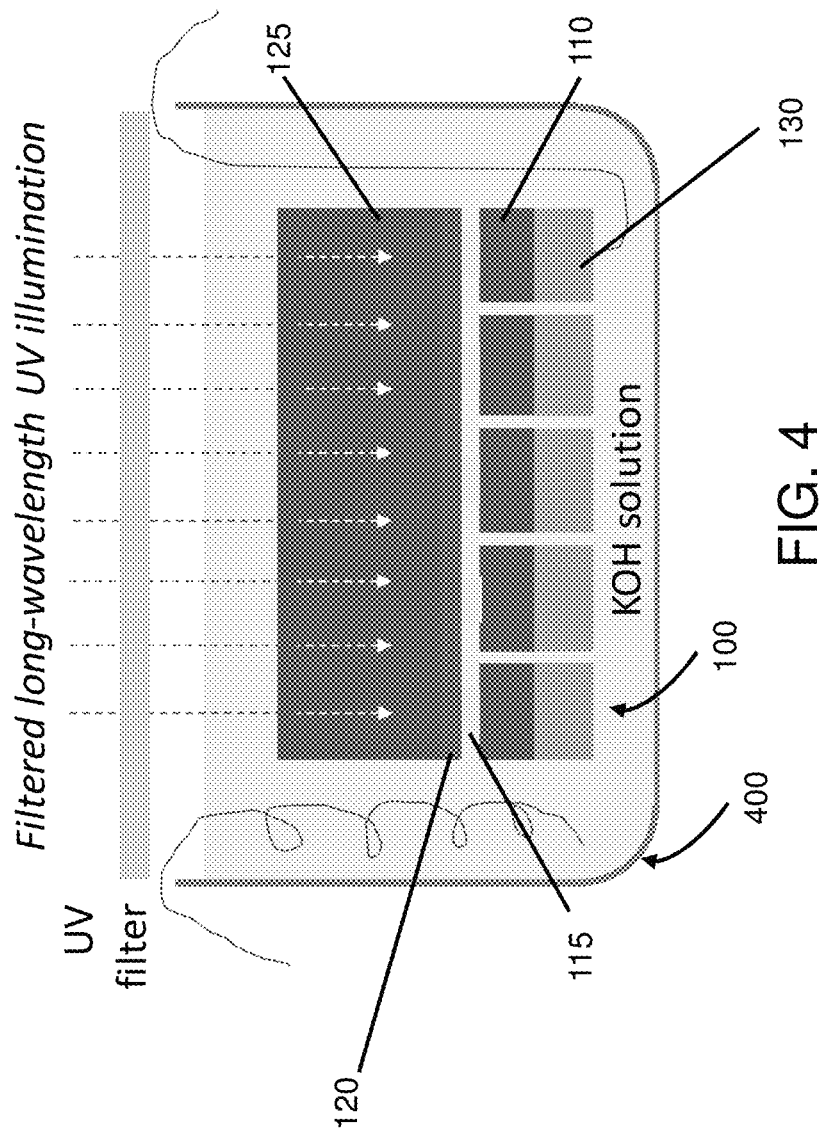
FIG. 4 schematically illustrates the device structure with the support layer in a photoenhanced lateral wet etch environment, according to an example embodiment.

FIG. 4 schematically illustrates the epitaxial device structure 110 with the perforated support layer 130 in a photoenhanced lateral wet etch environment 400, in accordance with some embodiments. The photoenhanced lateral wet etch environment 400 includes an ultraviolet (UV) source for electromagnetic radiation. In some embodiments, the UV light source includes one or more LED light sources. After vertical etching down to the release layer, the device structure 100 is exposed to the photoenhanced lateral wet etch environment 400 to selectively etch the release layer 115 and separate the device layers 110 and the support layer 130 from the substrate 125. In embodiments including a contact layer between the release layer and the device layers, the contact layer is also separated from the substrate. In an example embodiment, filtered UV illumination including energies below the bandgap of the etch stop layer and higher than or equal to the bandgap of the release layer is applied through the backside of the substrate to drive lateral etching of the release layer 115 (e.g., an InGaN release layer) from the perforations and the edge of the substrate using an etchant (e.g., a KOH solution). To filter the UV illumination, an optical filter can be placed between the stackup 100 and the illumination source. The filter can block light at high frequencies that will not be absorbed by the release layer to avoid having this light etch layers other than the release layer. For example, the filter can remove light at frequencies that will not aid in lift-off but will only be absorbed by another component in the stackup 100 and cause etching to occur in that component, such as in GaN material adjacent to the release layer.

The photoenhanced lateral wet etch environment 400 impinges photons on the release layer 115, where the photons have an energy level greater than or equal to that of the second bandgap energy level of the release layer 115 and lower than that of the first bandgap energy level of the etch stop layer 120. In the photoenhanced lateral etch environment 400, the bottom surface of the substrate 125 is illuminated with a filtered UV source.

Figure 5:
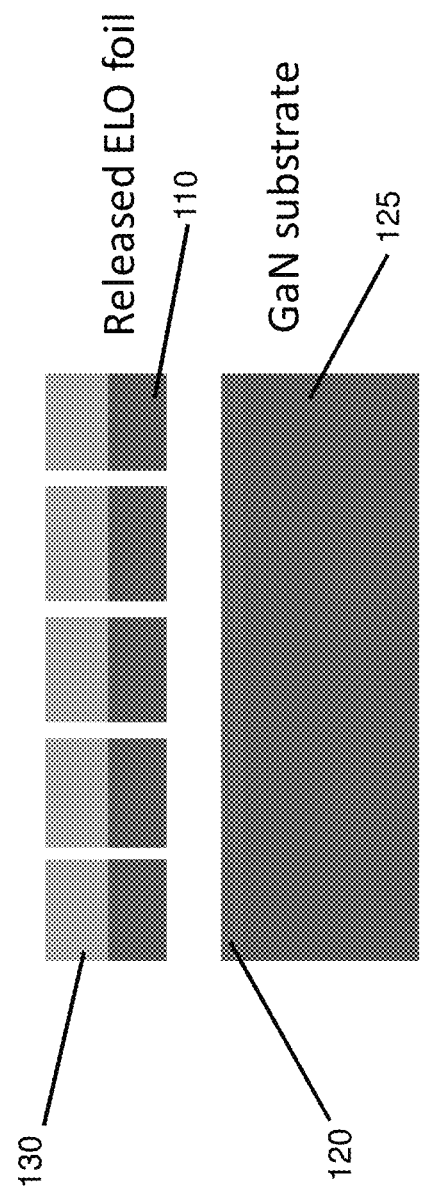
FIG. 5 schematically illustrates the device layers and the support layer separated from the substrate after removal of the release layer, according to an example embodiment.

FIG. 5 schematically illustrates the device layers 110 and the perforated support layer 130 separated from the substrate 125 after etching of the release layer, according to an example embodiment. In embodiments in which the stack up includes a contact layer (not shown) between the release layer and the device layers, removing the release layer exposes the contact layer.

In some embodiments, the second surface of the substrate 125 is covered with a transparent chemically protective layer (not shown) prior to exposing the stackup 100 to the photoenhanced vertical wet etch environment. The transparent chemically protective layer includes one or more of spin-on glass, PECVD silicon oxide, ethylene vinyl acetate (EVA), bonded sapphire, and glass in some embodiments.

In some embodiments, the substrate 125 has a diameter corresponding to a 2-inch to 8-inch wafer or a 4-inch to 8-inch wafer. In some embodiments, the etching of the release layer 115 to separate the one or more device layers 110 from the substrate 125 occurs on a 2-inch to 8-inch wafer size scale or on a 4-inch to 8-inch wafer size scale. In some embodiments, after the lateral etch is completed, the released GaN foil is then attached to a low-cost carrier (for e.g., Si) using a bonding layer.

In some embodiments, a resulting device produced using methods described herein has a length, width, diagonal extent, or diameter of between 5 cm and 20 cm. For example, in some embodiments, a resulting solar cell device would include an active solar cell area having a length, width, diagonal extent, or diameter of between 5 cm and 20 cm. In some embodiments, a resulting device produced using methods described herein has a length, width, diagonal extent, or diameter of between 6 cm and 20 cm. In some embodiments, at least one of the device layers in a resulting device produced using methods described herein has a length, width, diagonal extent, or diameter of between 5 cm and 20 cm. In some embodiments, at least one of the device layers in a resulting device produced using methods described herein has a length, width, diagonal extent, or diameter of between 6 cm and 20 cm.

Figure 6A:
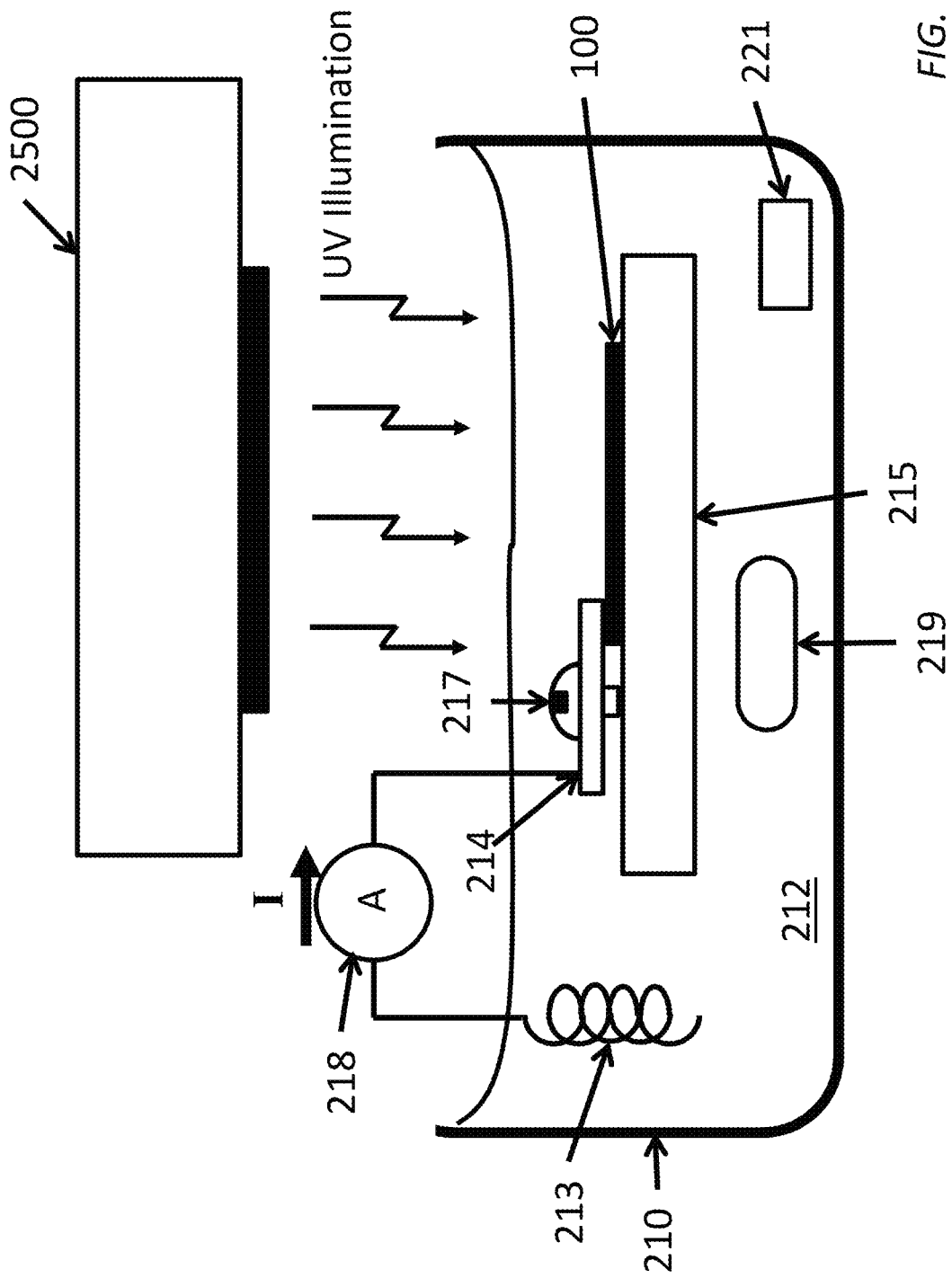
FIG. 6A schematically illustrates a system providing a photoelectrochemical (PEC) wet etch environment for etching the device structure or a substrate, according to an example embodiment.

In some embodiments, photoelectrochemical (PEC) wet etching of GaN can be carried out under UV illumination in an electrochemical cell using KOH chemistry as schematically illustrated in FIG. 6A. The system 200 provides a photoenhanced wet etching environment for photoenhanced etching of the stackup 100 in accordance with some embodiments described herein. The system 200 includes a bath 210 that holds an etching solution 212 into which the stackup 100 is submerged and includes a UV light source 2500 to illuminate the stackup 100. When the stackup 100 is illuminated by the UV light source 2500, a photoelectrochemical reaction is induced in the stackup 100 that enables selective dissolution of material in one or more layers of the stackup.

In various embodiments described herein, the UV light source 2500 can include laser sources, mercury arc lamp sources, mercury-xenon lamps, light emitting diode sources, or any other suitable source of ultraviolet radiation.

In some embodiments, the stackup 100 is affixed to a base 215 and immersed into the etching solution 212 to begin the etch process. An anode 214 and cathode 213 are disposed in the etching solution 212 in order to facilitate the photoenhanced chemical etching process. The stackup 100 is electrically connected to an anode 214 while the cathode 213 is suspended in the etching solution 213 and not in physical contact with the stackup 100. In some embodiments, the anode 214 or an electrical contact to the anode 214 includes nickel. In some embodiments, a layer of the stackup 100 itself (e.g., the substrate or a GaN layer on the substrate) acts as the anode 214 and the electrical lead attaches directly to the stackup 100. In some embodiments, the cathode 213 includes platinum. The anode 214 and cathode 213 are electrically connected to enable charge transfer between them. During the photoelectrochemical etching process, electron-hole pairs are formed in at least one of the layers of the stackup 100. The holes participate in a decomposition reaction while the unpaired electrons flow from the anode to the cathode. The anode 214 and cathode 213 can be electrically connected to a current measuring device such as an ammeter 218 to monitor the level of current flow.

In some embodiments, the cathode 213 is not included in the system 200. Instead, an oxidizing agent in the etching solution 212 can be used to facilitate charge transfer and dissolution of material in the photoelectrochemical etching system. In some embodiments, the oxidizing agent can include potassium persulfate ($K_2S_2O_8$)

In some embodiments, the anode 214 can be used in conjunction with a fastener 217 to clamp or stabilize the stackup 100 to the base 215. For example, the anode 214 or an electrical contact for the anode can be shaped as a washer and the fastener can be a screw that passes through the washer and screws into the base 215. The stackup 100 is thereby clamped between the base 215 and the anode 214 or an electrical contact for the anode.

In some embodiments, the base 215 includes a non-reactive material. For example, the base 215 includes or is formed of polytetrafluoroethylene (PTFE) in some embodiments. The base 215 can physically prevent etching on the contacting surface of the stackup 100 in some embodiments.

The etching solution 212 can include any formulation of chemicals or solvents that is appropriate for removal of the desired material in the substrate 100. The etching solution 212 can include potassium hydroxide (KOH) in some embodiments. In some embodiments, the etching solution 212 can include potassium persulfate ($K_2S_2O_8$), sodium hydroxide (NaOH), hydrochloric acid (HCl), tartaric acid/ethylene glycol, phosphoric acid ($H_3PO_4$), citric acid/hydrogen peroxide, tetramethylammonium hydroxide (TMAH), or various combinations of these chemicals with or without KOH. In some embodiments, the molarity of KOH in the etching solution can be in a range from 0.01 M to 10 M. In some embodiments, the molarity of KOH in the etching solution 212 can be in a range from 0.01 M to 1 M. In some embodiments, the molarity of KOH in the etching solution 212 can be in a range from 0.1 M to 2 M, particularly for lateral etch processes.

Figure 6B:
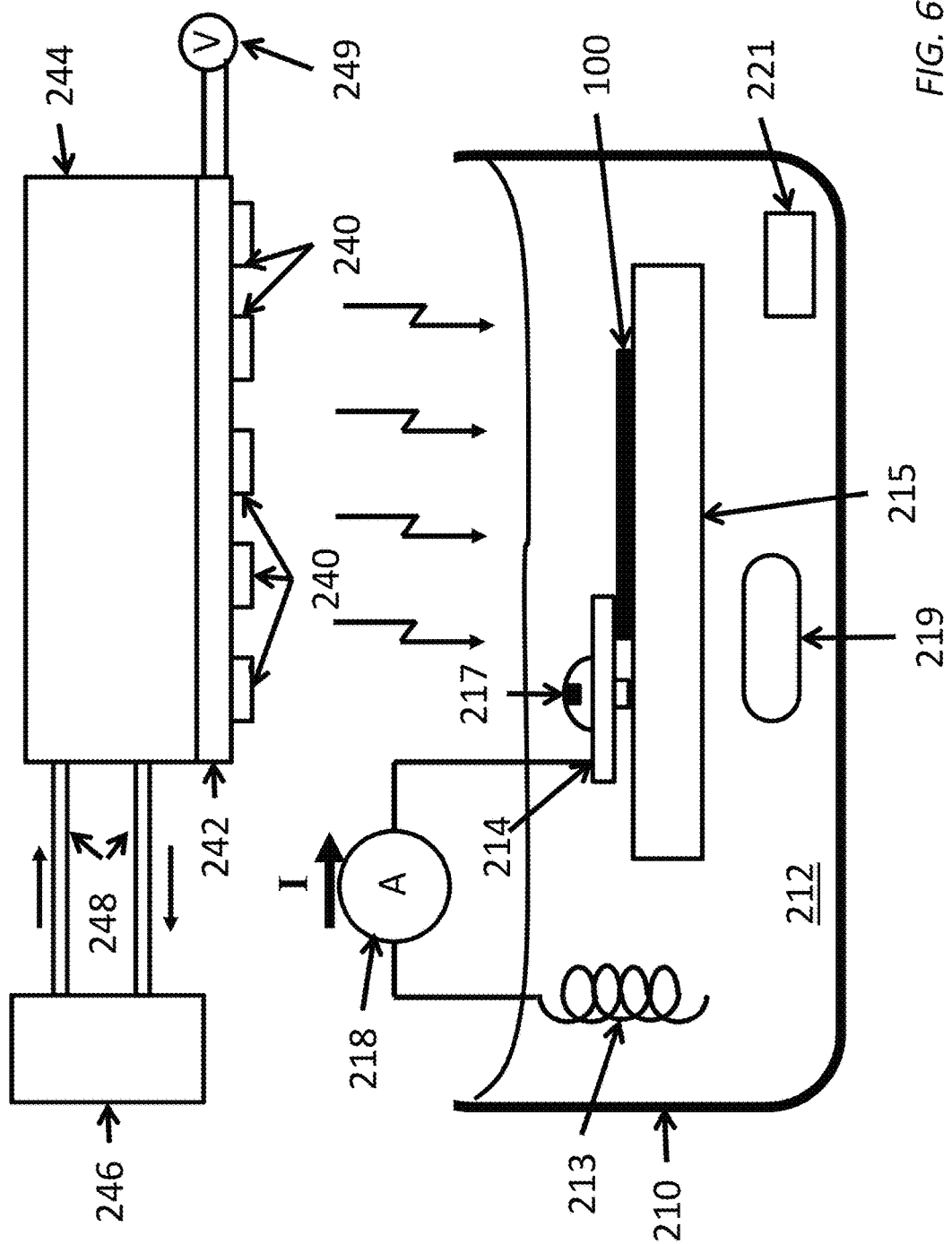
FIG. 6B schematically illustrates a system including at least one light emitting diode (LED) source providing a photoelectrochemical (PEC) wet etch environment for etching the device structure or a substrate, according to an example embodiment.
Figure 8:
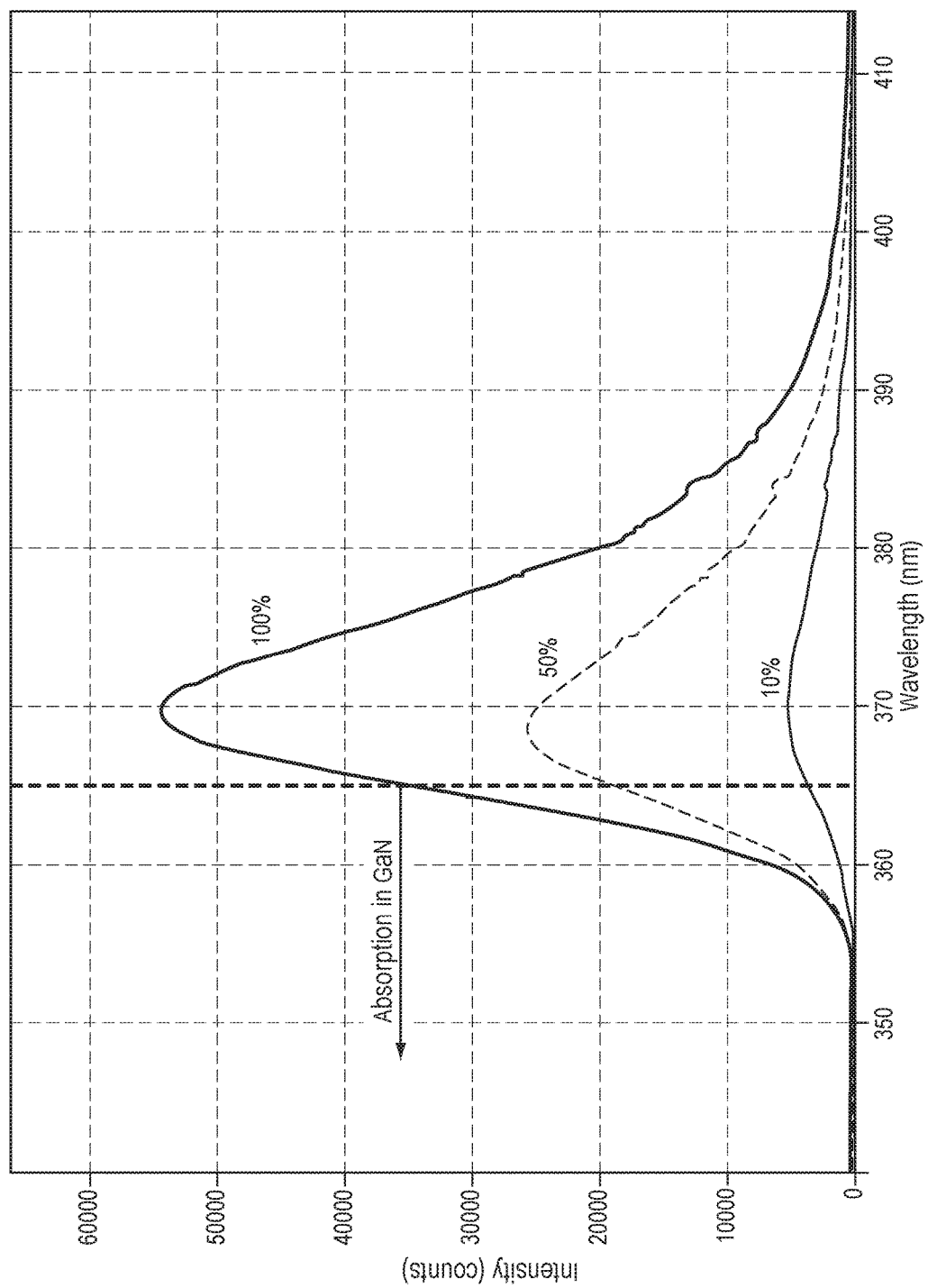
FIG. 8 is a graph of relative intensity versus wavelength of light emission for spectra obtained from an exemplary light emitting diode (LED) source 240 of the LED array of FIG. 7 when operated at power levels of 10%, 50%, and 100% of maximum rated output power.

FIG. 6B illustrates an example embodiment of the system 200 that includes at least one light emitting diode (LED) source 240 to provide UV illumination in the photoenhanced wet etching environment. The LED source 240 emits light at a wavelength that can be absorbed by at least some of the layers of the stackup 100, or in embodiments where portions of one or more layers disposed over the substrate are etched, at a wavelength that can be absorbed by the one or more layers. For materials that exhibit a bandgap, this means that the light emitting diode source 240 must generate photons with wavelengths shorter than or equal to the bandgap energy, which corresponds to energies greater than or equal to the bandgap energy, so that the photons will be absorbed by the material. Put another way, the photons must have energy higher or equal to the bandgap energy in the layer that is to absorb the photons. For example, the wavelength corresponding to the energy bandgap of GaN is approximately 365 nm at room temperature. In some embodiments, the light emitting diode source 240 emits light at a nominal wavelength of 365 nm. Although many manufacturers provide nominal wavelengths for light emitting diode products, the actual center wavelength can generally be located between 367-370 nm. FIG. 8 illustrates relative spectra obtained from an exemplary light emitting diode source 240 when operated at power levels of 10%, 50%, and 100% of maximum rated output power. The left tail of each spectrum extends below 365 nm, and only this portion of each spectrum will be absorbed in a GaN substrate 125 or GaN layer grown on a substrate 125.

In some embodiments, the at least one LED source 240 is or can be mounted to or electrically connected with a circuit board 242. The circuit board 242 includes a metal core in some embodiments. The metal core can provide the circuit board 242 with a high thermal conductivity to enable the LED sources 240 to discharge thermal energy efficiently in embodiments where the LED sources 240 are in thermal contact with the circuit board 242. In some embodiments, a voltage source 249 can connect to the circuit board 242. Traces on the circuit board can transmit power from the voltage source 249 to each of the light emitting diode sources 240. In other embodiments, each LED source 240 can independently connect electrically to the voltage source 249 (or to multiple voltage sources 249).

The circuit board 242 is in thermal contact with a heat sink 244 in some embodiments. In some embodiments, the LED sources 240 are in thermal contact with the heat sink 244 directly or through the circuit board 242. The heat sink 244 dissipates thermal energy generated by the LED sources 240 or associated electronics. In some embodiments, the heat sink 244 is gas-cooled (e.g., air-cooled) or liquid-cooled. The heat sink 244 includes ventilation fins or structures in some embodiments. In some embodiments, the system 200 includes a fluid chiller 246 that removes hot fluid from the heat sink 244 and returns chilled fluid to the heat sink 244 using conduction pipes 248. In some embodiments, the fluid that circulates through the chiller 246 and heat sink 244 is water. In some embodiments, the heat sink 244 is configured to remove an amount of heat corresponding to a power in a range of 100 to 300 Watts. In some embodiments, the heat sink 244 is configured to continuously remove between 5 W/cm$^2$ to 20 W/cm$^2$ of power per unit area of illumination at an illumination output of the array of LED sources.

Temperature effects can shift the spectral emission distribution of the LED sources to longer or shorter wavelengths. For example, as the bias current is increased in each LED source 240 and the LED sources 240 consequently heat up, the spectral distribution of each LED source 240 will shift to longer wavelengths. In the example of a GaN substrate 100 or a substrate 100 on which is disposed a layer of GaN, the relative amount of energy in the spectral distribution below 365 nm is reduced as the temperature heats up (i.e., the spectra shown in FIG. 8 shift to the right). By thermally connecting the LED sources 240 to a heat sink 246 to reduce heat build up, LED sources 240 can operate at high powers while mitigating the shifting of the spectrum to longer wavelengths that is caused by heating of the LED sources 240.

In some embodiments, the system 200 includes a heating element 221 that can heat the etching solution 212. By heating the etching solution 212 using the heating element 221, the substrate 125, and any layers disposed thereon are also heated. When the substrate 125 and any layers disposed on the substrate are heated, the absorption edge of the material in the substrate 125 and/or of the material in one or more layers on the substrate to be etched is shifted to longer wavelengths. As a result, the fraction of the spectrum output by the LED sources 240 that can be absorbed by the material to be etched is increased.

In some embodiments, the system 200 includes stirring mechanism 219 to stir the etching solution 212. The stirring mechanism 219 can include a magnetic stirrer or stirbar, a vortexer, or other fluid mixing agent in some embodiments. The stirring mechanism 219 can help circulate the etching solution 212 in the bath 210. In some embodiments, the stirring mechanism 219 helps distribute heat in the bath 210 by circulating locally heated etching solution 212 in the vicinity of the heating element 221 to other parts of the bath 210. In some embodiments, cooling of the LED sources 240 and heating of the etching solution 212 can be employed together in a system to provide greater control of wavelength shift and light absorption.

Figure 7:
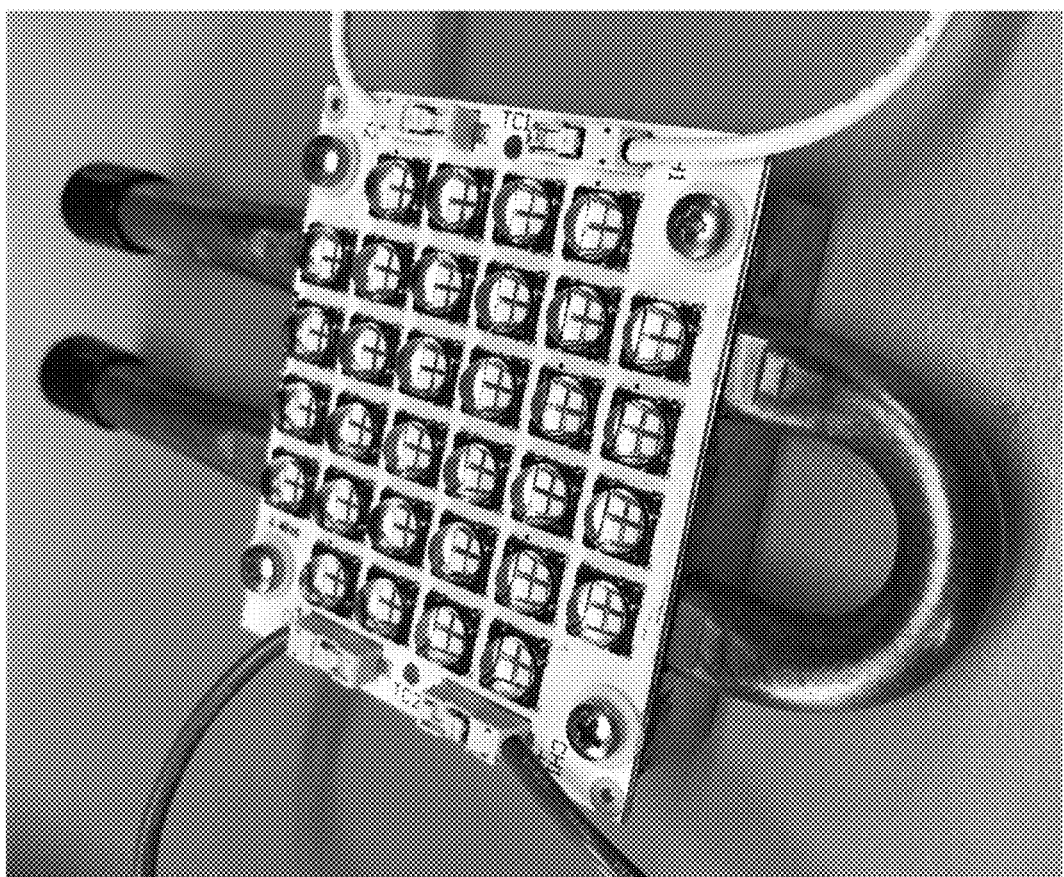
FIG. 7 is an image of a high-powered LED array cooled by a water-cooled heat sink used in the photoenhanced wet etch environment for etching the device structure, according to an example embodiment.

FIG. 7 illustrates the at least one LED source 240, circuit board 242, and heat sink 244 according to an example embodiment described herein. In some embodiments, the system 200 can include between one and two hundred LED sources 240 per wafer to be etched by the system at one time. In some embodiments, the system includes one or more arrays of LED sources 240. In some embodiments, each array is configured to illuminate a sample or wafer to be etched. In some embodiments, the system 200 can include an array of thirty-two LED sources 240 configured to illuminate a single sample or wafer. In some embodiments, the array of LED sources form at least a part of an optical system where the optical system has an illumination output area that depends, in part, on the area over which the array of LED sources are disposed. In accordance with an exemplary embodiment, the LED sources 240 can be distributed over an area of approximately 2×2 inches square (5.08 cm×5.08 cm centimeters). One of ordinary skill in the art would appreciate that the system 200 can include any number of LED sources 240 positioned at an appropriate spacing and having appropriate power to expose the stackup to an appropriate flux of photons. As shown in FIG. 7, the LED sources 240 can be placed in a compact arrangement to minimize the footprint of UV illumination source 2500 of the system 200. In some embodiments, the intensity of light as measured at the output of the illumination system can be in a range from 0.1 W/cm$^2$ to 100 W/cm$^2$. In some embodiments, the intensity of light as measured at the output of the illumination system 2500 can be in a range of 1 W/cm$^2$ and 40 W/cm$^2$. In some embodiments, the intensity of light as measured at the output of the illumination system can be in a range of 1 W/cm$^2$ to 6 W/cm$^2$. In some embodiments, the intensity of light as measured at the output of the illumination system can be in a range of 2 W/cm$^2$ to 4 W/cm$^2$.

In FIG. 7, each of the depicted LED sources 240 includes four emitters and a focusing element combined in a single LED package. In accordance with various embodiments, each LED source 240 in the system 200 can include one, two, three, four, or more emitters depending upon package design as one of ordinary skill in the art would appreciate. By their nature, LED emitters tend to emit over a large solid angle. When light emitted by the emitter does not reach the stackup 100, overall efficiency in the system is reduced. In some embodiments, each LED source 240 can includes a focusing element to direct light from the LED source 240 in a more forward direction and prevent the loss of photons from the system at high angles. In some embodiments, the focusing element is integrated into the LED package. In some embodiments, an emission half-angle of the at least one LED source 240 is 50° or less.

In some embodiments, the power rating of each LED source 240 can lie in a range from 1 Watt to 100 Watts or in a range from 1 Watt to 20 Watts, or in a range from 1.5 Watts to 4 Watts. In exemplary embodiments, the power rating of each LED source 240 can be about 10 Watts. In some implementations, the LED sources 240 of the system 200 can provide a combined optical power in a range from 50 W to 300 W to illuminate an area in a range of 4 to 710 cm$^2$. The power consumed by the one or more LED light sources per area illuminated for etching may fall in a range of 50 W/in$^2$ (7.8 W/cm$^2$) to 200 W/in$^2$ (31 W/cm$^2$), or 50 W/in$^2$ (7.8 W/cm$^2$) to 150 W/in$^2$ (23.2 W/cm$^2$), or 50 W/in$^2$ (7.8 W/cm$^2$) to 100 W/in$^2$ (15.5 W/cm$^2$). The system 200 can produce the intensity across substantially the entire surface of the stackup 100 based on a substrate 125 having a diameter of 2 inches, 4 inches, 6 inches, or 8 inches in some embodiments. In some embodiments, the system 200 can produce an intensity of light across the entire surface of the stackup 100 (e.g., wherein the substrate 125 has a diameter in a range from 2 inches to 8 inches) in a range between 1 W/cm$^2$ and 40 W/cm$^2$. In some embodiments, the system 200 can produce an intensity of light across the entire surface of the stackup 100 (e.g., wherein the substrate 125 has a diameter in a range from 2 inches to 8 inches) in a range between 4 W/cm² and 6 W/cm². Advantageously, the high intensities produced by systems described herein across large areas (e.g., an entire two, four, six, or eight inch wafer-size substrate 100) enables etching of deep features over commercially realistic time frames (e.g., hours). In some embodiments, the high intensity of light produced by the system over large areas is enabled by arrangement of LED sources into an array. In the array, LED sources can be closely spaced to increase optical power per unit area.

An important requirement for a light source to be used in wet etching of a material is that the light source must generate photons that can be absorbed by the material to be etched. For GaN, with a bandgap corresponding to a wavelength of 365 nm, the light source must generate photons with wavelengths shorter than or equal to approximately 365 nm at room temperature. Although GaN LEDs have a nominal wavelength of 365 nm, the actual center wavelength is generally located between 367-370 nm.

FIG. 8 shows several spectra acquired from an LED source 260 of the high-powered LED array described above when operating at different power levels. The left tail of the spectrum can be seen to extend below 365 nm; only this portion of the spectrum is absorbed in the GaN material (e.g., a GaN substrate). As explained above, temperature effects can shift the significant distribution to longer or shorter wavelengths. For example, as the LEDs in the LED array heat up (e.g., under higher bias currents), the spectral distribution of each LED will shift to longer wavelengths thus reducing the relative amount of energy in the spectral distribution below 365 nm. In some embodiments, the high-powered LED array includes adequate heat sinking of the LEDs for operation at higher powers to reduce shifting of the spectrum to longer wavelengths caused by heating of the LEDs in the array by reducing heat buildup in the LEDs.

In some embodiments, the stackup is etched in a heated solution to shift the absorption edge of the substrate material itself to longer wavelengths than 365 nm as explained above. In such embodiments employing heating of the GaN substrate, the fraction of the spectrum output by the LED array that can be absorbed by the substrate is increased. In some embodiments, both adequate heat sinking of the LED array and heating of the GaN sample (e.g., the GaN substrate) are employed.

Although described herein with relation to GaN-based etching, the systems and methods of the present disclosure are not limited to use with GaN-based materials and GaN substrates and can be used to perform photoenhanced wet etching of a variety of semiconductor materials including other III-nitride compound materials. Teachings herein also apply to systems and methods for etching other III-nitride materials, such as AlN or InGaN. Other embodiments include systems and method for etching materials including AlN or InGaN.

While relatively slow compared to some process steps, the ELO processes described herein are low-cost and can be implemented for large batches of wafers in parallel to achieve high throughput. The ELO processes described herein can be scaled up for 6-inch to 10-inch GaAs substrates to volume production.

Etch Stop Layer

Epitaxial lift-off (ELO) is a process that uses chemical wet etching of a release layer to separate thin semiconductor epitaxial layers from the substrate on which they are grown. One advantage of some embodiments of the ELO process is that it does not damage the original substrate, which then can be reused multiple times for cost reduction. There are economic benefits for ELO carried out on GaN substrates, which have very high cost. Bulk GaN wafers enable the homoepitaxial growth of III-nitride materials with much lower dislocation density than similar films grown on non-native substrates such as Si, sapphire and SiC. Multiple reuses of bulk GaN substrates can considerably reduce the cost to produce low-dislocation density III-nitride films fabricated using ELO. High-quality GaN material enables improved performance of devices such as LEDs, lasers and transistors.

In order for the substrate to be reused for subsequent epitaxial growths after ELO it is necessary to restore a high-quality, "epiready" surface on the substrate. This is usually performed using chemical-mechanical polishing (CMP), which produces a smooth surface on the substrate that is free of contaminants and defects. Ideally the bulk GaN surface has minimal defects after ELO and requires only a short polishing step to restore the surface quality. However, the perforations that are etched into the bulk GaN substrate during the ELO process described herein present a challenge and need to be completely polished away during the CMP process. Polishing of GaN materials can be very slow, and, depending on the depth of the perforations, a significant amount of surface material may need to be removed to achieve an epiready surface. In order for a GaN repolishing process to be time-effective, practical, and economical, it is necessary to minimize or eliminate etching of the substrate.

Figure 9:
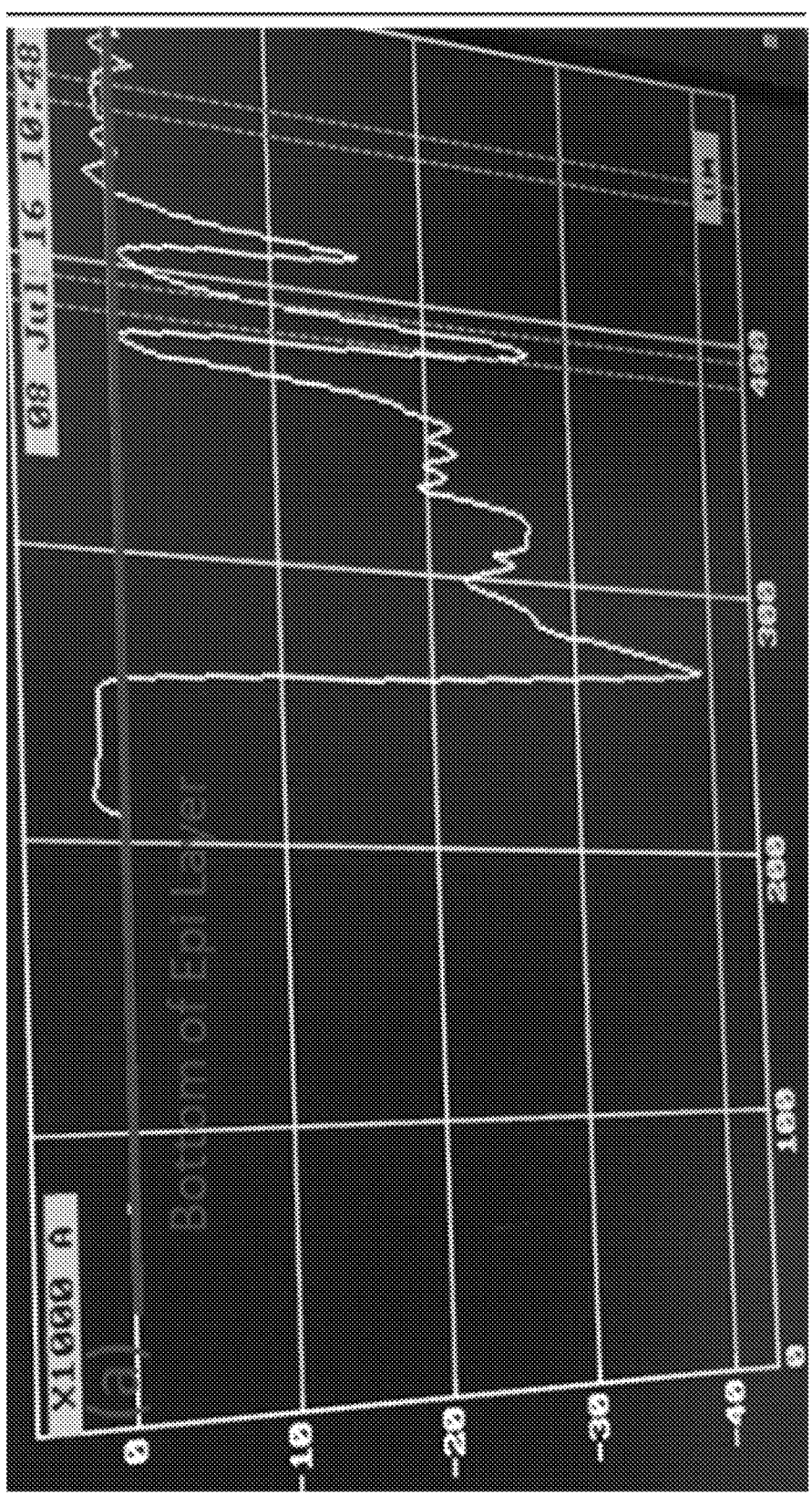
FIG. 9 is an image of a profilometry scan within the perforated region of a substrate, without an etch stop layer, after epitaxial lift-off.
Figure 10:
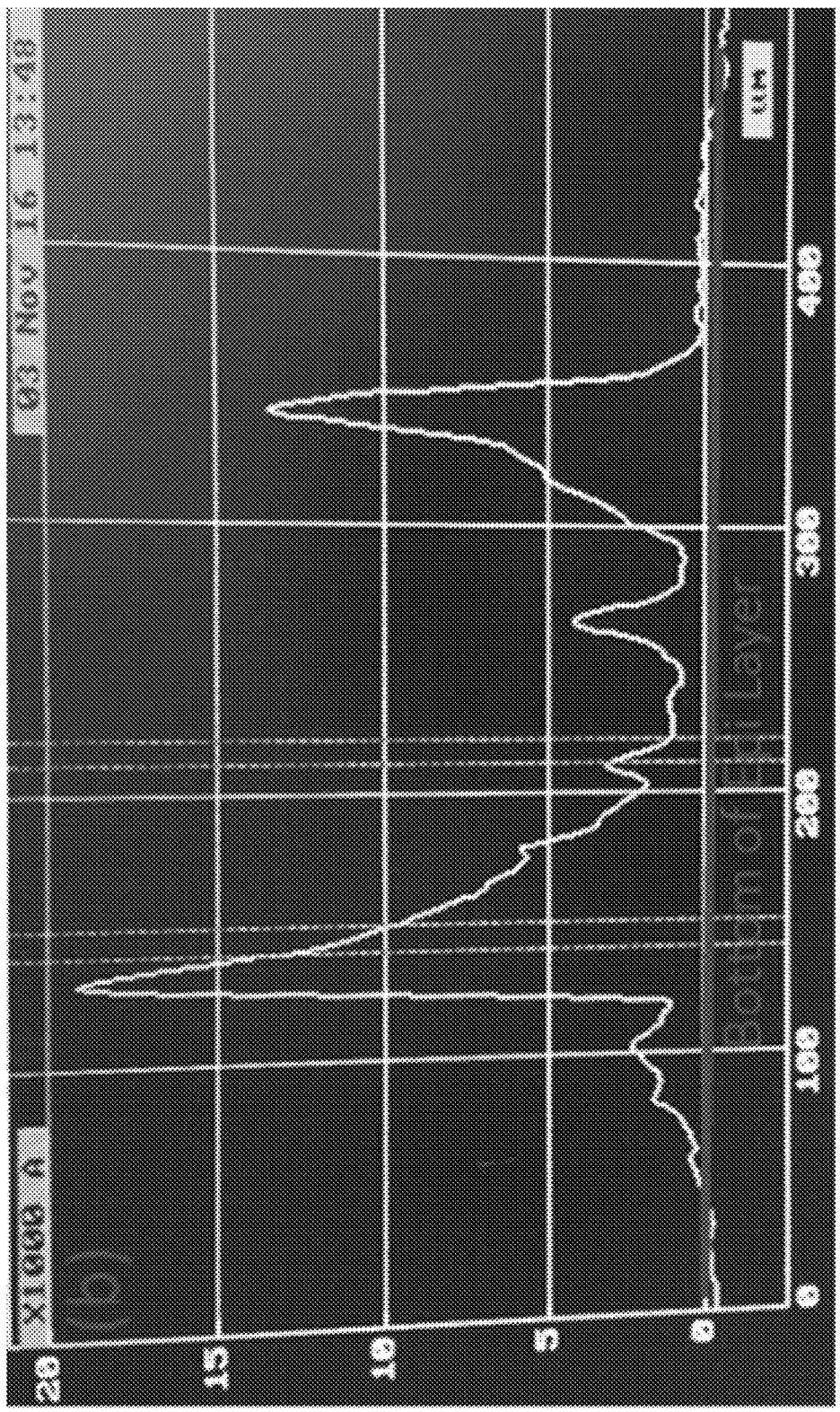
FIG. 10 is an image of a profilometry scan within the perforated region of a substrate, with an etch stop layer, after epitaxial lift-off.

The present disclosure describes the use of an "etch stop" layer disposed between the release layer and the substrate. In an example embodiment, the etch stop layer is designed to have a relatively slow etch rate during the vertical etching of perforations through the epilayer structure. By slowing down the vertical etch using the etch stop layer, the extent of etching into the substrate can be substantially reduced, as illustrated in FIGS. 9 and 10, which are described below.

As explained above, FIGS. 1-5 summarize an example ELO process sequence to form the perforations and lift off the device layers 110 from the substrate 125. After formation of the etch stop layer 120, the release layer 115, and device layers 110 on the substrate 125, a support layer 130 with a perforation pattern is formed on the top surface of the device structure 100, as shown in FIG. 2. The perforation pattern is then transferred into the device layers 110 using a vertical etch as shown in FIG. 3, where the etch proceeds down to the buried release layer 115. In some embodiments, dry etching and/or laser ablation are used with the photoenhanced vertical wet etch to remove portions of the device layers and the release layer underlying the perforations. In some embodiments a photoenhanced wet etch process is used to carry out this vertical etch, but other methods such as dry etching may also be used. As illustrated in FIG. 3, the etch stop layer 120 reduces or eliminates etching into the substrate 125. A lateral etch, shown in FIG. 4, is performed to selectively etch the release layer 115 and lift off the device layers 110 from the substrate. In some embodiments, a bandgap selective photoenhanced wet etching method is used to etch the release layer 115 as described herein. FIG. 5 shows the substrate (e.g., bulk GaN substrate) and the device layers (e.g., GaN-based ELO foil) after lift-off.

In an example embodiment, the etch stop layer 120 is removed from the substrate 125 after removal of the release layer. The substrate 125 is polished to smooth out any etchings in the substrate 125 and to prepare it for reuse. In some embodiments, the polishing of the substrate removes the etch stop layer. A new etch stop layer is deposited or epitaxially formed on the substrate 125, and the substrate 125 is then ready to be reused to grow or form another device structure.

There are multiple ways to achieve selectivity when etching semiconductors, which is defined as the ratio of etch rates between different materials. One example method is through bandgap-selective photoenhanced wet etching. In an example embodiment, photoenhanced wet etching processes are used for both vertical and lateral wet etches in the ELO process described above. The etching processes are driven by the photogeneration of electron-hole pairs by illuminating with photons with energies greater than the bandgap of the material being etched. Photons that have energies less than the bandgap are not absorbed in the semiconductor and do not lead to photoenhancement of the wet etch process. Selectivity between materials having different bandgaps can be achieved by illuminating with photons of specific wavelengths that only absorb in the materials that are targeted for etching. In an example embodiment, an etch stop layer can be formed using a material with a higher bandgap than that of the materials in the GaN epilayer structure. Illuminating with photons of smaller energy than that of the bandgap of the etch stop layer during the vertical etch process drives etching of portions the epilayer structure underlying the perforations, but not of the etch stop layer.

In some embodiments, the etch stop layer includes aluminum gallium nitride (AlGaN). In an example embodiment, the etch stop layer includes AlGaN with an aluminum composition falling in a range of approximately 15% to 35%. In another example embodiment, the etch stop layer includes AlGaN with an aluminum composition falling in a range of approximately 20% to 35%. In an example embodiment, the etch stop layer includes AlGaN with an aluminum composition falling in a range of approximately 25% to 35%.

FIGS. 9 and 10 show profilometry scans within the perforated region of a substrate after epitaxial lift-off. In FIG. 9, the GaN substrate did not have an etch stop layer, and the vertical etch extended nearly 4 microns into the GaN substrate. In FIG. 10, an etch stop layer was provided on the GaN substrate causing the vertical etch to stop at the bottom of the release layer without significant etching into the GaN substrate.

Other approaches can be employed for forming etch stop layers to protect the bulk GaN substrate, depending on the etching method used to form the perforations. For example, selective etching can be achieved when dry etching GaN with respect to AlGaN when using chlorine-based chemistries. The addition of fluorine species to the plasma forms nonvolatile compounds when etching Al-containing layers, slowing down the etch rate. Dopant selectivity can also be used for photoenhanced wet etching of GaN, where a p-type layer could be used an etch stop when etching n-type GaN layers.

Additional examples of stackups including etch stop layers are illustrated and described below with respect to FIGS. 39A-41D.

Example Released GaN-Based Layers and Schottky Diode Devices

GaN-based epitaxial layers were formed and released off of substrates using the processes described herein. The GaN material quality was investigated using X-ray diffraction (XRD), transmission electron microscopy (TEM), and atomic force microscopy (AFM), as well as through fabrication of planar Schottky barrier diodes (SBDs).

In this example, all samples were grown using an Aixtron Close Coupled Showerhead (CCS) MOCVD reactor using TMGa, TMIn, $NH_3$, $Si_2H_6$, and $Cp_2Mg$ precursors for Ga, In, N, Si, and Mg sources, respectively. A V/III ratio of approximately 2000 was used as a typical GaN growth condition. $H_2$ carrier gas was used for GaN growth, while pure $N_2$ carrier gas was used for InGaN growth. GaN epitaxial structures consisted of 0.5-2 μm of $n^+$ GaN (Si, $1 \times 10^{18}$ $cm^3$), $In_xGa_{1-x}$ (UID, x=0.03-0.08, 90 nm), and 5 μm n-GaN (Si, $2\text{-}3 \times 10^{17}$ $cm^3$) grown on sapphire or freestanding c-plane GaN substrates from SCIOCS Company Limited.

Figure 11:
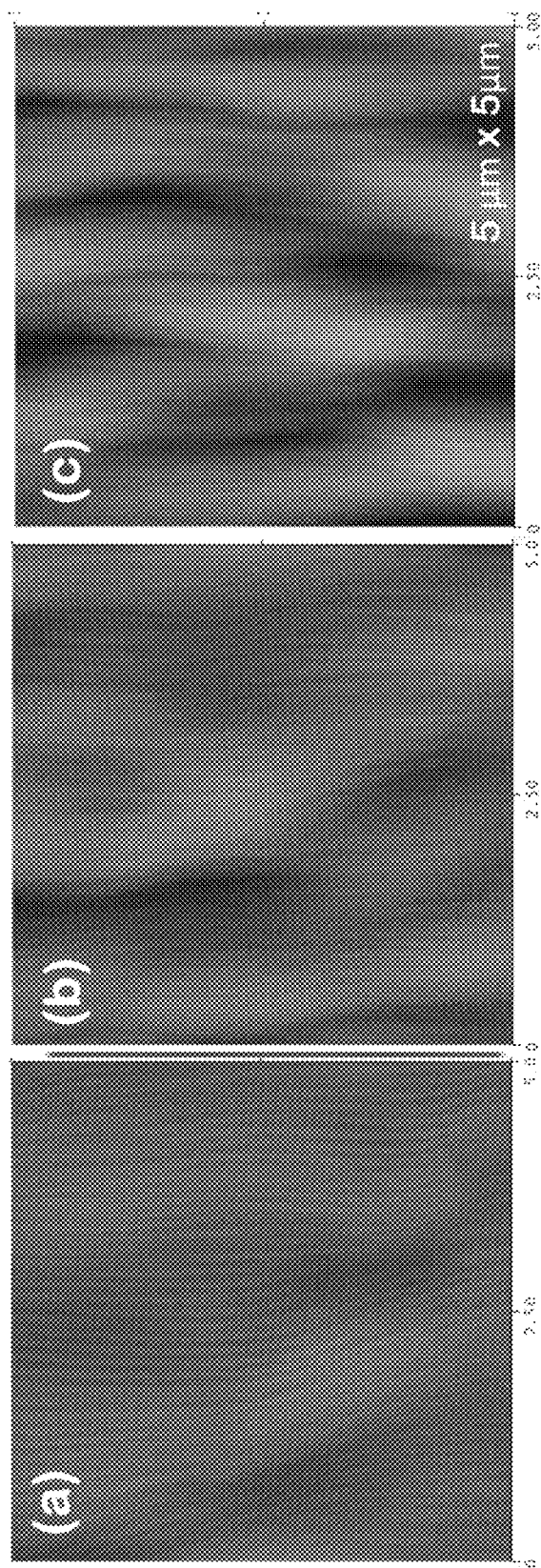
FIG. 11 includes three atomic force microscopy (AFM) images measured across a 2-inch bulk GaN wafer after epitaxial growth.
Figure 12:
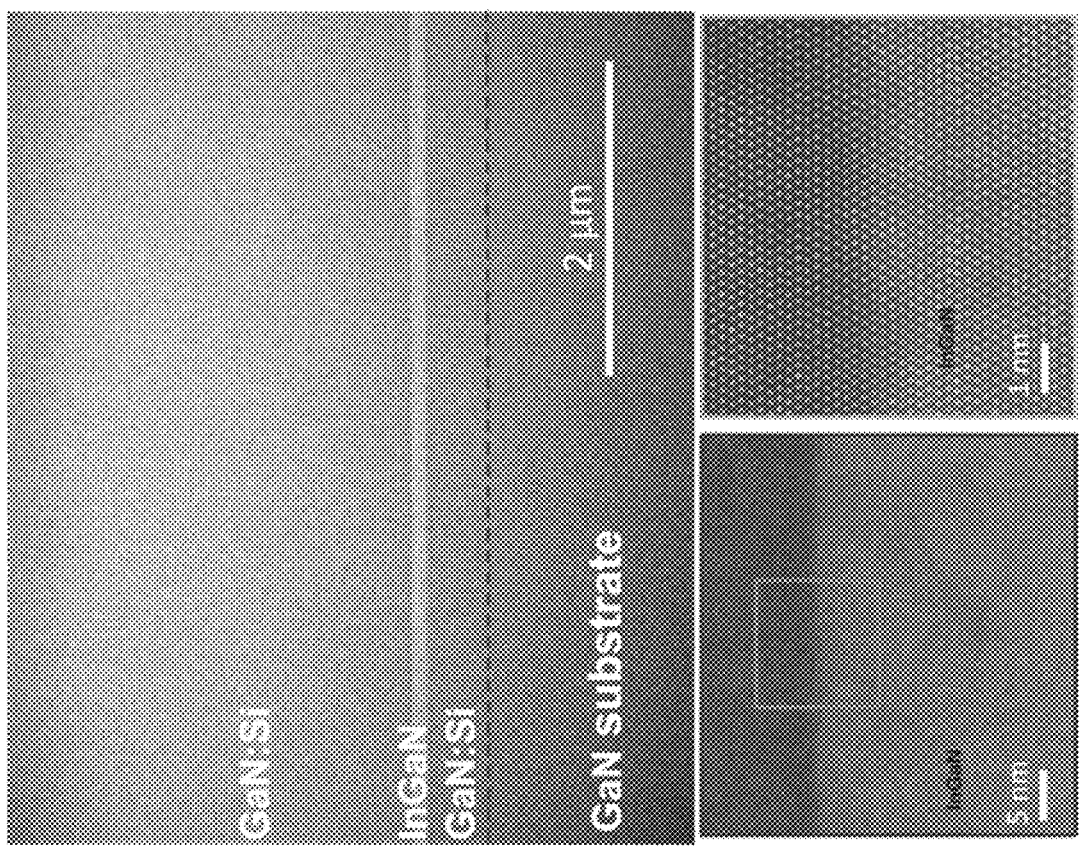
FIG. 12 includes transmission electron microscope (TEM) images of a cross-section of epitaxial layers grown on a GaN wafer.

FIG. 11 shows three AFM images measured across a 2-inch bulk GaN wafer after epitaxial growth. The variation of miscut on the bulk GaN is likely the primary cause for the changing surface morphology across the wafer. With increasing miscut, the surface changed from a bilayer-only structure (FIG. 11a) to a meandering step surface (FIG. 11c). The surface roughness root-mean-square (RMS) value varied from 0.15 to 0.35 nm accordingly. No pits associated with surface termination of dislocations were observed. To further evaluate the structural quality of the homoepitaxy and use of InGaN as the release layer, XRD reciprocal space map (RSM) measurements and cross-sectional TEM studies were conducted. RSM measurements confirmed that the InGaN was fully strained, and no relaxation was observed. This is further evidenced by the high-quality interfaces revealed by TEM images shown in FIG. 12. Very sharp interfaces were obtained, and no misfit dislocations were observed, suggesting no relaxation of the epitaxial films, consistent with RSM measurements. Furthermore, no obvious growth interface could be observed at the MOCVD/HVPE GaN interface, suggesting ideal homoepitaxial growth.

FIGS. 1-5 illustrate the process that was used to lift off the GaN epitaxial layers and transfer them to a new substrate. The metal support layer was patterned with cross-shaped perforations 250-μm wide and on a pitch of at least 1 mm in accordance with FIG. 2. This was followed by a photoenhanced wet etch process using a KOH solution in accordance with FIG. 3 to etch vertically through the GaN device epilayers in the perforations down to the release layer. The etch stop layer reduced or eliminated etching of the substrate. Broadband UV illumination was supplied by an unfiltered Hg arc lamp to drive the nonselective wet etch process. Filtered UV illumination (energies below the bandgap of the etch stop layer and higher than the release layer) was then applied through the backside of the GaN or sapphire substrate to drive lateral etching of the InGaN release layer at the perforations, also using a KOH chemistry in accordance with FIG. 4. For both photoelectrochemical enhanced (PEC) wet etches, an external Pt cathode was connected to the topside metal contact. After the lateral etch was completed, the released GaN foil was then attached to a low-cost carrier (for e.g., Si) using a bonding layer.

In this example an SU-8 epoxy layer was used to bond the device layers (e.g., GaN foil) to the carrier. In other embodiments, conductive metal bonding layers may be used for improved thermal conductivity as well as backside electrical contact. After bonding of the GaN ELO foil, the topside metal encapsulation layer (e.g., metal support layer) was removed using wet chemical etches.

Figure 13:
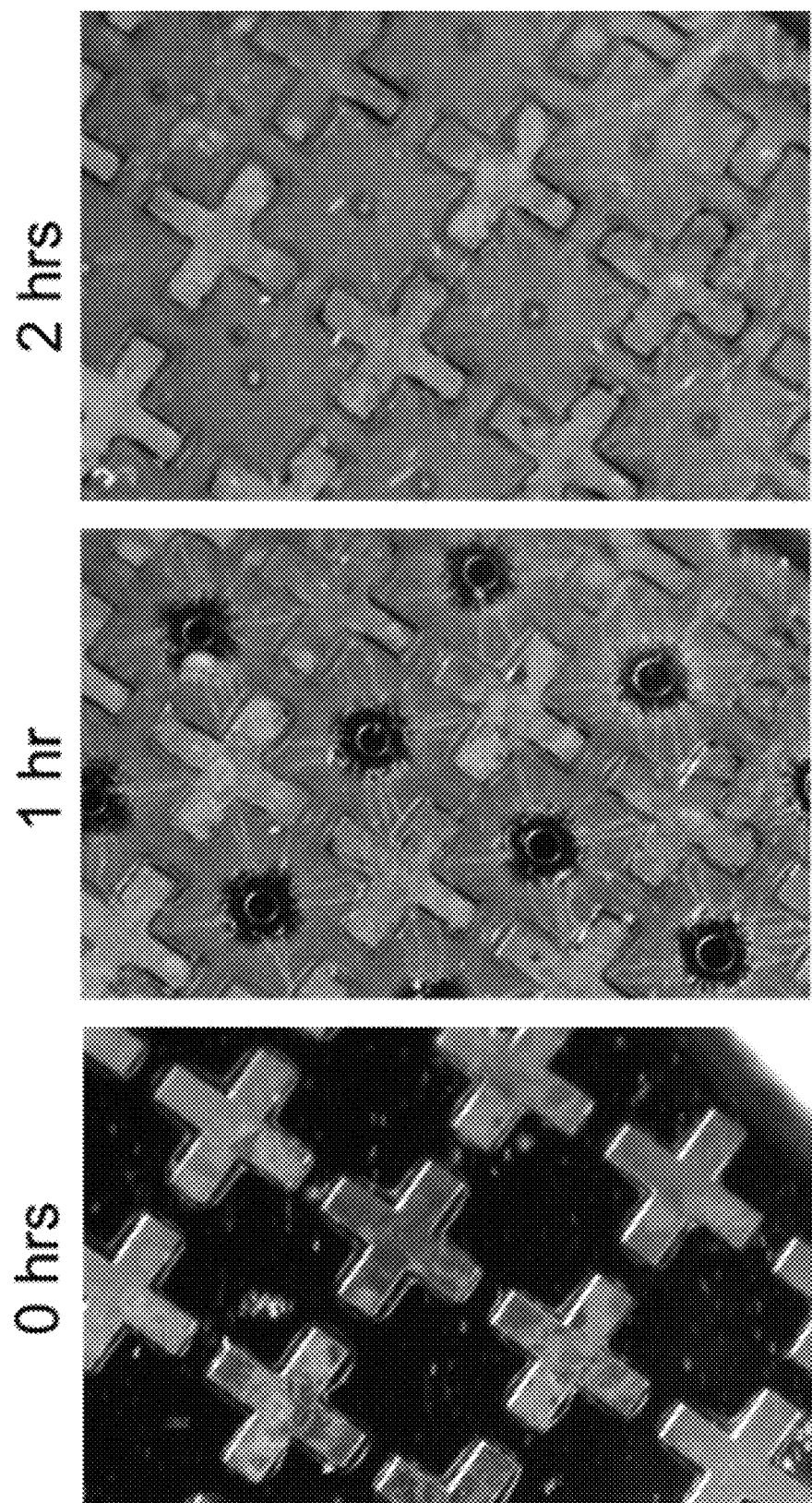
FIG. 13 includes a sequence of optical images recorded through the transparent backside of a bulk GaN wafer during the ELO lateral etch process.

FIG. 13 shows a sequence of optical images recorded through the transparent backside of a bulk GaN wafer during the ELO lateral etch process. In the first image, the cross perforations as well as the 1×1-mm² unit cells can be seen before the etch has started. After 1 hour of etching, a small, dark circular region about 0.2 mm across was visible at the center of each unit cell, corresponding to the etch front of the remaining, unetched release layer. The lateral etch rate was approximately 0.4 mm h$^{-1}$. After 2 hours the GaN film was completely released, as seen in the image on the right.

Figure 14:
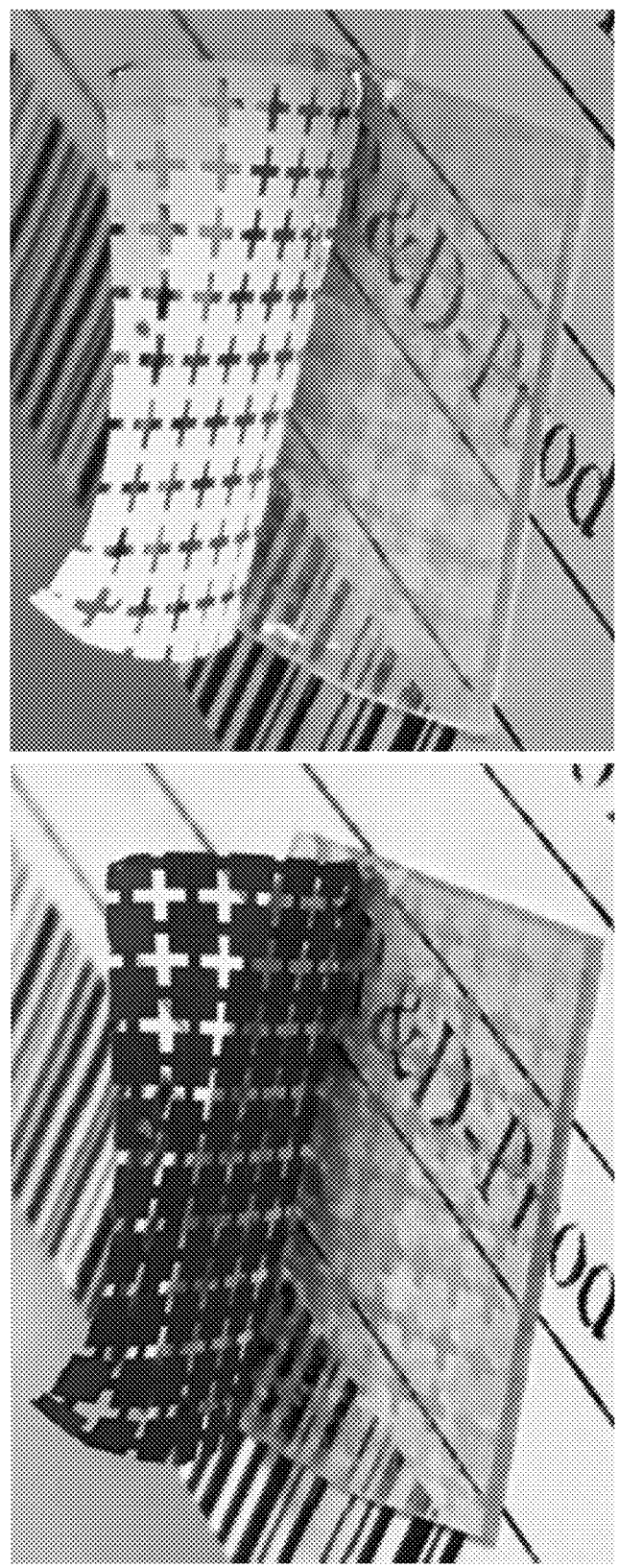
FIG. 14 includes two photographs of a GaN ELO foil that has been released from a GaN substrate.

The two photographs in FIG. 14 are of a 1-cm² GaN ELO foil that has been released from a bulk GaN substrate. The images show the backside, nitrogen face of the GaN foil supported by the metal layer on the topside. In the image at right, the foil is under 365 nm UV illumination which excites yellow luminescence in the GaN film. The GaN material can be seen to be uniform and intact across the entire foil.

Figure 15:
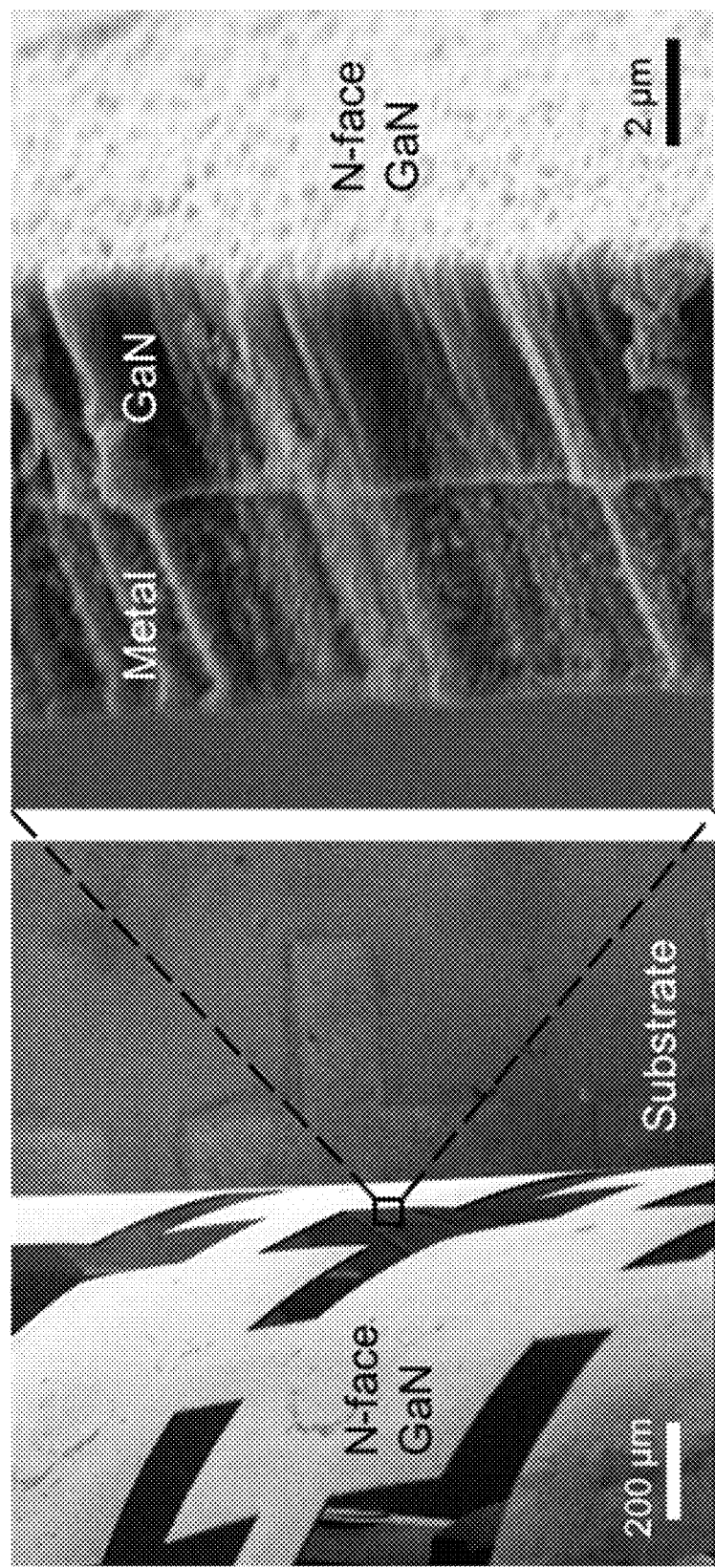
FIG. 15 includes SEM images of a similar GaN structure lifted off from a sapphire substrate.

FIG. 15 shows SEM images of a similar GaN structure lifted off from a sapphire substrate. The low-magnification image at left shows the cross perforations and the backside (nitrogen face) of the released foil. The high-magnification image on the right details the edge of a cross perforation, where the metal support layer and 5 μm thick GaN epitaxial film can be seen in cross section. The morphology of the backside GaN surface is fairly smooth after etching of the adjacent release layer, with a granular, submicron texture.

A Bede D1 system (source slit=250 μm, detector slit=500 μm) was used to perform XRD evaluation of crystal quality of the ELO layer structures before and after lift-off. Table 1 below summarizes results from 002 symmetric ω-2θ scans for samples lifted-off from both sapphire and bulk GaN substrates. After lift-off, both samples grown on GaN and sapphire showed similar peak broadening values, 190 and 200 arcsec, respectively. The peak width measured on bulk GaN films was broader after lift-off than before. The broadening of the symmetric XRD peaks is affected primarily by the screw-type dislocation density, surface roughness, wafer/film bow, and the film thickness, among other factors. In addition to a reduction in film thickness, the curvature of the transferred GaN thin film may have increased due to nonplanarity in the mounting process, which may contribute to the increased peak width.

TABLE 1

XRD 002 full width half max (FWHM) values as obtained from v-2u scans for 5-mm GaN films before and after ELO.

| GaN film | Before ELO | After ELO |
| --- | --- | --- |
| GaN-on-sapphire substrate | 170" | 200" |
| GaN-on-GaN substrate | 70" | 195" |

In an example embodiment, planar Schottky barrier diodes were fabricated on ELO GaN epitaxial structures grown on sapphire and their performance was evaluated both before and after epitaxial lift-off. The ELO process described herein enables devices to be fully fabricated and tested on-substrate before starting ELO. The device layers were encapsulated using a metal support layer, lifted off, and transferred to a new Si carrier wafer using an SU-8 epoxy bonding layer. The encapsulation support layer was removed by selective wet etching without damaging the ohmic and Schottky metal contacts. The performance of identical devices was directly compared before and after ELO.

Figure 17B:
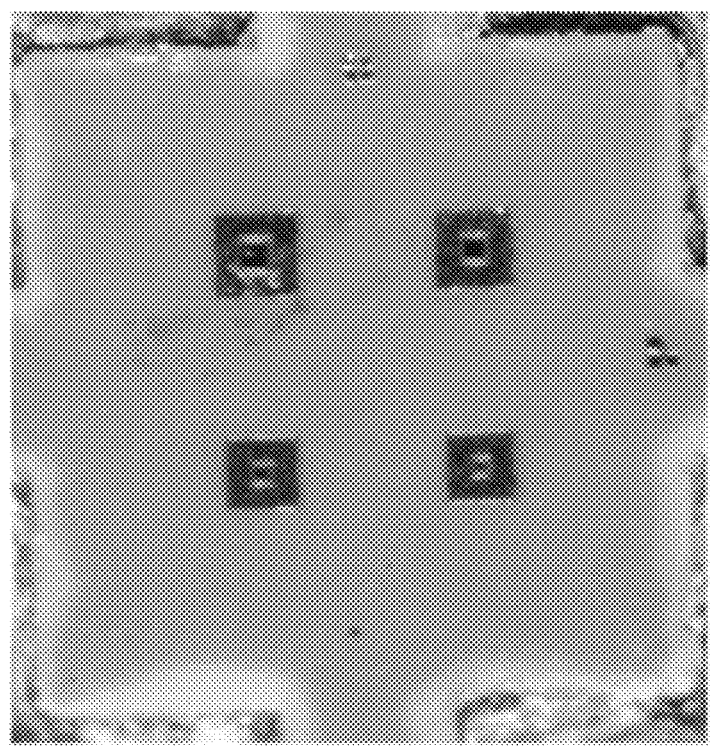
FIG. 17B is an optical images of the example Schottky device structures after ELO in accordance with some embodiments.
Figure 17A:
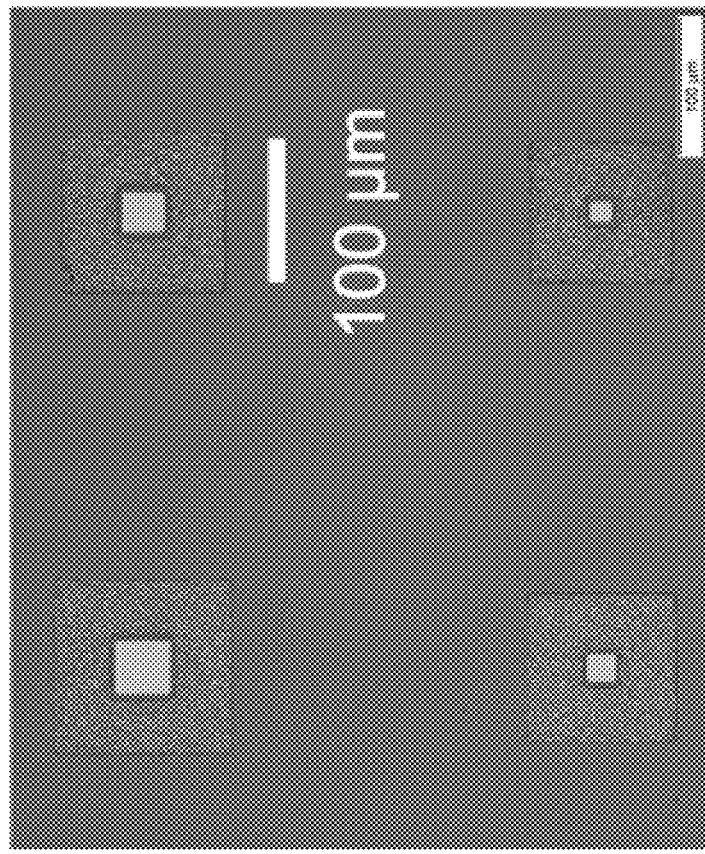
FIG. 17A is an optical image of the example Schottky device structures on a substrate in accordance with some embodiments.

FIG. 16A shows the Schottky device structure on-substrate and FIG. 16B shows the Schottky device structure after layer transfer. Ti/Al/Ni/Au ohmic contacts were deposited by electron beam evaporation and alloyed at 750° C. under nitrogen gas. Ni/Au Schottky contacts were then deposited by electron beam evaporation and are unannealed. FIGS. 17A and 17B show optical images of the completed devices before and after ELO.

Figure 18:
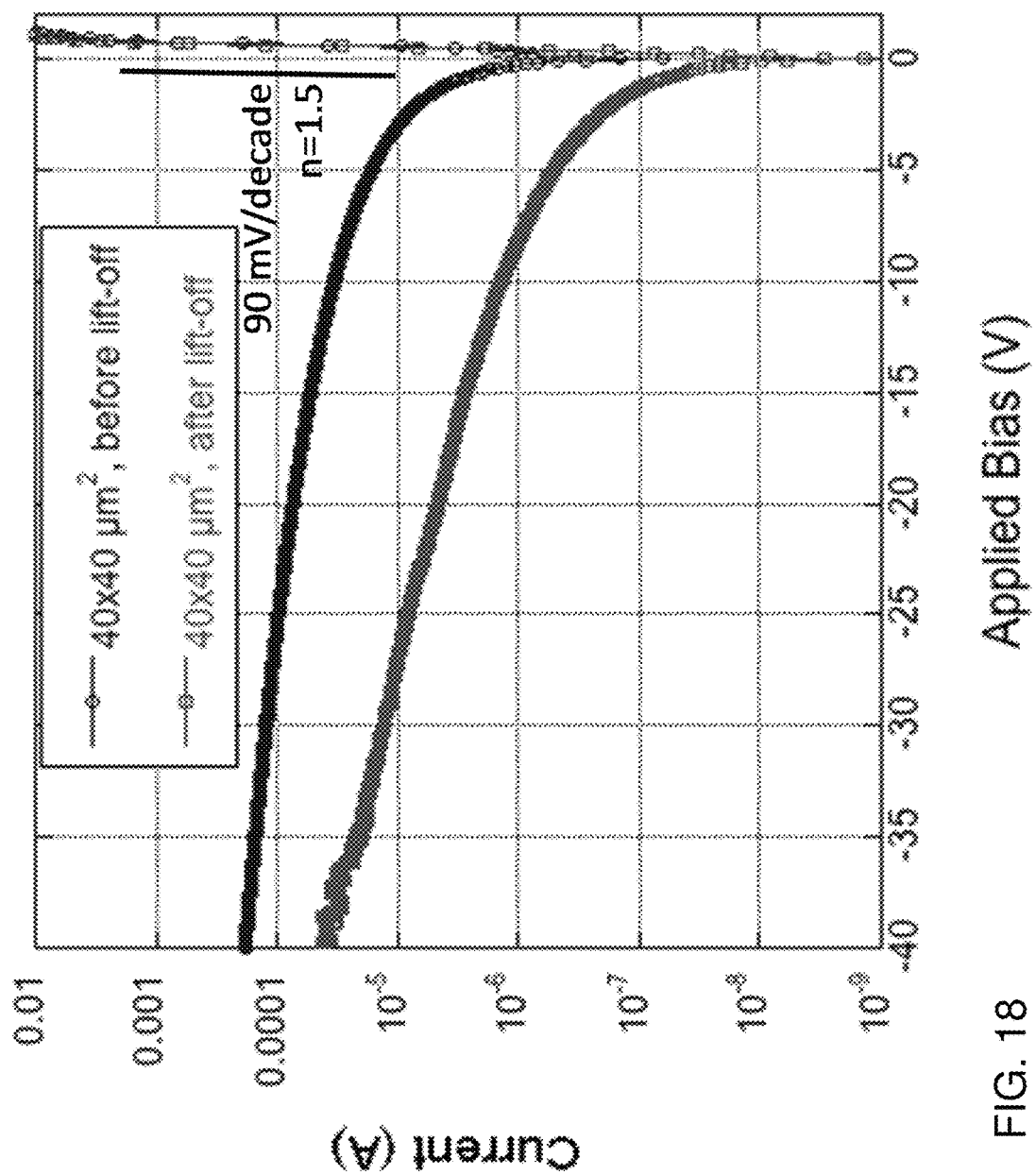
FIG. 18 is a graph of I-V curves measured on the Schottky devices structures of FIGS. 17A and 17B before and after lift-off.
Figure 19:
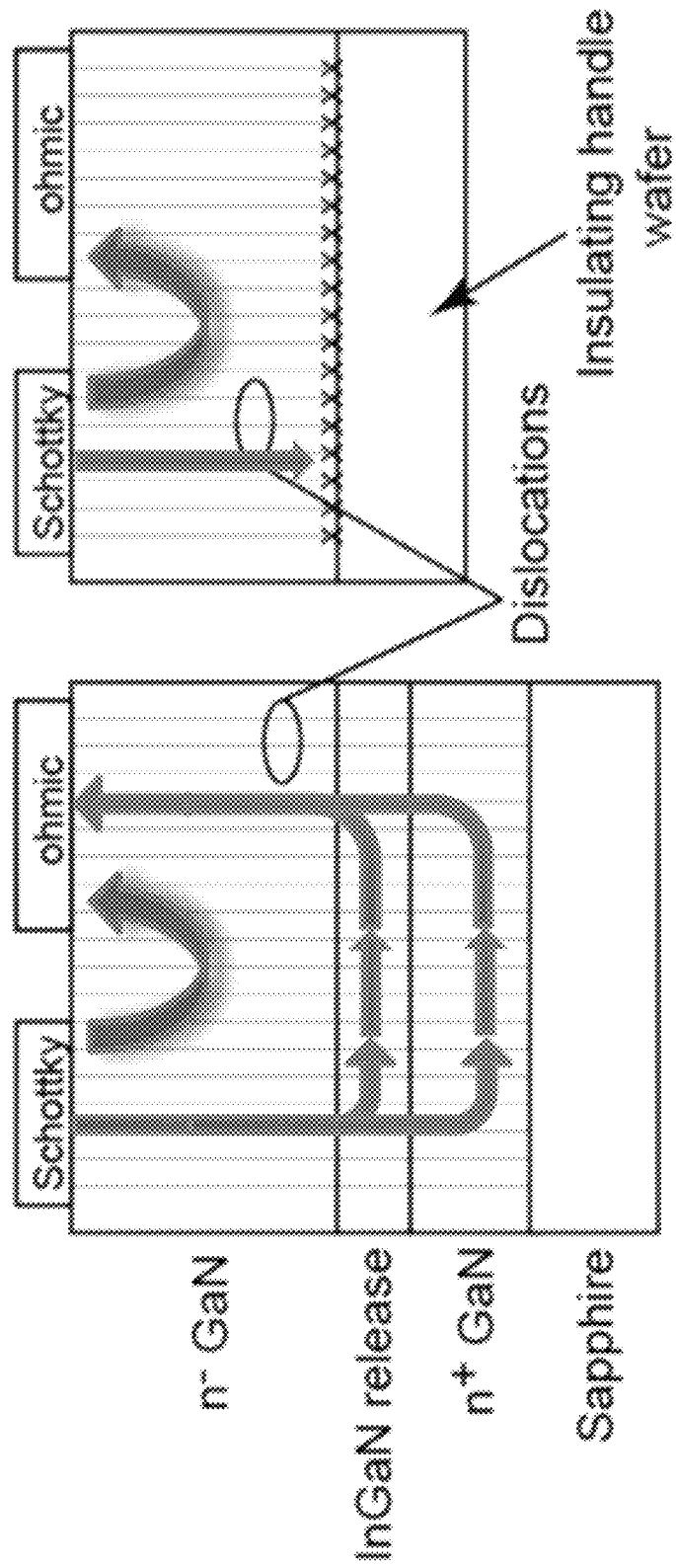
FIG. 19 schematically depicts a model explaining a reduction in reverse-bias leakage current in devices after lift-off.

I-V curves were measured on 40×40 μm² Schottky devices before and after lift-off, as summarized in FIG. 18. Well-behaved diodes were observed both before and after ELO, with a 90 mV/decade slope under forward bias, corresponding to an ideality factor of n=1.5. An unexpected result, however, was a reduction in reverse bias leakage current of approximately one order of magnitude after lift-off in the majority of devices tested. FIG. 19 schematically shows a model for a possible mechanism for this behavior. It has been well-established that dislocations contribute to leakage current in vertical GaN device structures. The devices in this work were grown on sapphire substrates, with a high dislocation density of approximately 10$^9$ cm². As shown in FIG. 9, an n-type GaN layer was grown beneath the InGaN release layer, which may provide a lateral conductive path between vertical dislocations that intersect the ohmic and Schottky contact pads, thereby increasing the leakage current. The ELO process removes this current path, with a consequent reduction in leakage current. Temperature-dependent measurements of the I-V characteristic as well as C-V measurements were performed on the devices before and after lift-off. These measurements indicated no substantial differences in barrier height or doping that could account for changes in the I-V characteristic.

This example demonstrated the feasibility of epitaxial lift-off and layer transfer of high-quality GaN epitaxial material using bandgap-selective etching of an InGaN release layer for films on both sapphire and bulk GaN substrates. Compared with alternative ELO approaches, an InGaN release layer according to example embodiments allowed the use of conventional MOCVD growth of the release layer and high-quality device epitaxial material. A perforated ELO process using a regular pattern of holes across the wafer enabled rapid and distributed etching of the release layer across large areas. This approach allows scaling of the process to arbitrary wafer sizes, and has been used to lift off GaN epitaxial material at the wafer scale from a 4-inch sapphire substrate in less than 2 hours. Forming of the etch stop layer between the release layer and the GaN substrate enabled reuse of GaN substrate. As described above, the etch stop layer reduced or eliminated vertical etching of the GaN substrate.

Characterization of the ELO GaN epitaxial growth structure on native GaN substrates was carried out using XRD, AFM, and TEM. RSM measurements showed that the InGaN and GaN was unrelaxed and intact after the growth of five microns of GaN material. The AFM showed RMS roughness values between 0.15 and 0.35 nm, with morphology that varied with the miscut across the GaN substrate, and free of dislocation-related pits. Cross-sectional TEM showed high-quality growth of GaN above the release layer that was free of dislocations. XRD was performed on released GaN device layers before and after ELO. FWHM linewidths for GaN-on-sapphire films did not change after ELO. Linewidths for device layers released from native GaN substrates increased approximately two times after ELO, but were comparable to values for device layers grown on sapphire.

Schottky barrier diodes were fabricated on GaN-on-sapphire epitaxial material and their performance was compared before and after ELO. Well-behaved diodes were measured before and after release, but the reverse-bias leakage current of ELO diodes decreased by one order of magnitude. An example embodiment includes a mechanism for this behavior in which diode leakage current is increased by conduction through dislocations and laterally through an n-GaN layer beneath the release layer. The lateral leakage current path was removed after release of the device layers from the substrate and transfer to an insulating carrier. This result further supports the importance of using GaN material with low threading dislocation density for improving the performance of vertical GaN devices.

Figure 20:
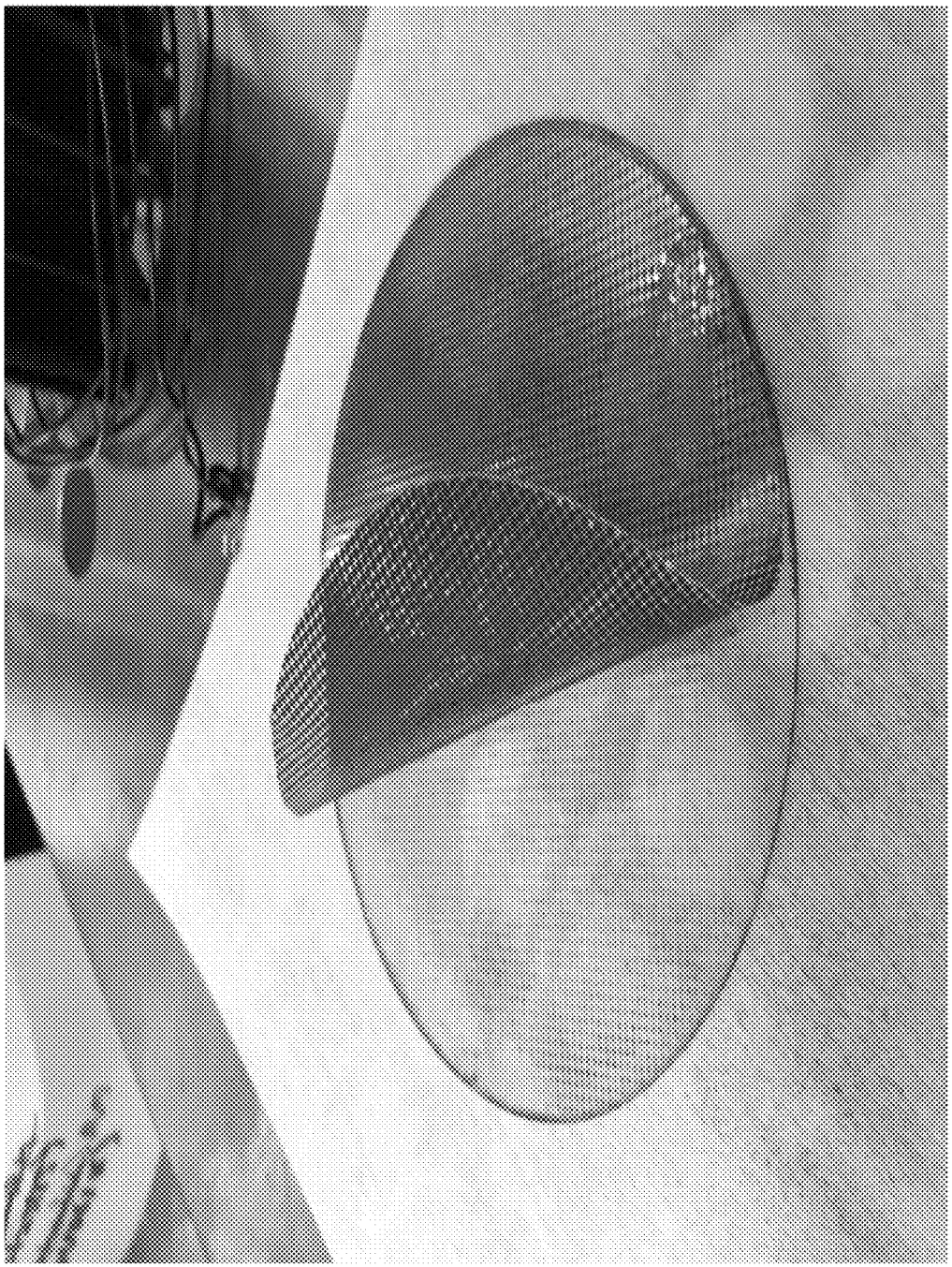
FIG. 20 is an image of resulting GaN device layers after 4 inch wafer-scale ELO from a sapphire substrate using systems and methods described in some embodiments of the present disclosure.
Figure 21:
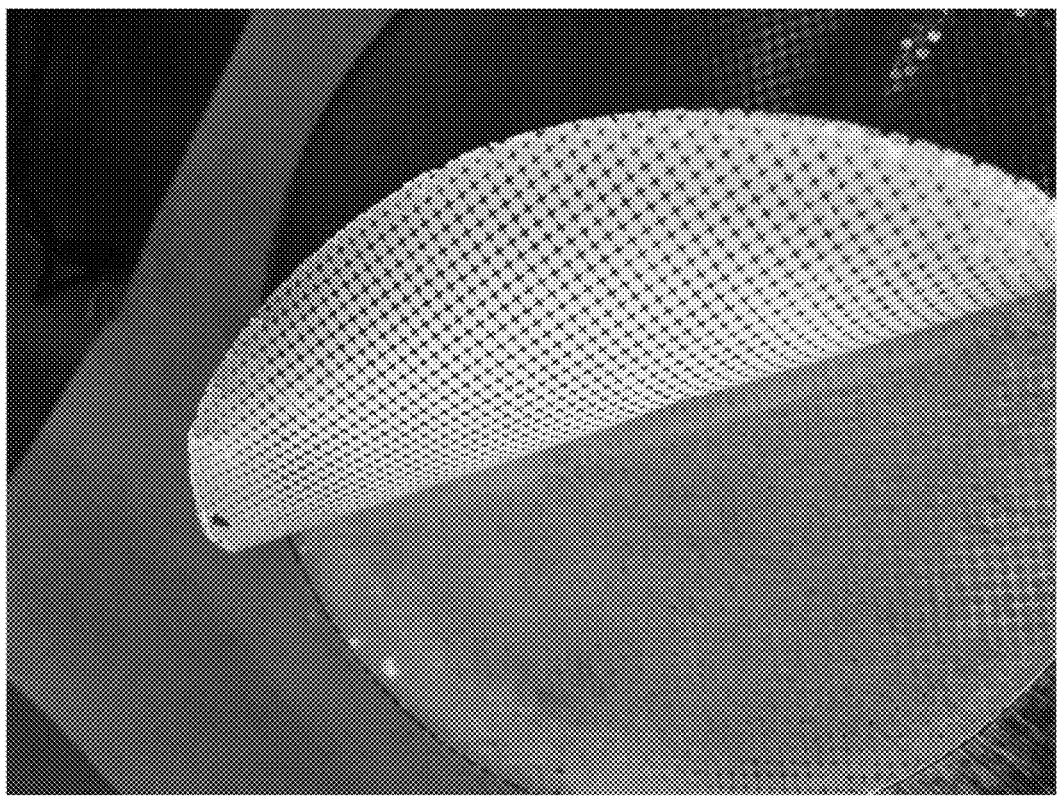
FIG. 21 is an image of the resulting substrate-free GaN device layers of FIG. 20 as illuminated using ultraviolet light.
Figure 22:
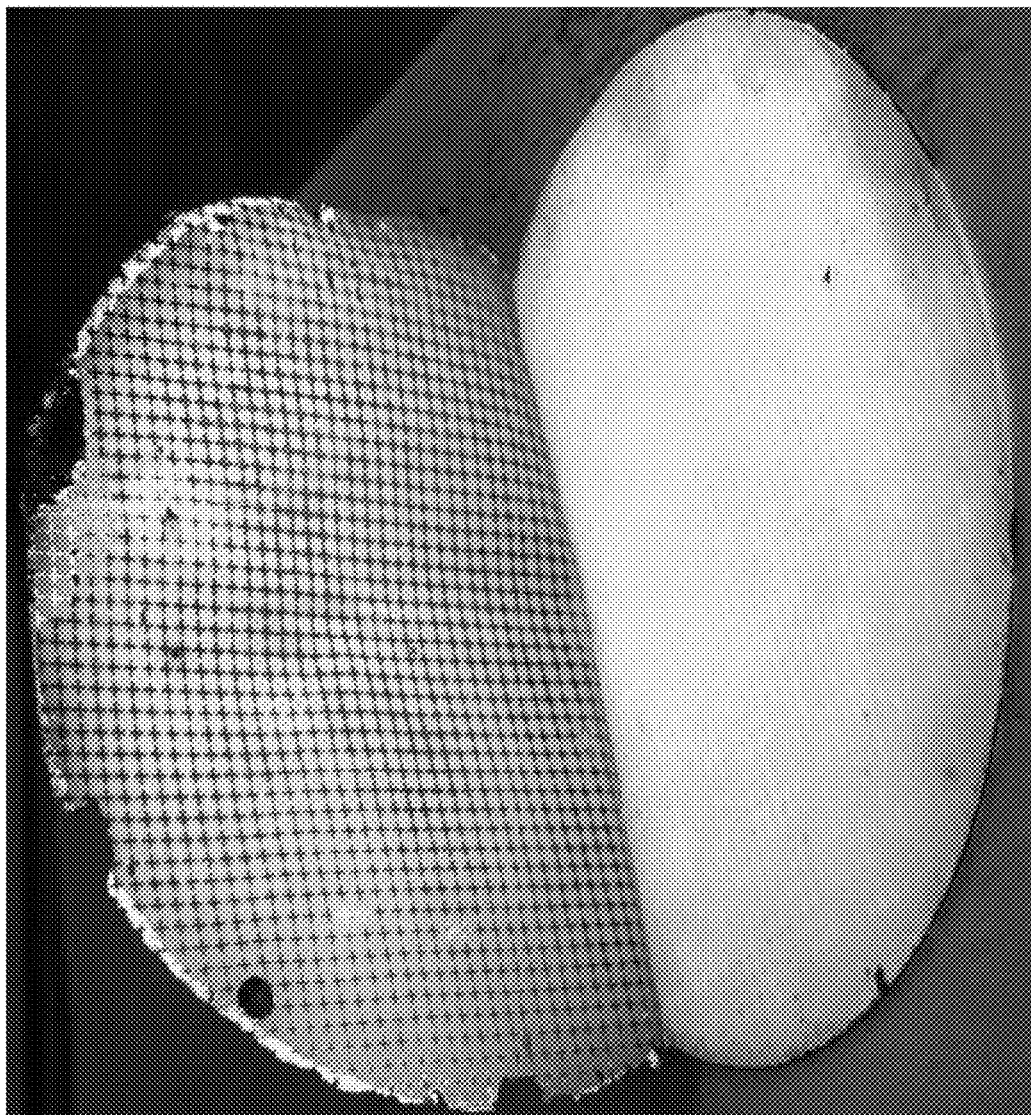
FIG. 22 is an image of resulting GaN device layers after 2-inch wafer-scale ELO from a bulk GaN substrate using systems and methods described in some embodiments of the present disclosure.

FIGS. 20 and 21 illustrate an example of GaN ELO from a 4-inch sapphire. FIG. 22 illustrates GaN ELO from 2-inch bulk GaN.

Other Embodiments

Figure 23A:
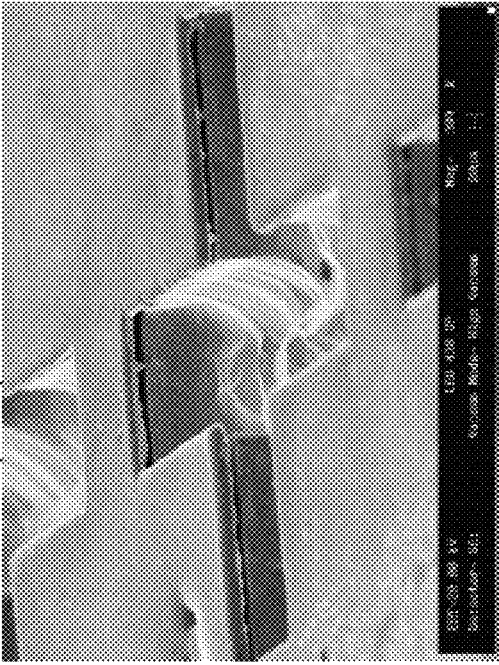
FIG. 23A is an electron microscope image of a feature etched into the semiconductor stackup over a period of 8 hours with a 0.04 M KOH etch, in accordance with some embodiments.

Other embodiments involve deep photoenhanced wet etching of bulk GaN substrates. The feasibility of LED-based deep photoenhanced wet etching using thick bulk GaN substrates is demonstrated in FIGS. 23A, 23B, 23C, 23D, 24 and 25. FIG. 23A is a SEM image of a feature etched into a gallium nitride (GaN) bulk substrate using systems and methods described in embodiments of the present disclosure. SEM images of the same feature at progressively greater zoom levels appear in FIG. 23B and FIG. 23C. In some embodiments, the feature is a cross-shaped feature etched into the semiconductor device.

The cross-shaped feature was etched to a depth of 125 microns using a stirred 0.04 M KOH etching solution 212 in the system 200 described above. This deep etching was carried out on the gallium face of a bulk GaN substrate 100 with a thickness of 400 microns (SCIOCS Company Limited, Hitachi, Japan) having a 15-micron epitaxial layer. In this example, the etch rate was approximately 15 microns/hour, and etching proceeded for 8 hours. The etch profile is remarkably vertical, driven by the directionality of the incident light. FIG. 23C illustrates a close-up view of the metal etch mask layer, the 15-μm-thick n-GaN epitaxial layer, and the bulk GaN substrate grown by hydride vapor phase epitaxy (HYPE). In accordance with some embodiments described herein, a resulting structure etched into the substrate or into one or more layers of the substrate has a depth of greater than 10 micrometers. The depth of the resulting structure can be in a range from 10 micrometers to 500 micrometers in some embodiments.

Figure 23B:
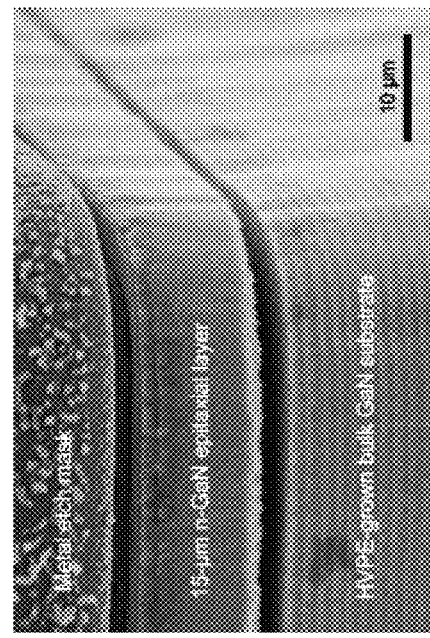
FIG. 23B is the electron microscope image of FIG. 23A zoomed in to show details of the feature etched in the semiconductor stackup.
Figure 23C:
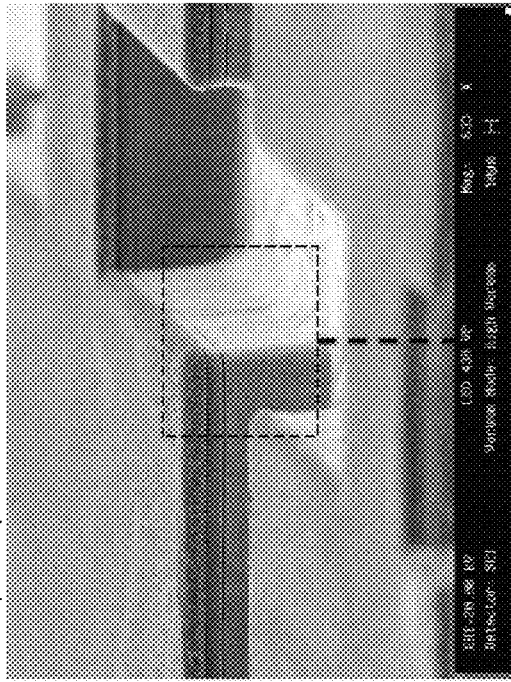
FIG. 23C is the electron microscope image of FIG. 23B zoomed in further to show details of the feature etched in the semiconductor stackup.
Figure 23D:
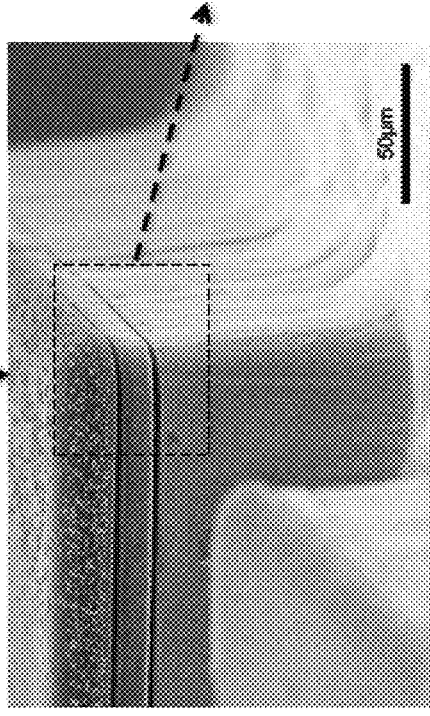
FIG. 23D is an electron microscope image of a feature etched into the semiconductor stackup over a period of 12 hours with a 1 M KOH etch, in accordance with some embodiments.

FIG. 23D is an SEM image of a feature etched into a GaN bulk substrate under different conditions than the feature of FIGS. 23A-23C in accordance with various embodiments described herein. The cross-shaped feature shown in FIG. 23D was etched in a 1 M KOH chemistry for 12 hours. The feature was etched to a depth of 200 microns. As can be seen in the figures, the characteristics of etched features can differ at different etchant concentrations. For example, higher etchant concentrations can produce faster etch rates, but they also tend to produce features that are more crystallographic (i.e., the etch hews strongly to crystallographic planes).

Figure 24:
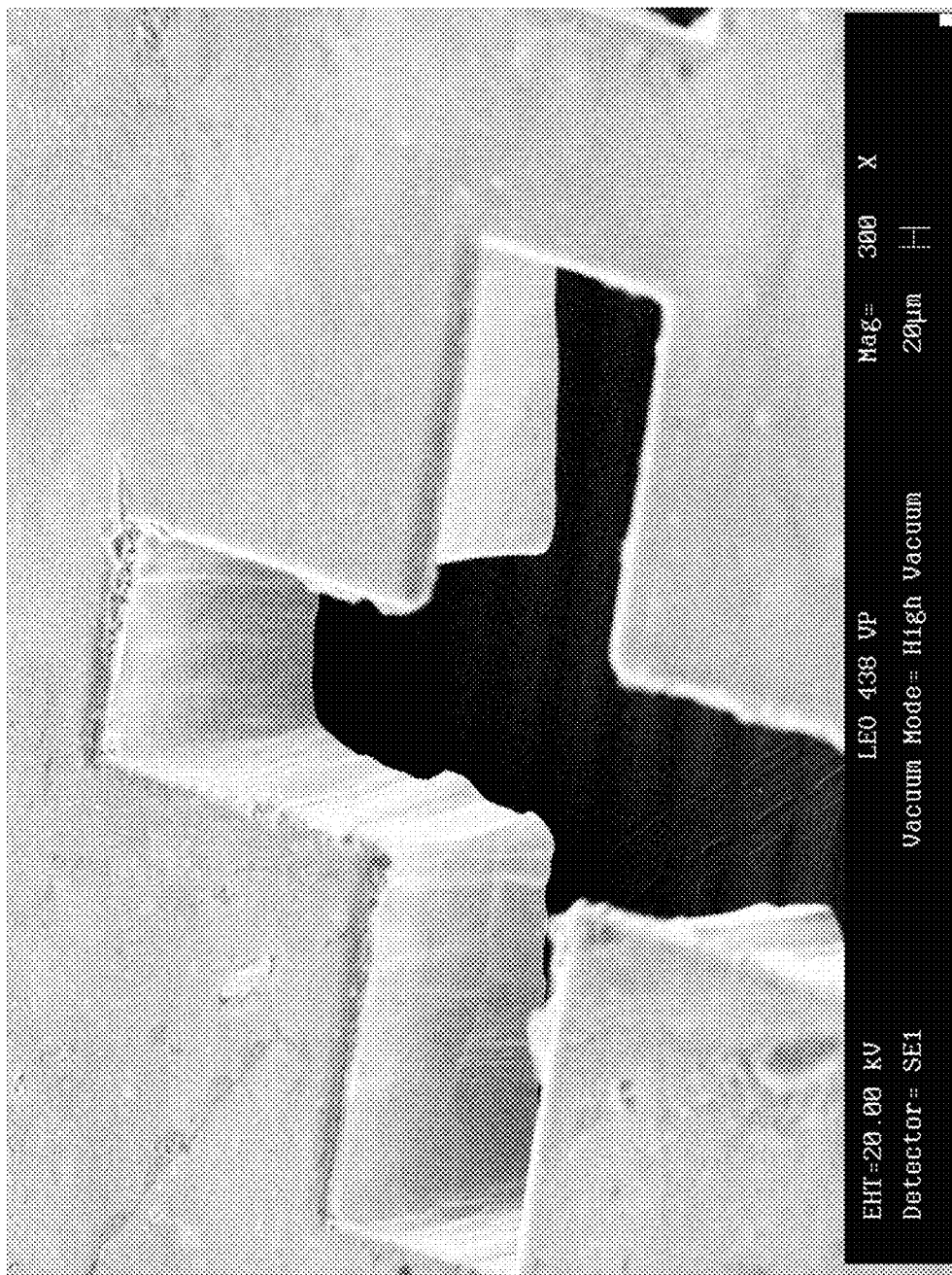
FIG. 24 is an electron microscope image from a perspective view of a perforation feature that was etched through a 400 micron thick GaN wafer over a period of 24 hours in accordance with an embodiment.
Figure 25:
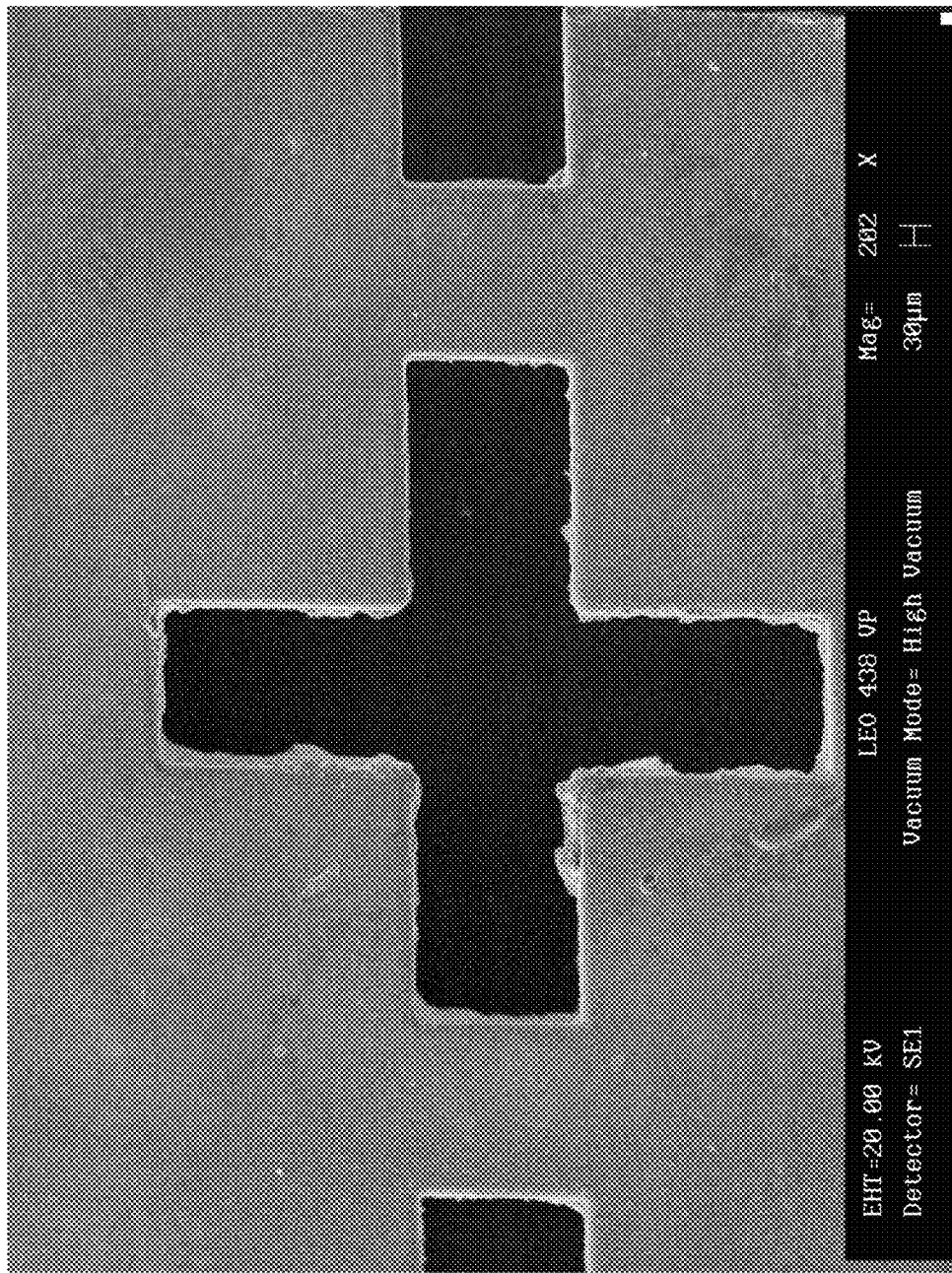
FIG. 25 is an electron microscope image from a plan view of the perforation feature of FIG. 24.

In some embodiments, systems and methods described herein can be used to form through-substrate via holes. FIGS. 24 and 25 illustrate different views of a feature etched completely through a 400 μm thick bulk GaN substrate using systems and methods described in embodiments of the present disclosure. The feature was etched over a longer period of time, approximately 24 hours. The feature was etched entirely through the 400-micron thickness of the bulk GaN substrate 125. In some embodiments, features etched entirely through layers disposed over the front surface of the substrate enable access to deeper layers in a system from the front side of a layer stackup or even enable access to the front surface of the substrate 125. In some embodiments, through-substrate features etched entirely through the substrate from the back surface of the substrate enable access to deep layers disposed over the front surface of the substrate from the back side of the substrate. In some embodiments, systems and methods described herein enable dicing of wafers into smaller chips. Similar to the technique used to create features as shown in FIGS. 24 and 25, the high aspect-ratio etching described herein can be used for device singulation by etching trenches through the substrate to separate different devices located at different positions on the substrate.

Figure 26:
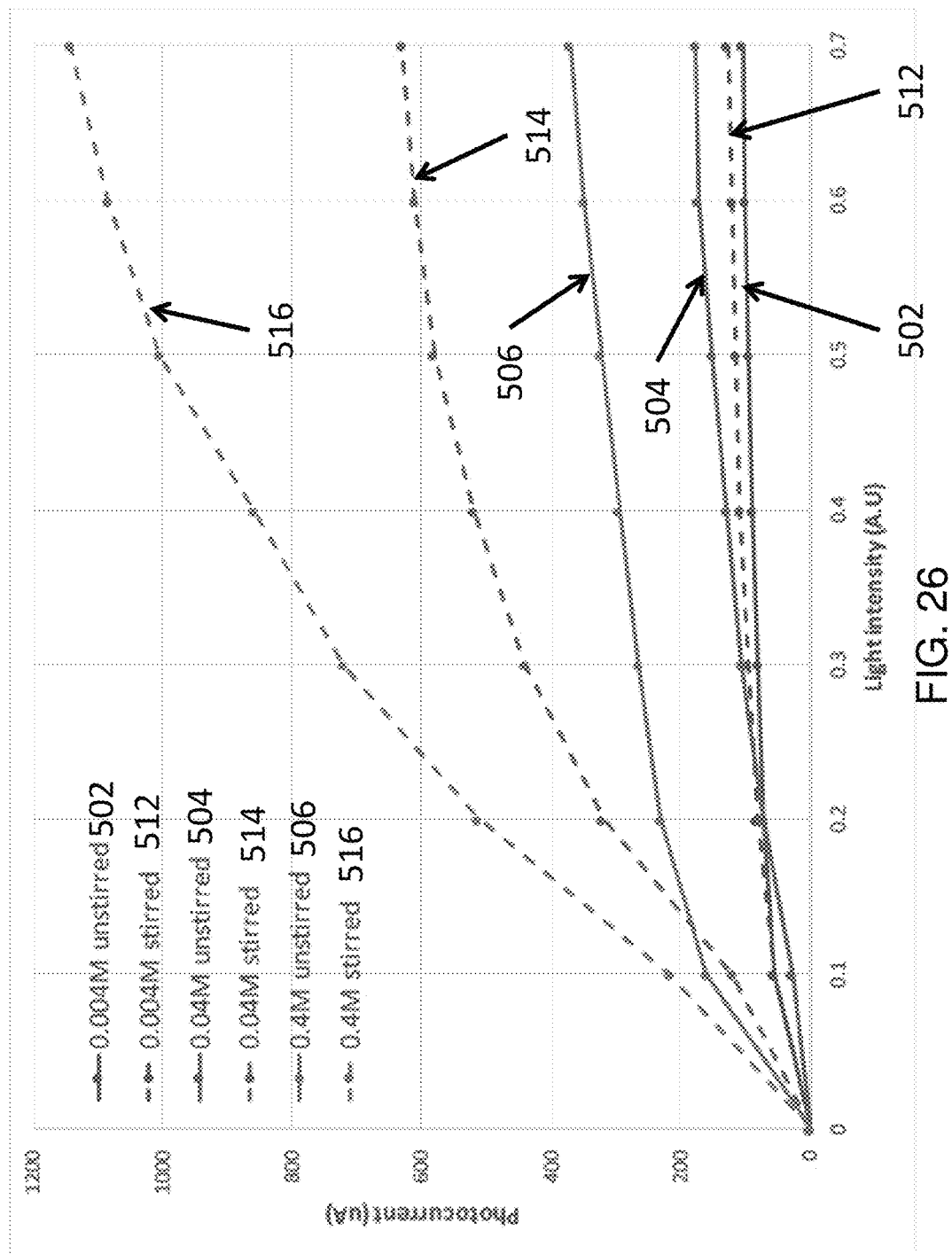
FIG. 26 is a graph of measured photocurrent versus light intensity in systems under different etchant concentration and stirring conditions according to some embodiments described herein.

FIG. 26 illustrates measured photocurrent in systems 200 under different etchant concentration and stirring conditions according to various embodiments described herein. By changing stirring and etchant concentration conditions, the kinetics of PEC etching methods can be determined. Because it is more difficult to grow good quality electronic material on the N-face of a C-plane material, GaN-based devices are more often made on the Ga-face of a GaN substrate. Accordingly, much of the experimental data below is from etching on the Ga-face of a C-plane material. However, in some embodiments, etching could be performed on the N-face of a substrate, such as to form vias or for dicing. In some embodiments, semipolar or nonpolar substrates, such as M-plane or A-plane GaN substrate could be used.

The depicted curves show Ga-face photocurrent as a function of light intensity, KOH concentration, and stirring. The proportionality of photocurrent to etch rate is shown. The curves 502 and 512 illustrate photocurrent for the system 200 with a 0.004 M KOH etching solution 212 wherein the solution is unstirred and stirred, respectively. The curves 504 and 514 illustrate photocurrent for the system 200 with a 0.04 M KOH etching solution 212 wherein the solution is unstirred and stirred, respectively. The curves 506 and 516 illustrate photocurrent for the system 200 with a 0.4 M KOH etching solution 212 wherein the solution is unstirred and stirred, respectively. Increasing the etchant concentration in the etching solution 212 and stirring the etching solution 212 (e.g., using a stirring mechanism 219) create increased photocurrent generation and, thus, increased etch rates.

Figure 27:
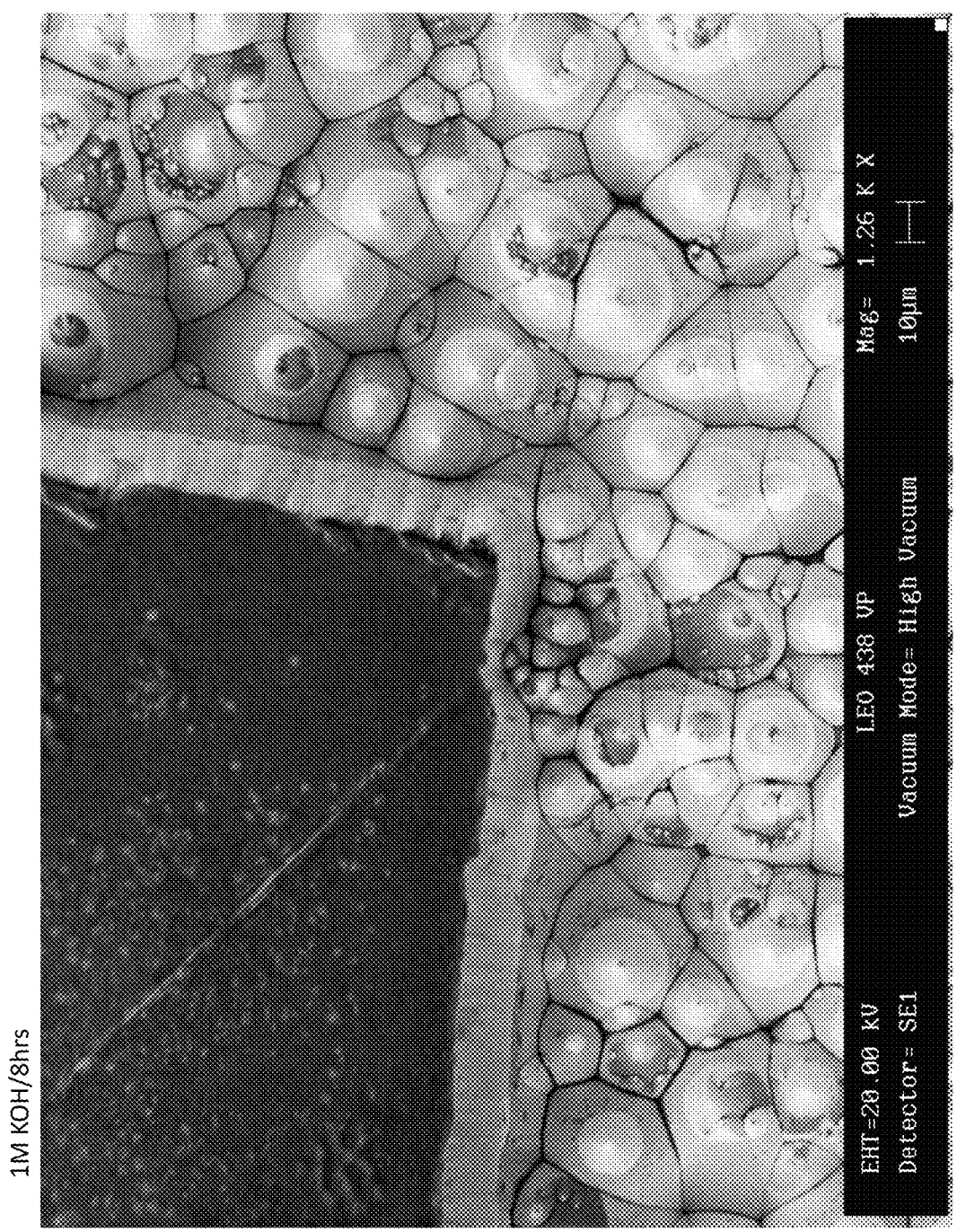
FIG. 27 is an electron microscope image of a plan view of nitrogen-face deep etching of a GaN substrate using a relatively higher concentration of KOH in the etching solution in accordance with some embodiments described herein
Figure 28:
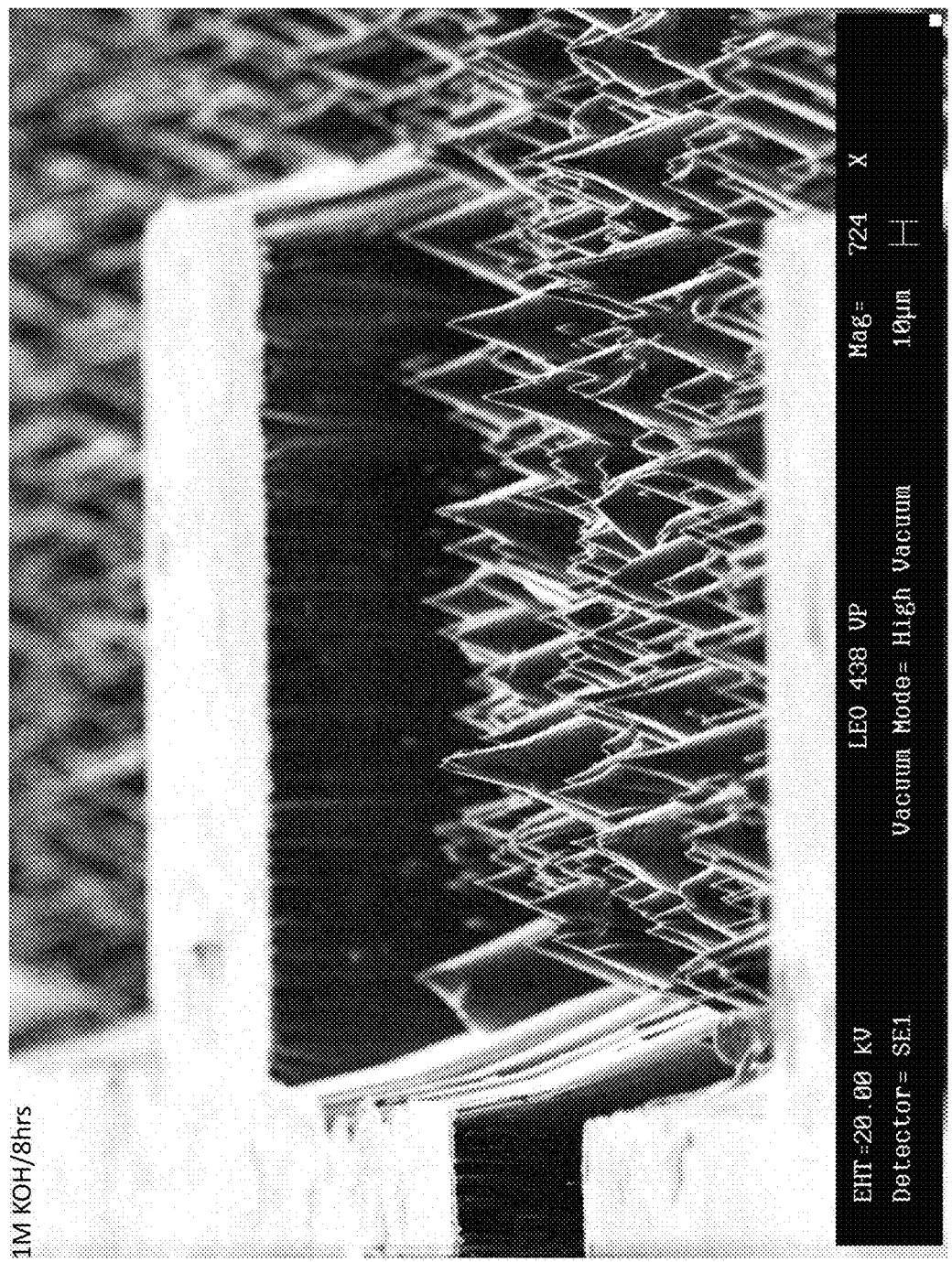
FIG. 28 is an electron microscope image of a perspective view of the etched GaN substrate of FIG. 27.

FIGS. 27-28 include SEM images of different views of nitrogen-face deep etching of a GaN substrate using a relatively higher concentration of KOH in the etching solution in accordance with various embodiments described herein. For a bulk GaN substrate, growth and etching of GaN typically occurs on the gallium face of the wafer for C-axis GaN materials. As such, the substrate 100 can be oriented such that the front surface 126 of the substrate 100 is the gallium face. However, etching of the nitrogen face (i.e., the back surface 127) has potential benefits. For example, etching of the nitrogen face can be used to thin the substrate 100 to reduce the thermal resistance. Due to the different crystallography of the nitrogen face, large cone structures resulted from etching on the nitrogen face but not from etching on the gallium face.

Figure 29:
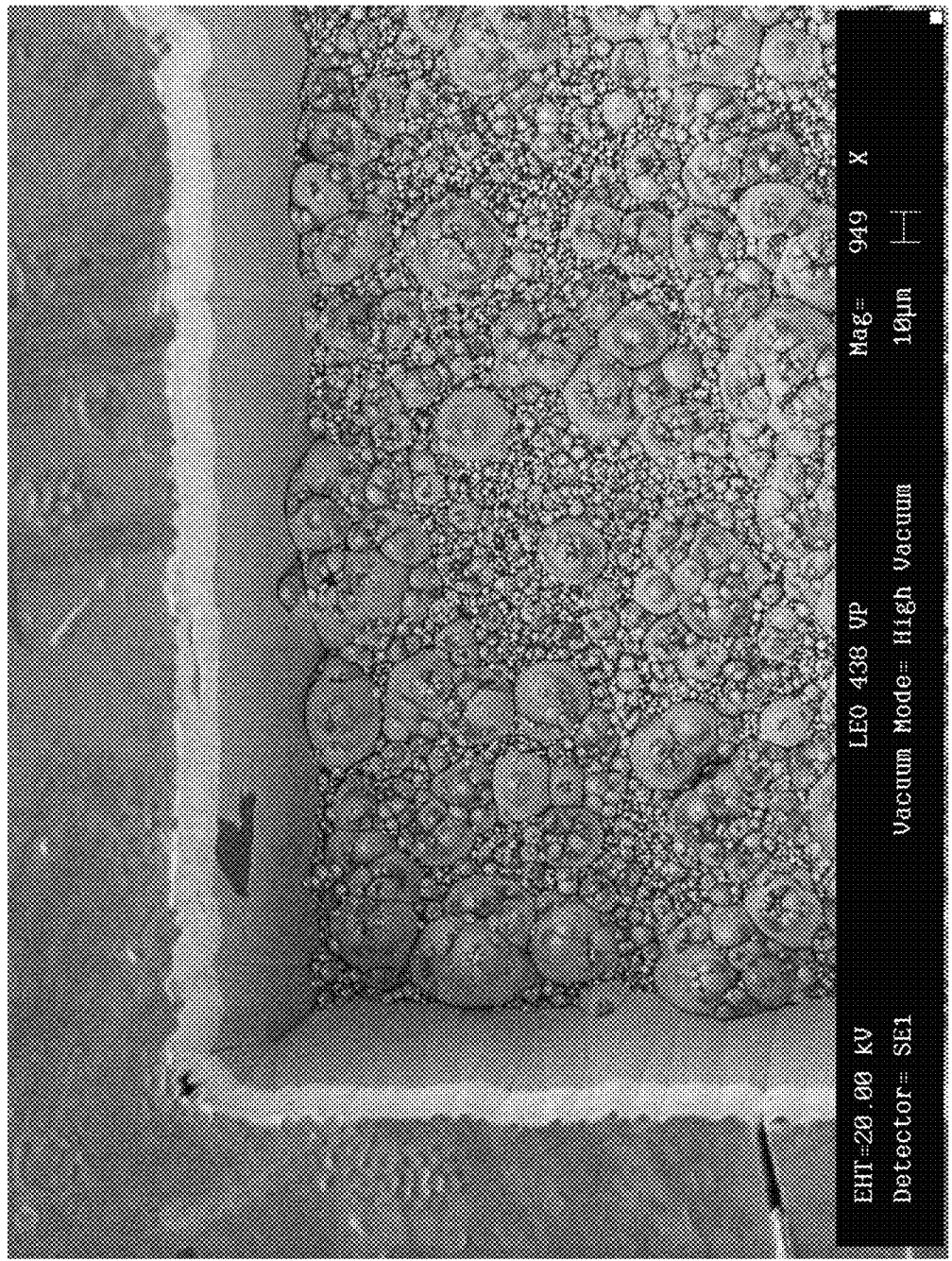
FIG. 29 of a plan view of nitrogen-face deep etching of a GaN substrate using a relatively lower concentration of KOH in the etching solution in accordance with some embodiments described herein.
Figure 30:
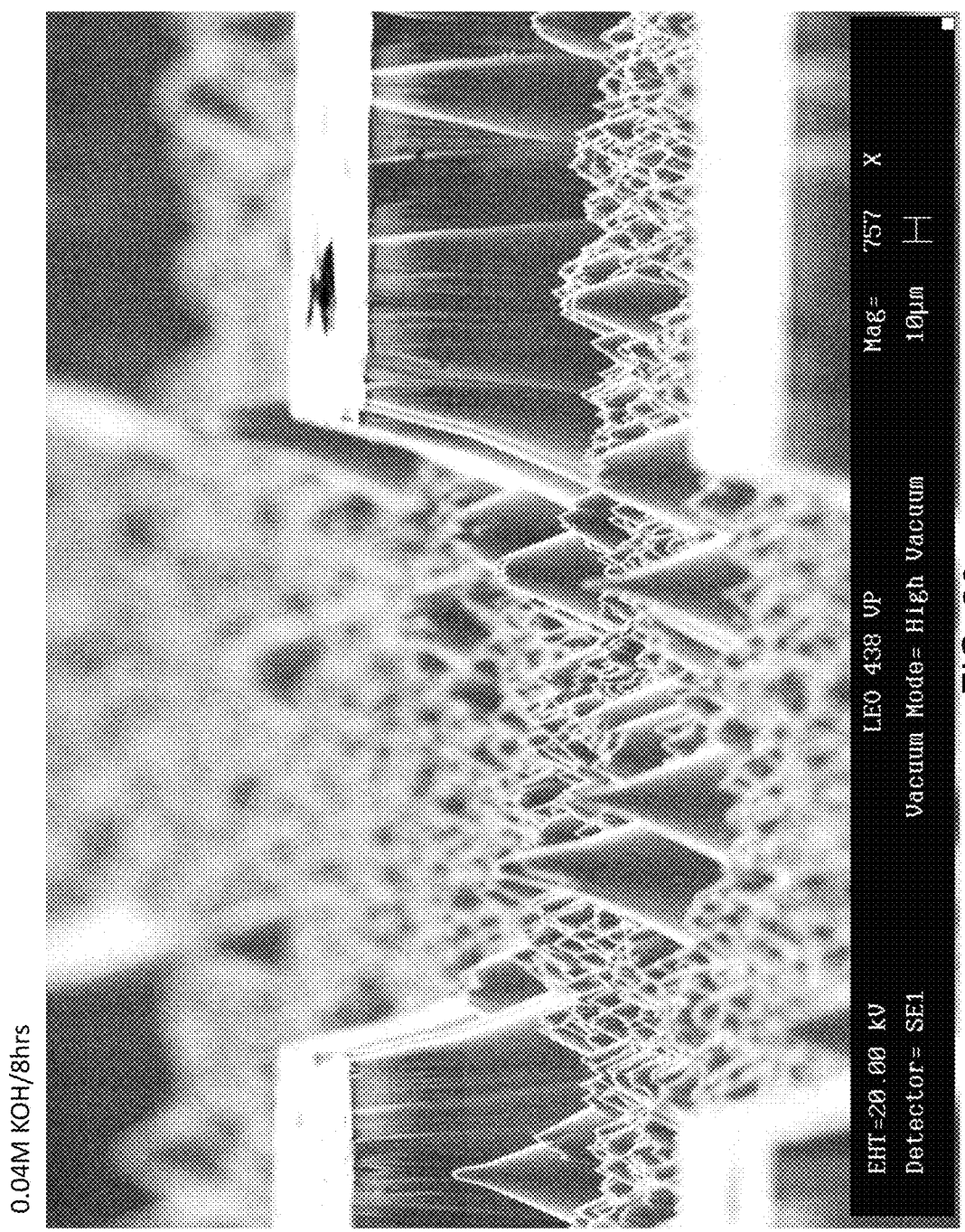
FIG. 30 is an electron microscope image of a perspective view of the etch GaN substrate of FIG. 29.

FIGS. 29-30 include SEM images of different views of nitrogen-face deep etching of a GaN substrate using a relatively lower concentration of KOH in the etching solution in accordance with various embodiments described herein. Cone formation is dependent upon KOH concentration. Whereas the substrate 100 shown in FIGS. 8-9 was exposed to a concentration of 1M KOH for 8 hours, the substrate shown in FIGS. 10-11 was exposed to 0.04M KOH for 8 hours. As shown in FIGS. 8-9, greater concentrations of the etchant chemicals (e.g., KOH) can create large cone structures whereas lower concentrations of etchant creates less pronounced cone structures. In some embodiments, reduced formation of cones or formation of cones of reduced size could be useful for fabricating a smooth back surface 127 and, thus, reducing thermal resistance when etching the back surface 127 of the substrate 100. Conversely, large cone formation could be desirable in some embodiments, e.g., to provide texturing to improve light extraction for a light emitting diode device.

Figure 31A:
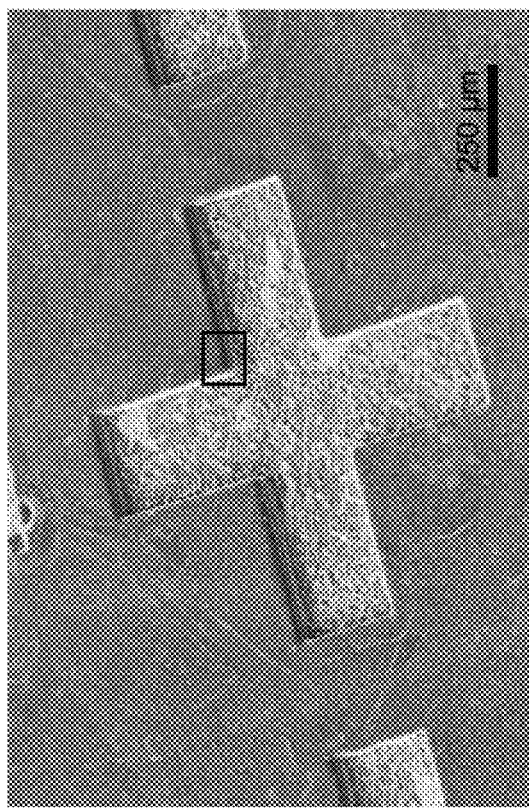
FIG. 31A is an electron microscope image of a substrate with perforations etched in it in accordance with some embodiments.
Figure 31B:
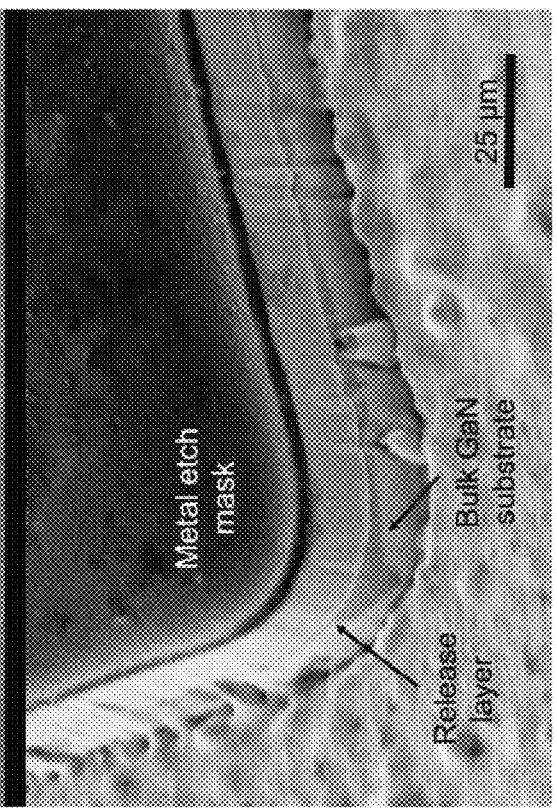
FIG. 31B is a detail of the electron microscope image of FIG. 31A showing details of the perforation etched in the substrate.

FIG. 31 is an SEM image of perforations formed in device layers grown on a bulk GaN substrate using systems and methods described in some embodiments of the present disclosure. FIG. 31B is an SEM image of a detail of a portion of FIG. 31A that shows distinct device layers and the substrate. As shown, the vertical depth of the etched portion extends through the metal etch mask, the epitaxial GaN layer, the release layer, and into the bulk GaN substrate.

Forming Low-Resistance Backside Ohmic Contacts

Vertical devices such as transistors, laser diodes, light-emitting diodes (LEDs), or solar cells have current flow perpendicular to the direction of the substrate with ohmic contacts on the top and bottom surfaces of the device. For power devices with high current densities, forming ohmic contacts with low resistance is critical to minimizing resistive losses. In some formulations, ohmic contact resistance can be reduced by creating a region of the semiconductor surface to which the metal contact is applied that has high levels of doping. High doping levels (for example, above $1 \times 10^{19}$ or $1E19$ $cm^{-3}$) enable tunneling of carriers through barriers at the metal-semiconductor junction, thereby lowering the contact resistance. Unfortunately, commercially available n-type gallium nitride substrates typically have doping in the range of $1 \times 10^{18}$ or $1E18$ $cm^{-3}$, which results in an unacceptable level of contact resistance. As a result, a highly doped layer must be created at the surface of the device before the electrical contacts are bonded to or formed on the device. In devices that are grown in an inverted manner (i.e., with the top surface of the device disposed first on the substrate) and separated from the substrate (e.g., using ELO), it is a significant burden to grow a highly doped layer on the top surface because the top surface is not exposed until the device is free-standing. In a free-standing device without substrate support, layer growth is inexact and has a high rate of failure.

Systems and methods disclosed herein can include a highly doped contact layer above the release layer for forming low-resistance backside ohmic contacts after epitaxial lift-off. The highly-doped contact layer is positioned above the release layer. When the resulting device is released from the substrate, the highly-doped contact layer, which contacts a top or bottom surface of the device structure, is immediately ready to be contacted by an electrical contact with minimal additional processing.

Figure 32:
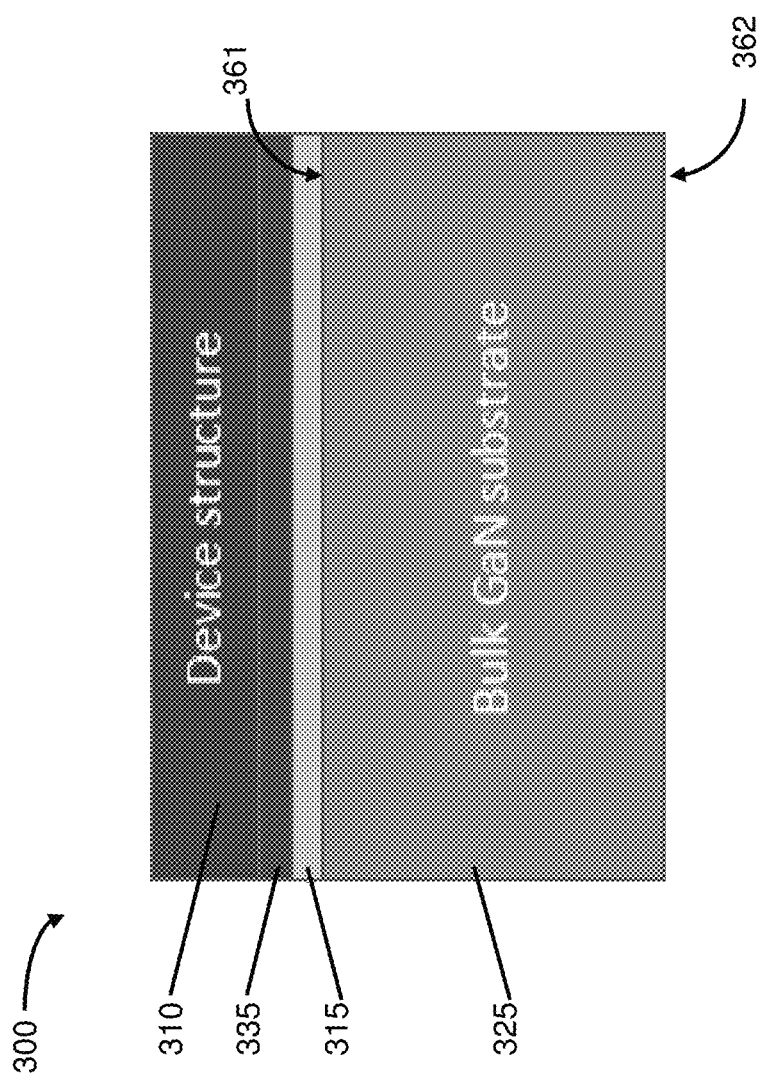
FIG. 32 schematically depicts a III-nitride compound material stack including a highly doped contact layer for forming a III-nitride compound device using epitaxial lift off (ELO), in accordance with some embodiments.

FIG. 32 schematically depicts a III-nitride compound material stack including a highly doped contact layer for forming a III-nitride compound device using an epitaxial lift-off (ELO) process in accordance with some embodiments. In some embodiments, the III-nitride compound material stack 300 includes a substrate 325 (e.g., a GaN substrate), a release layer 315 formed on a first side 361 (e.g., a top side) of the substrate 325, a contact layer 335 formed over the release layer 315, and a device structure 310 having one or more layers formed over the contact layer 335. The release layer 315, the contact layer 335, and the device layers 310 are epitaxially formed in some embodiments. The contact layer 335 can be a highly doped contact layer. In some embodiments, the contact layer 335 has a doping concentration of between $1E18$ $cm^{-3}$ ($1 \times 10^{18}$ $cm^{-3}$) and $3E20$ $cm^{-3}$ ($3 \times 10^{20}$ $cm^{-3}$), and a metal ohmic contact applied to the contact layer can have a specific contact resistance of between $1E-6$ $ohm-cm^2$ ($1 \times 10^{-6}$ $ohm-cm^2$) and $5E-3$ $ohm-cm^2$ ($5 \times 10^{-3}$ $ohm-cm^2$). The contact layer can comprise n-type GaN doped with silicon, germanium, or both in some embodiments. In an example embodiment, the device structure 310 is a GaN-based semiconductor device structure.

Figure 33:
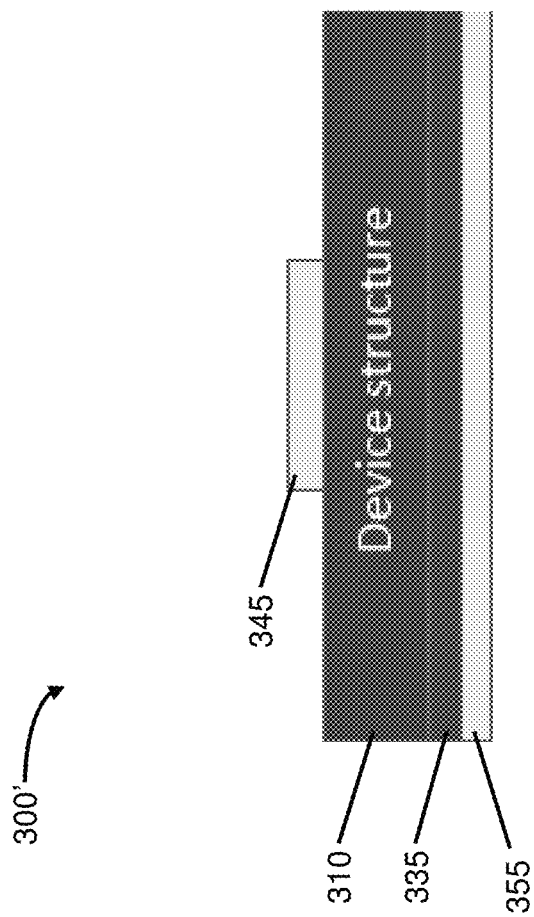
FIG. 33 schematically depicts a device resulting from an ELO process performed on the III-nitride compound material stack depicted in FIG. 32 followed by formation of contacts, in accordance with some embodiments.

FIG. 33 schematically depicts a device 300' resulting from an ELO process performed on the III-nitride compound material stack 300 followed by formation of electrical contacts, in accordance with some embodiments. An example epitaxial lift-off (ELO) process is described above with respect to FIGS. 1-5. During the epitaxial lift-off (ELO) process, the release layer 315 is etched and the contact layer 335 and the one or more device layers 310 are separated from the substrate 325. While etching the release layer to separate the contact layer 335 and the device structure from the substrate 325 through photoenhanced wet etching, a second side 362 (shown in FIG. 33) of the GaN substrate 325 facing away from the first side 361 of the GaN substrate 325, i.e., a bottom surface 362 is illuminated with photons having an energy level higher than the bandgap energy level of the release layer 315.

As shown in FIG. 33, in some embodiments, a first contact 355 (e.g., a bottom contact) is formed on or applied directly to the contact layer 335, and a second contact 345 (e.g., a top contact) is applied to or formed over a surface of the device structure 310 facing away from the contact layer 335. The first contact 355 and the second contact 345 can include a variety of conductive materials depending upon the type of device and the environment in which the device 300 will be used. In some embodiments, the first contact 355 and the second contact 345 can include unannealed layers of titanium and gold. The first contact 355 and the second contact 345 can be ohmic contacts in some embodiments. In some embodiments, the first contact 355 can be disposed on the contact layer 335, e.g., by deposition techniques such as electroplating or thermal evaporation or by forming separately and adhering to the contact layer 335 using an adhesive or other adhesion forces.

Figure 34:
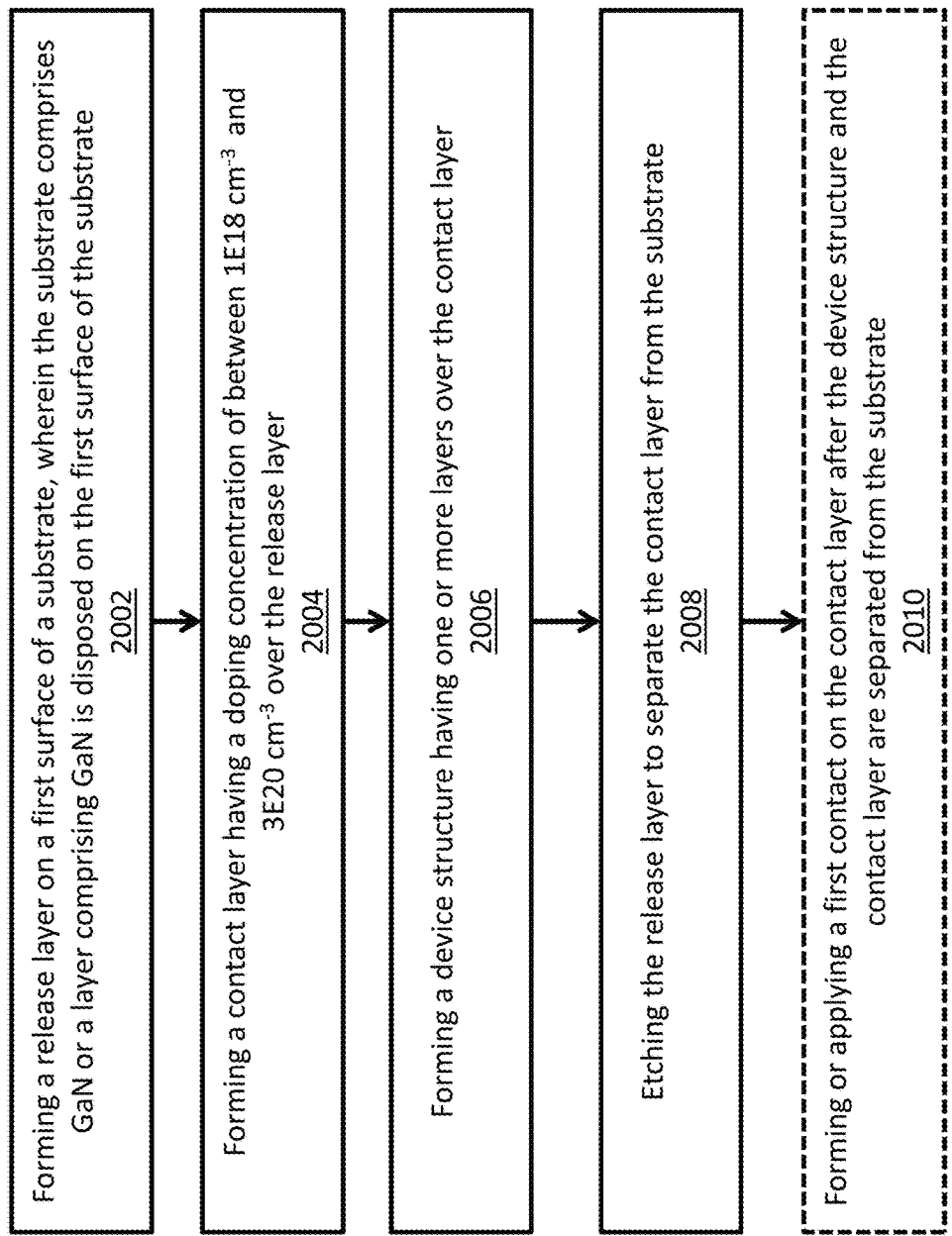
FIG. 34 is a flowchart for a method of forming a GaN-based device free of a substrate in accordance with embodiments described herein.

FIG. 34 illustrates a flowchart for a method 2000 for forming a GaN-based device free of a substrate. The method 2000 includes forming a release layer 315 on or over a first side 361 of a substrate 325 (step 2002). In some embodiments, the substrate 325 can include GaN. In some embodiments, the substrate 325 can include sapphire. In some embodiments, a layer including GaN is disposed on or over the substrate and the release layer is formed on the layer including GaN. In some embodiments, the release layer 115 is made of indium gallium nitride (InGaN). In some embodiments, the InGaN has a composition of In in the range of approximately 1% to 12%. In some embodiments, the InGaN has a composition of In in the range of approximately 2% to 7%. In some embodiments, the InGaN has a composition of In in the range of approximately 2.5% to 6.5%. One of ordinary skill in the art in view of the present disclosure will appreciate that the release layer can include InGaN with a different composition, or the release layer may not include InGaN in some embodiments. The release layer 315 can be formed using an epitaxial growth method in some embodiments.

The method 2000 includes forming a contact layer 335 having a doping concentration of between $1E18$ $cm^{-3}$ and $3E20$ $cm^{-3}$ over the release layer 315 (step 2004). For example, the contact layer 335 can include GaN that has been doped with silicon. In some embodiments, the dopant or dopants are incorporated during growth of the contact layer 335 using a metal-organic chemical vapor deposition (MOCVD) process.

The method 2000 includes forming a device structure 310 having one or more layers over the contact layer 335 (step 2006). As described above, the device structure 310 can include layers that form a semiconductor device such as a solar cell, a light-emitting diode (LED), a laser diode, a transistor, or a high-voltage pn device. One or more of the layers of the device structure 310 can comprise GaN or InGaN in some embodiments.

The method 2000 includes etching the release layer 315 to separate the contact layer 335 from the substrate 325 (step 2008). In accordance with some embodiments, the release layer 315 can be etched as described above with reference to FIGS. 1-5. For example, perforations can be etched into the device structure and the release layer 315 in a photoenhanced vertical wet etch environment provided by the system 200 as illustrated in FIG. 3. Then, the release layer 315 can be etched away using a photoenhanced lateral wet etch environment as illustrated above in FIG. 4.

In some embodiments, the method 2000 includes forming or applying a first contact 355 on the contact layer 335 after the contact layer 335 is separated from the substrate 325 (step 2010). For example, the first contact 355 can be deposited on the contact layer 335 using a metallization procedure in some embodiments. In some embodiments, the first contact 355 can be formed separately and applied to the contact layer 335 using, e.g., an adhesive. The first contact 355 includes gold, titanium, nickel, aluminum, palladium, platinum, or combinations of these elements in some embodiments.

Figures 35, 36:
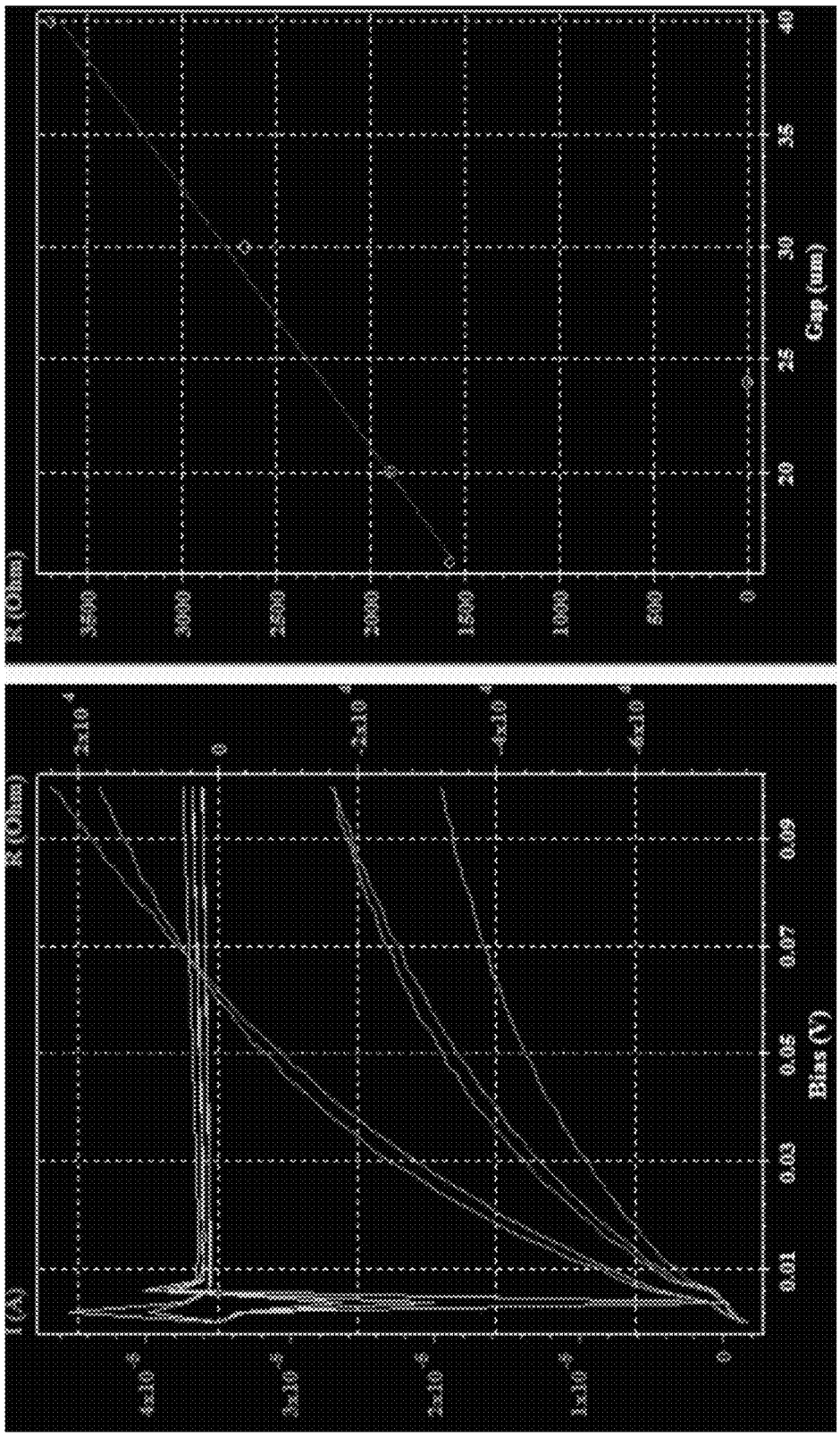
FIG. 35 is a graph of I-V curves for an example transmission line measurement (TLM) structure in accordance with some embodiments.
FIG. 36 is a graph of measured resistance values for the example TLM structure whose I-V curves are depicted in FIG. 35.

FIGS. 35 and 36 show I-V curves and measured resistance values, respectively, for a transmission line measurement (TLM) structure with an n-type contact layer doped at 1E17 cm$^{-3}$ (1×10$^{17}$ cm$^{-3}$). As shown in FIG. 36, the measured specific contact resistance (normalized to area) was about 5E-3 ohm-cm$^2$ (5×10$^{-3}$ ohm-cm$^2$).

Figures 37, 38:
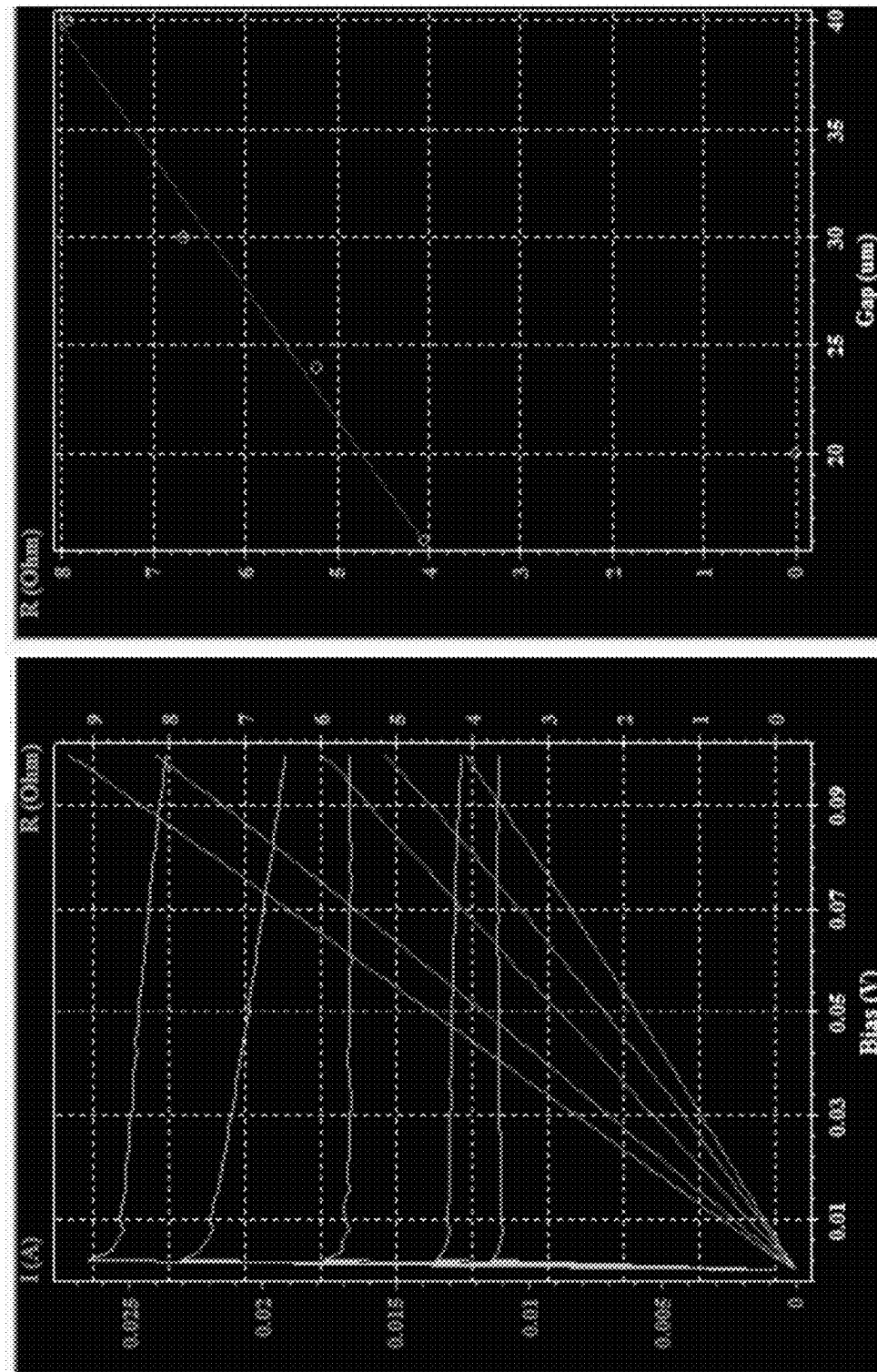
FIG. 37 is a graph of I-V curves for another example transmission line measurement (TLM) structure.
FIG. 38 is a graph of measured resistance values for the example TLM structure whose I-V curves are depicted in FIG. 37.

FIGS. 37 and 38 show I-V curves and measured resistance values, respectively, for a transmission line measurement (TLM) structure with a highly doped n-type contact layer of 1E19 cm$^{-3}$, which is higher than the doping level of the contact layer measured as in FIGS. 35-36. Compared with the measured specific contact resistance shown in FIG. 36, the measured specific contact resistance shown in FIG. 38 improved by two orders of magnitude to 1E-5 ohm-cm$^2$. In both cases, a similar unannealed Ti—Au metallization was applied to the contact layer after epitaxial lift-off.

In another example embodiment, as described above regarding FIGS. 1-5, an etch stop layer can be formed on the GaN substrate 325 prior to forming the release layer 315.

In some example embodiments, a sacrificial layer can be formed on the release layer 315 prior to forming the contact layer 335. Then, the contact layer 335 is formed on the sacrificial layer. The sacrificial layer improves selectivity and reduces etching of the contact layer material near the release layer. The sacrificial layer is removed after etching the release layer 315 and prior to applying or forming the bottom contact 355 on the contact layer 335. The sacrificial layer can have a doping level between 1E15 cm$^{-3}$ and 1E18 cm$^{-3}$. The sacrificial layer includes a nitride material, for example, AlN, AlGaN, or any other suitable nitride alloy.

In another example embodiment, an optically transparent coating layer can be applied on the bottom side 362 of the GaN substrate 325 prior to application of the etching procedure to remove the release layer 315. During the photoenhanced wet etching process, the optically transparent coating layer can protect the backside of the GaN substrate from chemical attack while allowing light to pass through the backside of the substrate. In some embodiments, the optically transparent coating layer can include spin-on glass, silicon oxide (e.g., grown using plasma-enhanced chemical vapor deposition or PECVD), ethylene vinyl acetate (EVA), bonded sapphire, or glass.

In some embodiments, as described above regarding FIG. 2, a metal support layer can be formed on the device layers 310 prior to etching the release layer 315.

In example embodiments, the substrate 325 has a diameter corresponding to a 2-inch, 4-inch, 6-inch, or 8-inch wafer. In some embodiments, the etching of the release layer 315 to separate the one or more device layers 310 from the substrate 325 occurs on a 2-inch, 4-inch, 6-inch, or 8-inch wafer size scale.

Example Stackups with Etch Stop Layers

Experiments were conducted to determine parameters for the etch stop layer to prevent the etching process from breaking through the etch stop layer to other layers or the substrate located beneath the etch stop layer. Merely for illustrative purposes, the example stackup and process is described here with respect to reference numbers employed in the description of FIGS. 1-5. Starting with a sapphire substrate 125 and working upwards, the stackup 100 included a layer of n-GaN (doped at 1E18) with a thickness of 2 microns, an etch stop layer 120 having a thickness and composition specified for each different experiment, a release layer 115 having a thickness of 90 nm and made of In$_{0.06}$Ga$_{0.94}$N, a device layer 110 (epi layer) having a thickness of 5 micrometers, and a metal support layer 130 having a thickness of 25 micrometers. The composition of the etch stop layer 120 was Al$_x$Ga$_{1-x}$N where the variable x was varied for different stackups. FIGS. 39A-41D illustrate the results of etching stackups with differing compositions and thicknesses for the etch stop layer 120.

One difficulty in balancing composition and thickness arises due to the need to avoid the formation of dislocations and defects due to lattice mismatch induced strain, which degrades the quality of the epitaxial layers. When the amount of aluminum in the AlGaN etch stop layer 120 is increased, for example, the amount of lattice mismatch in the AlGaN layer with respect to an underlying GaN layer increases and the lattice-mismatch induced strain in the AlGaN layer increases. To prevent undesirable degradation in material quality due to lattice-mismatch induced dislocations and defects, the thickness of the lattice-mismatched layer less must be less than the critical thickness for dislocation formation. The critical thickness decreases with increasing mismatch. Thus, while increasing the Al content of the AlGaN etch stop layer increases the resistance of the material to the etchant, the critical thickness, which decreases with increases Al content, limits the thickness of the etch stop layer. However, an etch stop layer that is too thin will not survive the etching process over extended periods of etching. Thus, proper selection of both the composition and thickness of the etch stop layer 120 is required to obtain the desired protection without degrading the quality of the epitaxial material.

FIGS. 39A-C are images from etching of a stackup including an etch stop layer where the etch stop layer was etched completely through and the etch reached the sapphire substrate at many of the perforations. For this stackup, the etch stop layer 120 had a thickness of 22 nm and a composition of AlGaN with Al at 15%. The etch was performed for 8 hours. The dark areas of the cross-shaped feature indicate that the etch has penetrated entirely through the etch stop layer. Although some areas were more resilient and the AlGaN etch stop layer survived, in other places, the etch progressed completely through the etch stop layer 120.

FIG. 39D is an image of a profilometry scan within the perforated region of the layers on the substrate of FIGS. 39A-C after epitaxial lift-off. The scale in FIG. 39D is 1000 Å. In FIGS. 39D, 40D, 40E, and 41D, the white broken line near the top of the graph indicates the location of the bottom surface of the release layer 115 before lift-off. As shown in FIG. 39D, the etch has passed entirely through the etch stop layer in some places.

FIGS. 40A-C are images from etching of a stackup including an etch stop layer where the etch reached the sapphire substrate in some spots at the perforations. For this stackup, the etch stop layer 120 had a thickness of 30 nm and a composition of AlGaN with Al at 28%. The etch was conducted for 8 hours. This combination of aluminum content and thickness provided strong etch protection. However, isolated spots remained where the etch did pass through the etch stop layer 120. FIG. 40D is an image of a profilometry scan within the perforated region of the layers on the substrate of FIGS. 40A-C before epitaxial lift-off. The scale in FIG. 40D is 1000 Å. The data indicate that there were isolated deep pits in the etch stop layer in some locations. FIG. 40E is an image of a profilometry scan within the perforated region of the stackup of FIGS. 40A-C after epitaxial lift-off. The scale in FIG. 40E is 100 Å. As seen here, the etch stop layer largely held and prevented the underlying n-GaN layer from being etched.

FIGS. 41A-C are images from etching of a stackup including an etch stop layer where the etch stop layer successfully prevented etching of the underlying GaN layer. For this stackup, the etch stop layer 120 had a thickness of 30 nm and a composition of AlGaN with Al at 30%. This combination of aluminum content and thickness was smooth in most spots following 8 hours of etching. No locations were identified where the etch had broken through the etch stop layer and the GaAs layer to the substrate below. FIG. 41D is an image of a profilometry scan within the perforated region of the layers on the substrate of FIGS. 41A-C after epitaxial lift-off. The scale in FIG. 39E is 100 Å. In this case, about 1 micron of the GaN layer remained at the end of the process.

Experiments with other compositions, other thickness and other etch durations were conducted. Further results of these experiments are provided in the following table:

| Aluminum content in AlGaN for etch stop layer | Etch stop layer thickness | Etch time | Comments |
| --- | --- | --- | --- |
| 15% | 22 nm | 8 hours | Complete etch-through in many spots |
| 15% | 22 nm | 16 hours | Almost no AlGaN remaining after 16 hours |
| 15% | 28 nm | 8 hours | More resilient than 22 nm film, still etching through to sapphire |
| 15% | 28 nm | 16 hours | Does not hold up for longer etches |
| 15% | 35 nm | 8 hour | Many pinholes/deep pits, provides worse results than 28 nm layer |
| 15% | 35 nm | 16 hour | Very deep pits in some places |
| 18% | 30 nm | 8 hours | Many dark spots where AlGaN was etched away |
| 22% | 30 nm | 8 hour | Fewer dark spots where AlGaN was etched. Some GaN layer remaining. |
| 28% | 30 nm | 8 hour | Nearly perfect, handful of spots with etch-through |
| 30% | 30 nm | 8 hour | No identified spot where etch passed through etch stop layer. |

While the present invention has been described with reference to illustrative embodiments thereof, those skilled in the art will appreciate that various changes in form in detail may be made without parting from the intended scope of the present invention as defined in the appended claims.

The invention claimed is:

1. A method for forming a GaN-based device or an AlN-based device free of a substrate, the method comprising:
providing a device structure comprising:
a substrate having a first surface and a second surface facing away from the first surface, wherein the substrate comprises GaN or AlN or a layer comprising GaN or AlN is disposed on the first surface of the substrate;
an etch stop layer formed over the first surface of the substrate, the etch stop layer having a first bandgap energy level;
a release layer formed on the etch stop layer, the release layer having a second bandgap energy level, the second bandgap energy level lower than the first bandgap energy level;
one or more device layers formed on the release layer to form the GaN-based device or the AlN-based device; and
a perforated support layer formed on one of the one or more device layers forming an outermost layer of the structure;
removing portions of the release layer and of the one or more device layers underlying perforations in the perforated support layer, the removing comprising exposing the device structure to a photoenhanced vertical etch environment to vertically etch portions of the release layer and of at least one of the one or more device layers underlying the perforations in the support layer; and
exposing the device structure to a photoenhanced lateral wet etch environment to laterally etch the release layer, the photoenhanced lateral wet etch environment impinging photons having an energy level greater than or equal to that of the second bandgap energy level of the release layer and lower than that of the first bandgap energy level of the etch stop layer, thereby removing the release layer from between the etch stop layer and the one or more device layers and separating the substrate from the one or more device layers and the perforated support layer.

2. The method of claim 1, wherein the support layer includes a metal layer having perforations, and wherein the perforations of the metal layer are configured to facilitate vertical etching of the release layer.

3. The method of claim 1, further comprising forming a plurality of perforations in the one or more device layers by etching through the perforations in the support layer for vertical etching of the release layer at multiple locations corresponding to the perforations simultaneously.

4. The method of claim 1, wherein the device is a GaN-based device; and wherein the release layer comprises InGaN.

5. The method of claim 4, wherein the InGaN has a composition of In in the range of 1% to 12%.

6. The method of claim 1, wherein the release layer has a thickness between 10 nm and 200 nm.

7. The method of claim 1, wherein the device is a GaN-based device; and wherein at least one of the one or more device layers comprises GaN or InGaN.

8. The method of claim 1, wherein the etch stop layer comprises AlGaN or AlInGaN.

9. The method of claim 8, wherein the etch stop layer comprises AlGaN with an Al composition falling in a range of 15% to 35%.

10. The method of claim 1, wherein the substrate has a diameter corresponding to a 2-inch to 8-inch wafer, and wherein the etching of the release layer to separate the contact layer and the one or more device layers from the substrate occurs on a 2-inch to 8-inch wafer size scale.

11. The method of claim 1, wherein the etch stop layer has a slow etch rate relative to an etch rate of the release layer for the photoenhanced wet etching and the etch stop layer is configured to reduce etching of the substrate during the photoenhanced vertical wet etching.

12. The method of claim 1, wherein the photoenhanced vertical wet etch environment includes impinging photons on the release layer having an energy level greater than that of the second bandgap energy level of the release layer and lower than that of the first bandgap energy level of the etch stop layer.

13. The method of claim 1, wherein exposing the device structure to the photoenhanced vertical etch environment includes illuminating the perforated support layer with one or more UV light emitting diode (LED) light sources.

14. The method of claim 1, wherein exposing the device structure to the photoenhanced lateral etch environment includes illuminating the second surface of the substrate with one or more filtered UV light emitting diode (LED) light sources.

15. The method of claim 1, wherein the substrate comprises GaN.

16. The method of claim 15, wherein the substrate comprises a GaN wafer.

17. The method of claim 1, wherein the substrate comprises AlN and at least one of the one or more device layers comprises AlGaN.

18. The method of claim 1, wherein providing the device structure comprises:
providing the substrate having the first surface and the second surface facing away from the first surface, wherein the substrate comprises GaN or AlN or a layer comprising GaN or AlN is disposed on the first surface of the substrate;
forming the etch stop layer over the first surface of the substrate;
forming the release layer on the etch stop layer;
forming the one or more device layers on the release layer to form the GaN-based device or the AlN-based device; and
forming the perforated support layer on one of the one or more device layers to form the outermost layer of a stackup.

19. The method of claim 1, further comprising covering the second surface of the substrate with a transparent chemically protective layer prior to exposing the stackup to the photoenhanced vertical wet etch environment.

20. The method of claim 19, wherein the transparent chemically protective layer includes one or more materials selected from the group consisting of spin-on glass, PECVD silicon oxide, ethylene vinyl acetate (EVA), bonded sapphire, and glass.

21. The method of claim 1, further comprising:
removing the etch stop layer from the substrate and polishing the substrate; and
reusing the substrate to form a second GaN-based device free from a substrate.

22. The method of claim 1, further comprising forming a contact layer having a doping concentration of between $1 \times 10^{18}$ cm$^{-3}$ and $5 \times 10^{20}$ cm$^{-3}$ over the release layer.

23. The method of claim 22, wherein an ohmic contact disposed on the contact layer has a specific contact resistance of between $1 \times 10^{-6}$ ohm-cm$^2$ and $5 \times 10^{-3}$ ohm-cm$^2$.

24. The method of claim 22, wherein the contact layer comprises n-type GaN doped with Si or germanium.

25. The method of claim 22, wherein a thickness of the contact layer is in a range of 100 nm to 2 microns.

26. The method of claim 22, further comprising forming or applying a first contact on the contact layer after the device structure and the contact layer are separated from the substrate.

27. The method of claim 26, further comprising:
forming a sacrificial layer on the release layer prior to forming the contact layer; and
removing the sacrificial layer after etching the release layer and prior to applying or forming the first contact on the contact layer.

28. The method of claim 27, wherein the sacrificial layer comprises AN or AlGaN.

29. The method of claim 26, further comprising applying or forming a second contact over a surface of the device structure facing away from the contact layer after the contact layer is separated from the substrate.

30. A structure for forming a GaN-based device or an AlN-based device using epitaxial lift-off, the structure comprising:
a substrate having a first surface and a second surface facing away from the first surface, wherein the substrate comprises GaN or AlN or a layer comprising GaN or AlN is disposed on the first surface of the substrate;
an etch stop layer formed over the first surface of the substrate, the etch stop layer having a first bandgap energy;
a release layer formed on the etch stop layer, the release layer having a second bandgap energy, wherein the second bandgap energy is lower than the first bandgap energy;
one or more device layers formed over the release layer to form the GaN-based device or the AlN-based device; and
a perforated support layer formed on one of the one or more device layers to form an outermost layer of the structure.

* * * * *